United States Patent [19]

Ohuchi et al.

[11] Patent Number: 5,521,865
[45] Date of Patent: May 28, 1996

[54] NON-VOLATILE SEMICONDUCTOR MEMORY DEVICE FOR STORING MULTI-VALUE DATA

[75] Inventors: Kazunori Ohuchi; Tomoharu Tanaka, both of Yokohama; Gertjan Hemink, Kawasaki, all of Japan

[73] Assignee: Kabushiki Kaisha Toshiba, Kawasaki, Japan

[21] Appl. No.: 401,789

[22] Filed: Mar. 10, 1995

[30] Foreign Application Priority Data

Mar. 15, 1994 [JP] Japan .................................. 6-044447
Mar. 9, 1995 [JP] Japan .................................. 7-049594

[51] Int. Cl.$^6$ .................................................. G11C 7/00
[52] U.S. Cl. ............... 365/185.22; 365/205; 365/185.03; 365/185.21
[58] Field of Search .............................. 365/185, 189.07, 365/189.05, 189.01, 205, 168, 207, 208, 210, 185.03, 185.21, 185.22

[56] References Cited

U.S. PATENT DOCUMENTS 4,953,129  8/1990  Kobayashi et al. .
5,379,256  1/1995  Tanaka .................................... 365/185
5,446,690  8/1995  Tanaka .................................... 365/185

FOREIGN PATENT DOCUMENTS 0340107  11/1989  European Pat. Off. .
WO90/12400  10/1990  WIPO .

OTHER PUBLICATIONS

IEEE International Solid State Circuits Conference, vol. 34, pp. 192–193 and 315, Feb. 1991, Trevor Blyth, et al., "A Non–Volatile Analog Storage Device Using EEPROM Technology".

*Primary Examiner*—David C. Nelms
*Assistant Examiner*—Son Mai
*Attorney, Agent, or Firm*—Oblon, Spivak, McClelland, Maier, & Neustadt

[57] ABSTRACT

A non-volatile semiconductor memory device having a plurality of electrically rewritable memory cells for storing multi-value data. The cells are arranged in an array and are coupled to a plurality of bit lines which transmit and receive data to and from the memory cells. The device also includes a plurality of sense amplifiers for sensing and amplifying the potentials of the bit lines; a plurality of data latches forming data to be written in the memory cells; a plurality of verify circuits for checking whether the data is correctly written in the memory cells and a plurality of switches. The switches control the connections of the sense amplifiers, data latches and verify circuits to the bit lines. Write control devices set the potentials of the bit lines in accordance with the contents of the data latches. The switches are set in an open state after data is read from the memory cells onto the bit lines and the sense amplifiers almost simultaneously operate after the switches are set in an open state to sense and amplify the data read onto the bit lines.

20 Claims, 27 Drawing Sheets

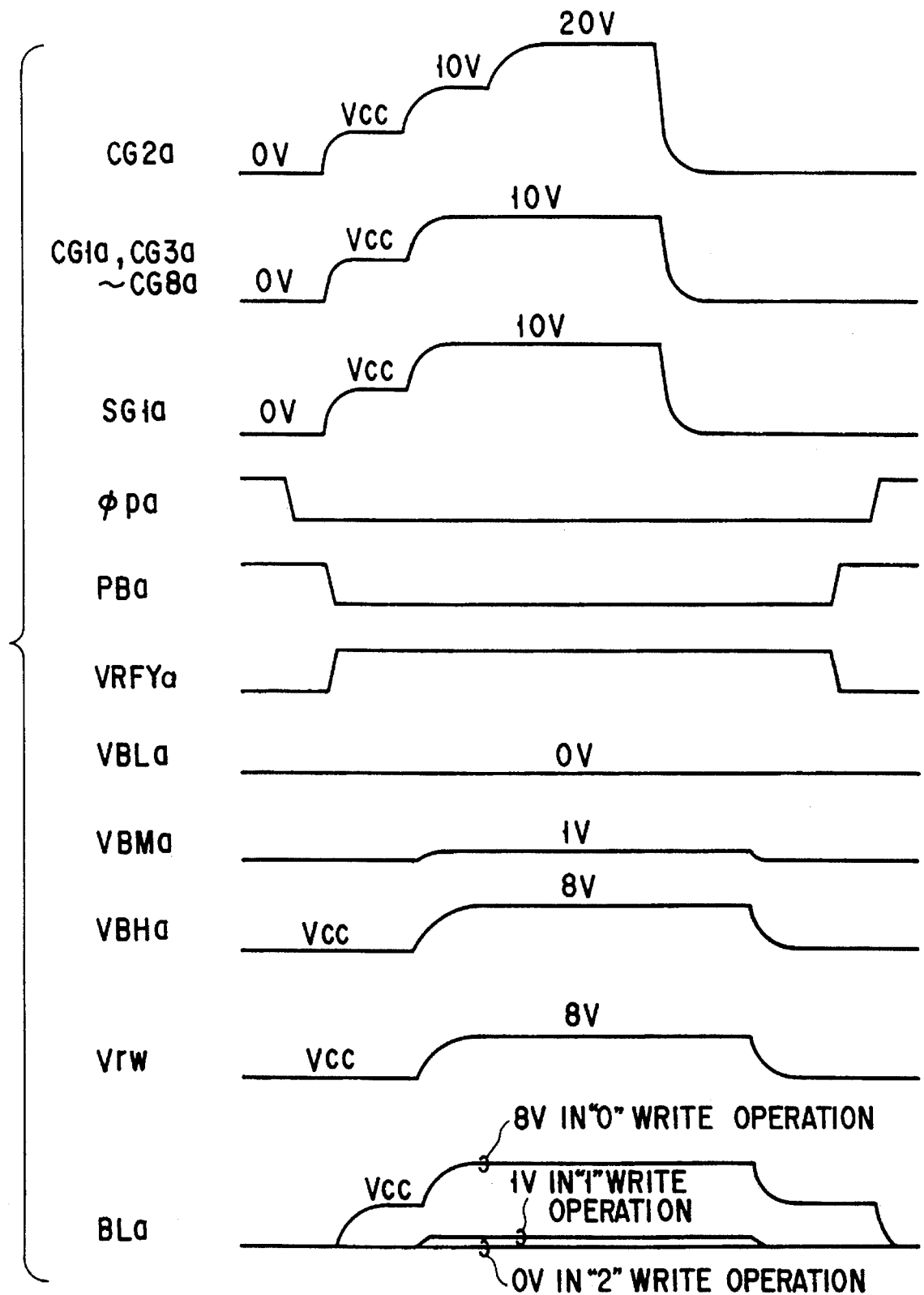
F I G. 4

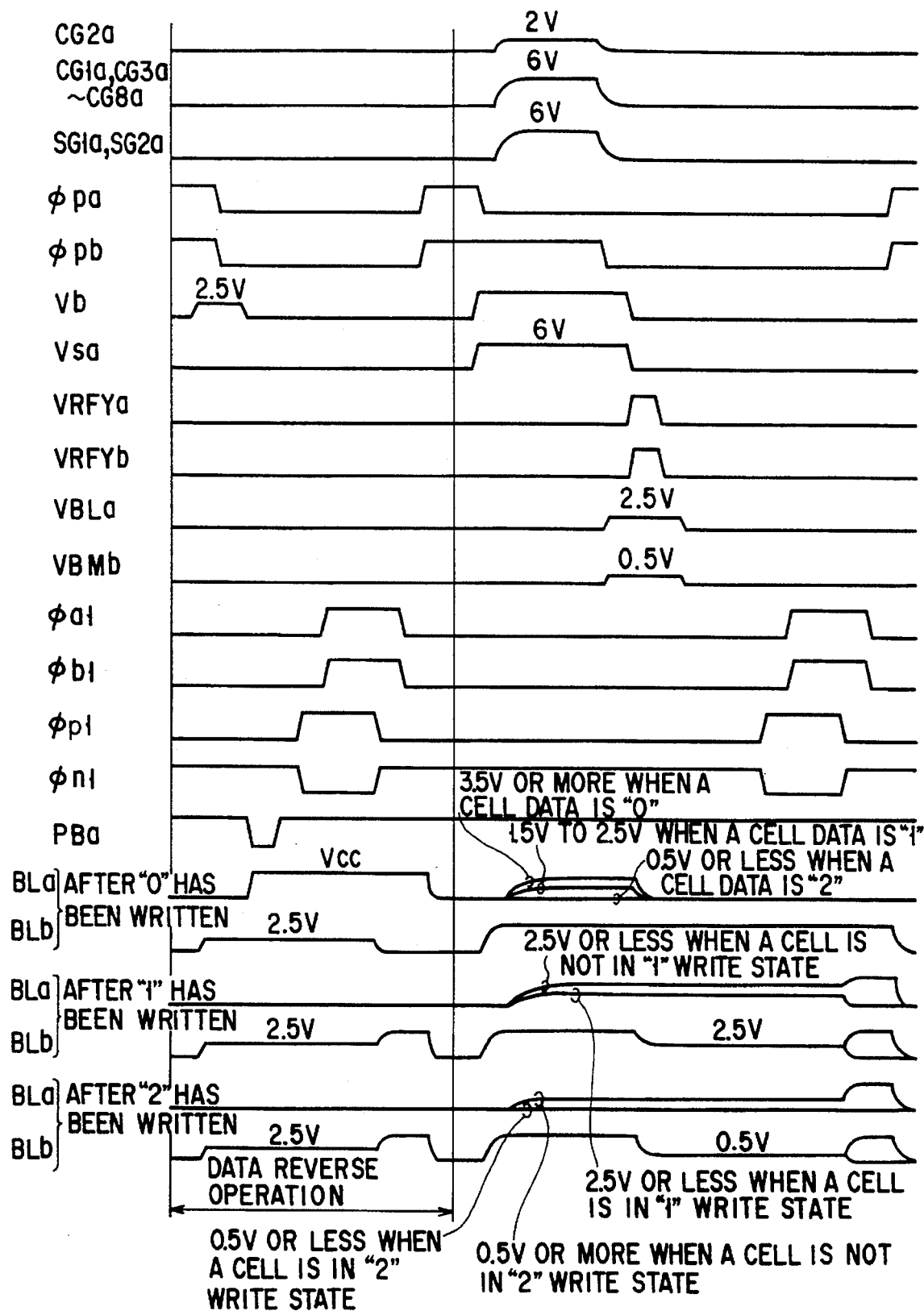
F I G. 5

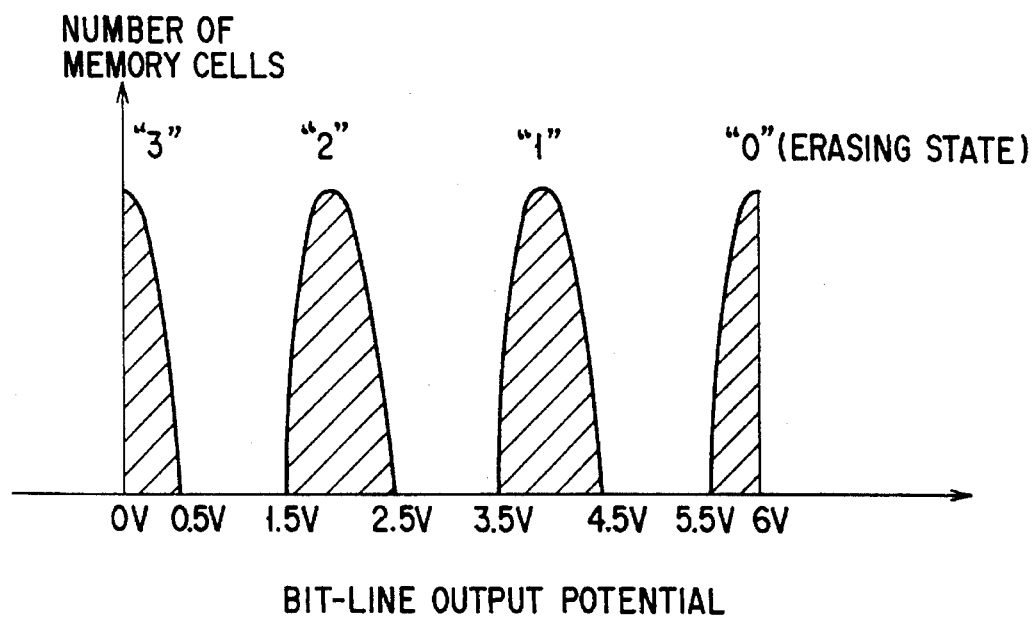
F I G. 9
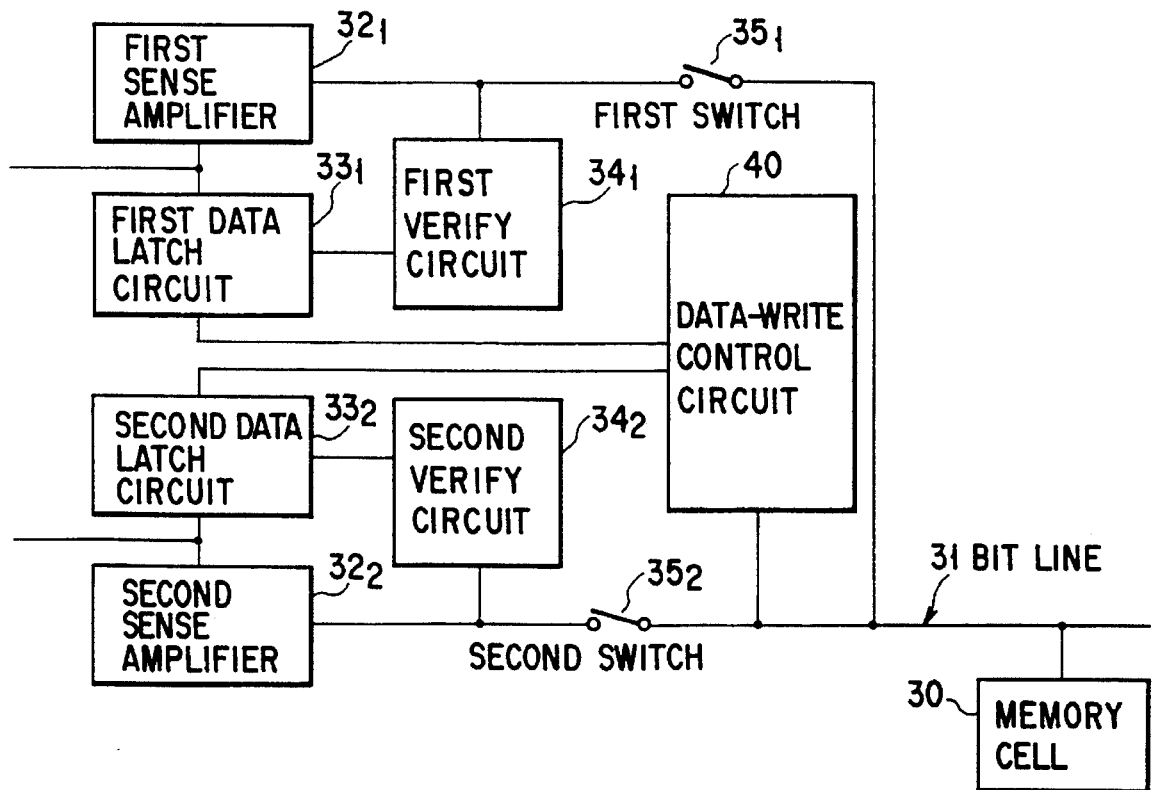
F I G. 10

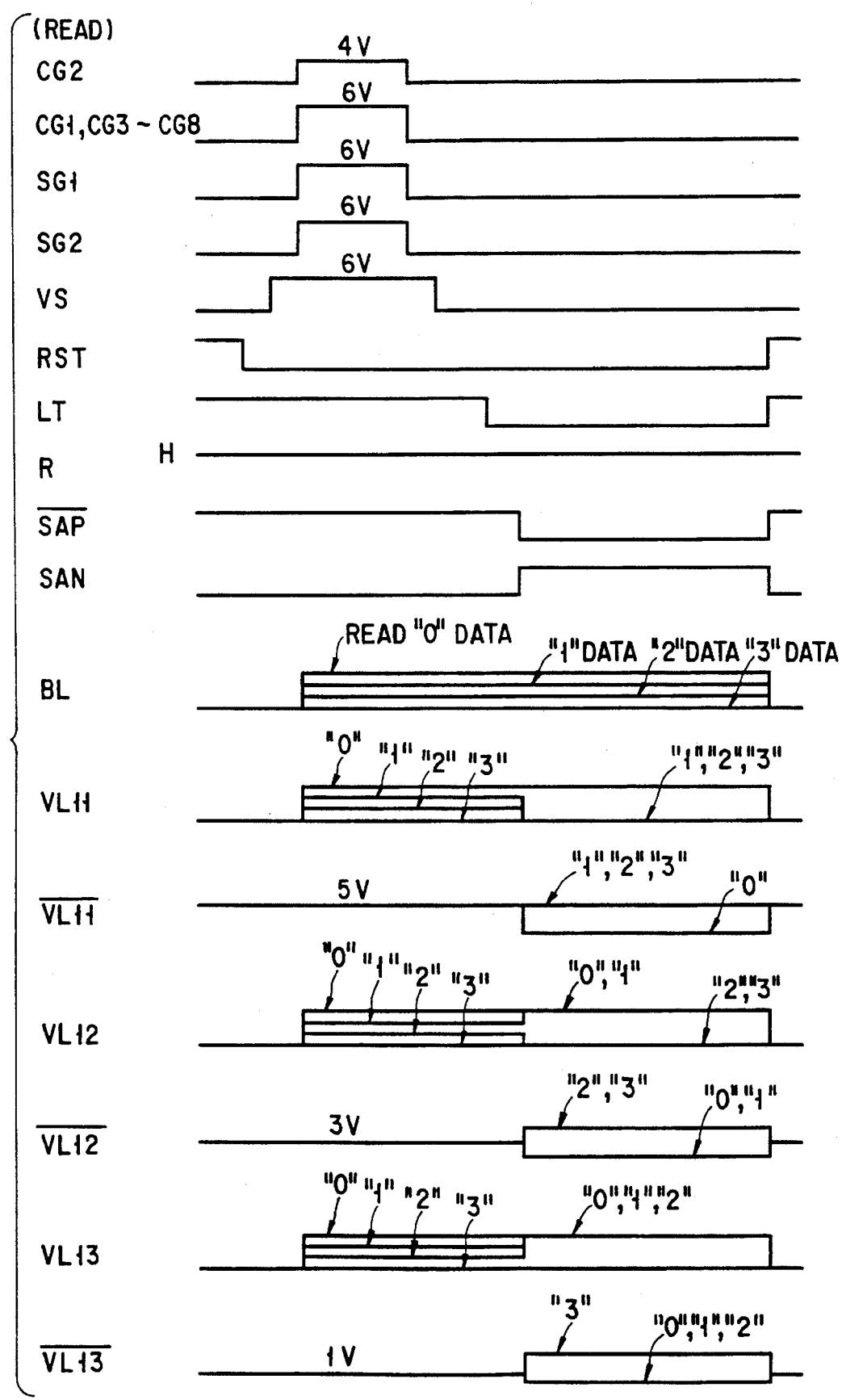
F I G. 23

1

NON-VOLATILE SEMICONDUCTOR MEMORY DEVICE FOR STORING MULTI-VALUE DATA

BACKGROUND OF THE INVENTION

1. Field of the Invention

The present invention relates to a non-volatile semiconductor memory device (EEPROM) which is electrically rewritable, and particularly, which multi-value-stores more information than 1-bit information in one memory cell.

2. Description of the Related Art

As one of EEPROMs, a NAND cell type EEPROM which can be integrated at a high density is known. In a NAND cell, a plurality of memory cells are coupled in series with each other such that a source and a drain are shared by adjacent memory cells. One terminal of the NAND cell is coupled to a bit line. Each memory cell generally has a structure obtained by stacking a floating gate (charge storage layer) and a control gate. A memory cell array is integrally formed in a p-type substrate (or a p-type well formed in an n-type substrate). The drain of the NAND cell is coupled to the bit line through one selective transistor, and the source of the NAND cell is coupled to a common source line through the other selective transistor. The control gates of the memory cells are coupled to word lines continuously arranged in a row direction.

The operation of the NAND cell type EEPROM is as follows.

Data are sequentially written in the memory cells from the memory cell located at the position farthest from the bit line. A data write operation is performed such that a high potential Vpp (=about 20 V) is applied to the control gate of a selected memory cell, an intermediate potential Vppm (=about 10 V) is applied the control gate and selective gate of a memory cell closer to the bit line than the selected memory cell, and 0 V or an intermediate potential Vm (=about 8 V) is applied to the bit line in accordance with data to be written in the memory cells.

More specifically, when 0 V is applied to the bit line, this potential is transferred to the drain of the selected memory cell, and electrons are injected from the drain to the charge storage layer. In this manner, the threshold voltage of the selected memory cell is shifted from an initial negative value in a positive direction. This state is represented by, e.g., '1'. When the intermediate potential Vm is applied to the bit line, electron injection does not effectively occur. For this reason, the threshold voltage does not change, and the threshold voltage is kept negative. This state is represented by '0'. The data write operation is simultaneously performed for memory cells which share a control gate.

A data erasing operation is simultaneously performed for all the memory cells in the NAND cell.

More specifically, all the control gates are set at 0 V, and a p-type well is set at 20 V. At this time, the selective gates, the bit line, and the source line are set at 20 V. Therefore, electrons of the charge storage layer are discharged into the p-type well, the threshold voltage is shifted in a negative direction, and the states of all the memory cells are set at '0'.

A data read operation is performed such that the control gate of a selected memory cell is set at 0 V, the control gates and selective gates of the remaining memory cells are set at a power supply potential Vcc (to be referred to as only Vcc hereinafter), and it is checked whether a current flows in the selected memory cell (state '0') or not (state '1').

Due to the limitation of the read operation, the threshold voltage after '1' has been written must be controlled to fall within a range of 0 V to Vcc. For this purpose, a write verify operation is performed, a memory cell set in an insufficient '1' write state is detected, and rewrite data is set such that a rewrite operation is performed for only the memory cell set in the insufficient '1' write state (bit-by-bit verify). The memory cell set in the insufficient '1' write state is detected by performing a read operation (verify read operation) while the selected control gate is set at, e.g., 0.5 V (verify potential).

In this case, the threshold voltage of the memory cell has a margin with respect to 0 V. For this reason, if the potential of the control gate is less than 0.5 V, a current flows in the selected memory cell, and the memory cell is detected as a memory cell set in an insufficient '1' write state. A current flows in a memory cell set in a '0' write state. For this reason, a circuit called a verify circuit for compensating for the current flowing in the memory cell is arranged to prevent the memory cell from being erroneously defined as a memory cell having the sufficient '1' write state. This verify circuit performs a write verify operation at a high speed.

As described above, when the data write operation is performed while the write operation and the write verify operation are repeated, a time for writing data in each memory cell is optimized, and the threshold voltage after '1' has been written is controlled to fall within a range of 0 V to Vcc.

In the NAND cell type EEPROM, a so-called multi-value storing cell in which states after the write operation are represented by n data, i.e., data '0', '1', '2', . . . , and 'n' is proposed. In a ternary storing cell (n=3), three states after the write operation are defined as follows. For example, a threshold voltage is negative in a '0' write state, a threshold voltage is 0 V to Vcc/2 in a '1' write state, and a threshold voltage is Vcc/2 to Vcc in a '2' write state.

FIG. 1 shows an arrangement of a ternary storing NAND cell type EEPROM proposed by the present inventors in corresponding U.S. application Ser. No. 08/308,534.

A ternary storing NAND cell type EEPROM has a bit line control circuit 2 for controlling the bit lines of memory cell arrays 1a and 1b in a read/write operation, and a word line driving circuit 6 for controlling the word line potentials of the memory cell arrays 1a and 1b.

The bit line control circuit 2 selects a predetermined bit line on the basis of a column decoder 3. The bit line control circuit 2 transmits and receives write/read data to/from an input/output data converting circuit 4 through a data input/output line (I/O line).

The input/output data converting circuit 4 converts the multi-value information read out from the memory cell into binary information to externally output the multi-value information, and converts the binary information of externally input write data into the multi-value information of the memory cell. The input/output data converting circuit 4 is coupled to a data input/output buffer 5 for controlling an input/output operation between the data input/output buffer 5 and an external circuit.

FIG. 2 shows the memory cell arrays 1a and 1b of the NAND cell type EEPROM in FIG. 1 and a related art's bit line control circuit 2. One terminal of a NAND cell is coupled to a bit line BLa, and the other terminal is coupled to a common source line Vsa. One terminal of another NAND cell is coupled to a bit line BLb, and the other terminal is coupled to a common source line Vsb. Selective gates SG1a, SG2a, SG1b, and SG2b and control gates CG1a to CG8a and CG1b to CG8b are shared by a plurality of NAND cells, and memory cells M which share one control gate constitute a page.

Each memory cell stores data on the basis of a threshold voltage Vt of the corresponding memory cell, and stores data '0', '1', and '2'. Since one memory cell has three states, nine combinations can be obtained by two memory cells. Eight combinations of the nine combinations are used to store 3-bit data in two memory cells. In this example, a pair of adjacent two memory cells which share a control gate store 3-bit data. The memory cell arrays 1a and 1b are formed on a dedicated p-type well.

A flip-flop FF1 constituted by n-channel MOS transistors Qn8 to Qn10 and p-channel MOS transistors Qp3 to Qp5 and a flip-flop FF2 constituted by n-channel MOS transistors Qn11 to Qn13 and p-channel MOS transistors Qp6 to Qp8 latch write/read data. The flip-flops FF1 and FF2 also operate as sense amplifiers. The flip-flop FF1 latches write data information indicating that "'0' is written or one of '1' and '2' is written', and the flip-flop FF1 latches read data information indicating that the memory cell 'holds information of '0' or holds one of information of '1' and information of '2'". The flip-flop FF2 latches write data information indicating that "'1' is written or '2' is written'". The flip-flop FF2 latches read data information indicating that a memory cell 'holds information of '2' or holds one of information of '0' and information of '1'".

When a precharge signal φ pa goes 'H', an n-channel MOS transistor Qn1 transfers a potential Va to the bit line BLa. When a precharge signal φ pb goes 'H', an n-channel MOS transistor Qn20 transfers a potential Vb to the bit line BLb. N-channel MOS transistors Qn4 to Qn7 and p-channel MOS transistors Qp1 and Qp2 selectively transfer potentials VBHa, VBMa, and VBLa to the bit line BLa in accordance with the data latched in the flip-flops FF1 and FF2. N-channel MOS transistors Qn14 to Qn17 and p-channel MOS transistors Qp9 and Qp10 selectively transfer potentials VBHb, VBMb, and VBLb to the bit line BLb in accordance with the data latched in the flip-flops FF1 and FF2.

When a signal φ a1 goes 'H', an n-channel MOS transistor Qn2 couples the flip-flop FF1 to the bit line BLa. When a signal φ a2 goes 'H', an n-channel MOS transistor Qn3 couples the flip-flop FF2 to the bit line BLa. When a signal φ b1 goes 'H', an n-channel MOS transistor Qn19 couples the flip-flop FF1 to the bit line BLb. When a signal φ b2 goes 'H', an n-channel MOS transistor Qn18 couples the flip-flop FF2 to the bit line BLb.

The operation of the EEPROM arranged as described above will be described below with reference to FIGS. 3 to 5. FIG. 3 shows read operation timings, FIG. 4 shows write operation timings, and FIG. 5 shows verify read operation timings. In the following description, a case wherein a control gate CG2 is selected is exemplified.

A read operation will be described below with reference to FIG. 3. The read operation is performed in two basic cycles.

In the first read cycle, when the potential is set at 3 V, the bit line BLb serving as a reference bit line is precharged. When the precharge signal φ pa goes 'L', the selective bit line BLa floats, and the common source line Vsa is set at 6 V. The selective gates SG1a and SG2a and control gates CG1a and CG3a to CG8a are set at 6 V. At the same time, the selected control gate CG2a is set at 2 V. The bit line BLa is charged to a predetermined potential in accordance with the data of the selected memory cell.

When flip-flop activating signals φ n1 and φ p1 go 'L' and 'H', respectively, the flip-flop FF1 is reset. When the signals φ a1 and φ b1 go 'H', the flip-flop FF1 is coupled to the bit lines BLa and BLb. When the signals φ n1 and φ p1 go 'H' and 'L', respectively, the potential of the bit line BLa is sensed with reference to the potential of the reference bit line BLb, and the flip-flop FF1 latches information indicating 'data '0' or one of data '1' and data '2'".

In the second read cycle, unlike in the first read cycle, the potential of the reference bit line BLb is not 3 V but 1 V, and signals φ a2, φ b2, φ n2, and φ p2 are output in place of the signals φ a1, φ b1, φ n1, and φ p1 to operate the flip-flop FF2. Therefore, in the second read cycle, information indicating 'data '2' or one of data '1' or data '0'" is latched in the flip-flop FF2.

With the two read cycles, data written in the memory cell is read out.

Data in the memory cell is erased prior to a data write operation, and a threshold voltage Vt of the memory cell is −1.5 V or less. An erasing operation is performed such that the p-type well, the common source line Vsa, the selective gates SG1a and SG2a are set at 20 V, and the control gates CG1a to CG8a are set at 0 V.

A write operation will be described below with reference to FIG. 4.

Write data data1 and data2 are latched in the flip-flops FF1 and FF2, respectively. The data data1 is data for controlling "'0' write operation or one of '1' write operation and '2' write operation'". A node N1 is at 'n' in the '0' write operation, and the node N1 is at 'H' in one of the '1' write operation and the '2' write operation. The data data2 is data for controlling "'1' operation or '2' write operation'". A node N3 is at 'L' in the '1' write operation, and the node N2 is at 'H' in the '2' write operation.

When the precharge signal φ pa goes 'L', the bit line BLa floats. The selective gate SG1a is set at Vcc, and the control gates CG1a to CG8a are set at Vcc. The selective gate SG2a is at 0 V in the write operation. At the same time, a signal VRFYa goes 'H', and a signal PBa goes 'L'. In the '0' write operation, since data set at 'L' is latched in the node N1 of the flip-flop FF1, the bit line BLa is charged to Vcc with the potential VBHa. In one of the '1' write operation and the '2' write operation, the bit line BLa floats.

The selective gate SG1a and the control gates CG1a to CG8a are set at 10 V, the potential VBHa and a potential Vrw are set at 8 V, and a potential VBMa is set at 1 V. At this time, when the '0' write operation is to be performed, the bit line BLa is charged to 8 V. In the '1' write operation, data is latched such that the node N3 of the flip-flop FF2 is set at 'L'. For this reason, 1 V is applied to the bit line BLa by the potential VBMa. In the '2' write operation, the bit line BLa is set at 0 V by the potential VBLa. Thereafter, the selected control gate CG2a is set at 20 V.

In one of the '1' write operation and the '2' write operation, electrons are injected into the charge storage layer of the memory cell due to the potential difference between the bit line BLa and the control gate CG2a, thereby increasing the threshold voltage of the memory cell. In the '1' write operation, an amount of charge to be injected into the charge storage layer of the memory cell must be smaller than that of the '2' write operation. For this reason, the bit line BLa is set at 1 V to moderate the potential difference between the bit line BLa and the control gate CG2a to 19 V. In the '0' write operation, electron injection is suppressed by a bit line potential (=8 V), and the threshold voltage of the memory cell does not change. Upon completion of the write operation, the selective gate SG1a and the control gates CG1a to CG8a are set at 0 V, and the potential (=8 V) of the bit line BLa at the '0' write operation is reset to 0 V. When this order is reversed, the state of the '2' write operation is temporarily set, and erroneous data is written in the '0' write operation.

After the write operation, the write state of the memory cell is checked, and a verify read operation is performed to perform an additional write operation for a memory cell set in an insufficient write state. The verify read operation will be described below with reference to FIG. 5.

The verify read operation is similar to the first read cycle except that the data of the flip-flop FF1 is reversed, the potential Vb is set at Vcc, signals VRFYa and VRFYb are output, and, at this time, the potentials VBLb and VBMb are set at 2.5 V and 0.5 V, respectively. The potential of the reference bit line BLb is determined by the potentials Vb, VBLb, and VBMb and the data of the flip-flops FF1 and FF2. The signals VRFYa and VRFYb are output before the signal φn1 and φp1 go 'L' and 'H' respectively, after the selective gates SG1a and SG2a and the control gates CG1a to CG8a are reset to 0 V. More specifically, the signals VRFYa and VRFYb are determined after the potential of the bit line BLa is determined by the threshold voltage of a memory cell and before the flip-flop FF1 is reset.

The data reverse operation of the flip-flop FF1 will be described below.

When the potential Vb is set at 2.5 V, the bit line BLb serving as a reference bit line is precharged. When the precharge signals φpa and φpb go 'L', the bit lines BLa and BLb float. Subsequently, when the signal PBa goes 'L', the bit line BLa is charged with 2.5 V or more only when the node N1 is at 'L'. Thereafter, when the flip-flop activating signals φn1 and φp1 go 'L' and 'H', respectively, the flip-flop FF1 is reset. When the signals φa1 and φb1 go 'H', the flip-flop FF1 is coupled to the bit lines BLa and BLb. When the signals φn1 and φp1 go 'H' and 'L', respectively, the bit line potential is sensed.

With the above operation, the data of the flip-flop FF1 is reversed. At this time, in the flip-flops FF1 and FF2, the node N1 is set at 'H' in a '0' write operation after the data reverse operation is performed, the node N1 is set at 'L' at one of a '2' write operation and a '1' write operation after the data reverse operation is performed, and the node N3 is set at 'H' in the '1' write operation and set at 'L' in the '2' write operation.

In the verify read operation after '0' has been written, the node N1 is at 'H', and the n-channel MOS transistor Qn5 is in an ON state. For this reason, the signal VRFYa goes 'H' independently of the state of a memory cell, and the bit line BLa is set at 'L' by the potentials VBLa and VBMa which are at 0 V. Therefore, the bit line BLa is sensed by the flip-flop FF1 such that the node N1 is set at 'L', and rewrite data '0' is latched.

In the verify read operation after '1' has been written, the nodes N2 and N4 are at 'H'. For this reason, when the signal VRFYb goes 'H', the reference bit line BLb is set at 2.5 V. Therefore, when the memory cell does not reach a '1' write state, the bit line BLa is at 2.5 V or more, and the bit line BLa is sensed by the flip-flop FF1 such that the node N1 is set at 'H', and rewrite data '1' is latched. When the memory cell reaches the '1' write state, the bit line BLa is at 2.5 V or less, and the bit line BLa is sensed by the flip-flop FF1 such that the node N1 is set at 'L'. Rewrite data '0' is latched, and a threshold voltage does not change in the rewrite operation.

In the verify read operation after '2' has been written, the nodes N2 and N3 are set at 'H'. For this reason, when the signal VRFYb goes 'H', the reference bit line BLb is set at 0.5 V. Therefore, when the memory cell does not reach a '2' write state, the bit line BLa is at 0.5 V or more, and the bit line BLa is sensed by the flip-flop FF1 such that the node N1 is set at 'H'. Rewrite data '2' is latched. When the memory cell reaches the '2' write state, the bit line BLa is at 0.5 V or less, and the bit line BLa is sensed by the flip-flop FF1 such that the node N1 is set at 'L'. Rewrite data '0' is latched, and the threshold voltage does not change in the rewrite operation.

With this verify read operation, rewrite data is set as shown in Table 1 on the basis of write data and the write state of the memory cell.

TABLE 1

| | |
|---|---|
| WRITE DATA | 00011222 |
| DATA OF MEMORY CELL | 01201012 |
| REWRITE DATA | 00010220 |

As is apparent from Table 1, a '1' write operation is performed for only a memory cell which is to be set in a '1' write state but is set in an insufficient '1' write state, and a '2' write operation is performed for only a memory cell which is to be set in a '2' write state but is set in an insufficient '2' write state.

When the write operation and the verify read operation are repeated, a data write operation is performed for each memory cell such that a write time is optimized.

Table 2 shows the potentials of the portions of a memory cell array in an erasing operation, a write operation, a read operation, and a verify read operation.

TABLE 2

| | ERASING OPERATION | WRITE OPERATION "0" "1" "2" | READ OPERATION | VERIFY READ OPERATION |
|---|---|---|---|---|
| BL | 20 V | 8 V  1 V  0 V | | SEE FIG. 5 |
| SG1 | 20 V | 10 V | 6 V | 6 V |
| CG1 | 20 V | 10 V | 6 V | 6 V |
| CG2 | 0 V | 20 V | 2 V | 2 V |
| CG3 | 0 V | 10 V | 6 V | 6 V |
| CG4 | 0 V | 10 V | 6 V | 6 V |
| CG5 | 0 V | 10 V | 6 V | 6 V |
| CG6 | 0 V | 10 V | 6 V | 6 V |
| CG7 | 0 V | 10 V | 6 V | 6 V |
| CG8 | 0 V | 10 V | 6 V | 6 V |
| SG2 | 20 V | 0 V | 6 V | 6 V |
| VS | 20 V | 0 V | 6 V | 6 V |

TABLE 2-continued

|  | ERASING OPERATION | WRITE OPERATION "0" "1" "2" | READ OPERATION | VERIFY READ OPERATION |
|---|---|---|---|---|
| p-well | 20 V | 0 V | 0 V | 0 V |

As described above, when the bit line control circuit shown in FIG. 2 is used, a data write operation, a data verify read operation, a data read operation, and a data erasing operation can be performed for the memory cells of a ternary storing EEPROM.

However, the read operation requires two basic cycles, i.e., a first read cycle for determining "'0' or one of '1' and '2'" and a second read cycle for determining "'2' or one of '1' and '0'". The verify read operation also requires two basic cycles, i.e., a reverse cycle and a verify cycle. Therefore, each operation requires a long time.

As described above, in the ternary (multi-value) EEPROM having the bit line control circuit shown in FIG. 2, the read operation requires the two basic cycles, i.e., the first read cycle and the second read cycle, and the verify read operation requires the two basic cycles, i.e., the reverse cycle and the verify cycle. Therefore, each operation requires a long time.

SUMMARY OF THE INVENTION

It is an object of the present invention to provide a multi-value storing EEPROM in which each of a data write operation, a data verify read operation, a data read operation, and a data erasing operation for an EEPROM using multi-value storing cells can be performed by repeating one basic cycle, and the high-speed operation of a bit line control circuit can be realized.

It is another object of the present invention, a multi-value storing EEPROM capable of integrating a bit line control circuit at a high density.

In order to solve the above problems, the present invention employs the following arrangement.

The non volatile semiconductor memory device according to the present invention is characterized by comprising: a memory cell array in which a plurality of electrically rewritable memory cells for storing multi-value data representing not less than three data are arranged in a matrix; a plurality of bit lines, respectively coupled to the plurality of memory cells, for transmitting/receiving data to/from the memory cells; a plurality of sense amplifiers for sensing/amplifying potentials of the bit lines; a plurality of data latches for holding data to be written in the memory cells; a plurality of verify means for checking whether data are correctly written in the memory cells; a plurality of switch means for controlling to connect the plurality of sense amplifiers, the plurality of data latches, and the plurality of verify means to the bit lines; and write control means for setting potentials of the bit lines in accordance with contents of the plurality of data latches, wherein the plurality of switch means are set in an open state after data are read from the memory cells onto the bit lines, and the plurality of sense amplifiers almost simultaneously operate after the plurality of switch means are set in an open state to sense/amplify the data read onto the bit lines. More particularly, three-value memory EEPROM is characterized in that the memory cell array includes a plurality of memory cells for storing ternary data, the sense amplifiers include first and second sense amplifiers, the plurality of data latches include first and second data latches, the plurality of verify means include first and second verify means, the plurality of switch means include first and second switch means, the first switch means controls to connect the first sense amplifier, the first data latch, and the first verify means to the bit lines, and the second switch means controls to connect the second sense amplifier, the second data latch, and the second verify means to the bit lines. The multi-value memory storing three- or more value is characterized in that the memory cell array includes a plurality of memory cells for n-value (n: integer r>=3) data; the sense amplifiers include first to (n−1)th sense amplifiers, the plurality of data latches include first to (n−1)th data latches, the plurality of verify means include first to (n−1)th verify means, the plurality of switch means include first to (n−1)th data switch means, and the ith switch means (i=1 to n−1) controls to connect the ith sense amplifier (i=1 to n−1), the ith data latch (i=1 to n−1), and the ith verify means (i=1 to n−1) to the bit lines.

The preferred manners of the present invention are as follows.

(1) The plurality of switch means are set in an open state after data are read from the memory cells onto the bit lines, and the plurality of verify means almost simultaneously operate to perform a verify operation for the data read onto the bit line.

(2) The memory cells are formed by stacking a charge storage layer and a control gate on a semiconductor layer, and the plurality of memory cells are coupled in series with each other to constitute a NAND cell. In this manner, the write control means sets reference input potentials of the plurality of data latches which are set in a read operation of a write verify operation to be lower than reference input potentials of a general read operation by a predetermined value, or sets a control gate potential of a selected memory cell of the memory cells which is set in a read operation of a write verify operation to be higher than a potential of a general read operation by a predetermined value.

(3) The memory cells are formed by stacking a charge storage layer and a control gate on a semiconductor layer and constitute a NOR cell. In this manner, the write control means sets reference input potentials of the plurality of data latches which are set in a write/verify read operation to be higher than reference input potentials of a general read operation by a predetermined value, or sets a control gate potential of a selected memory cell which is set in a write/verify read operation to be lower than a potential of a general read operation by a predetermined value.

(4) The memory cells are formed by stacking a charge storage layer and a control gate on a semiconductor layer, and the plurality of memory cells are coupled parallel to each other to constitute a DINOR cell. The memory cells are formed by stacking a charge storage layer and a control gate on a semiconductor layer, and the plurality of memory cells are coupled parallel to each other to constitute an AND cell.

Particularly, in three-value memory EEPROM, (1) The bit lines are arranged in first and second directions using the memory cell array as a center, and the first switch means is coupled to the bit lines in the first direction, and the second switch means is coupled to the bit lines in the second direction. In this manner, the write control means inputs data of the first data latch to the second data latch through the bit lines in a data write operation, checking, on the basis of the data of the first latch and the data of the second latch, whether data to be written is specific data of the ternary data, and supplying a potential based on a determination result to the bit lines.

(2) The memory cell array includes at least a plurality of memory cell arrays which are first, second, and third memory cell arrays, the first sense amplifier, the first data latch, and the first verify means constitute a plurality of first bit line control circuits, the second sense amplifier, the second data latch, and the second verify means constitute a plurality of second bit line control circuits, and the first bit line control circuits and the second bit line control circuits are alternately arranged between the plurality of memory cell arrays such that the first bit line control circuit is arranged on one side of the first memory cell array, the second bit line control circuit is arranged between the other side of the first memory cell array and one side of the second memory cell array, and the first bit line control circuit is arranged between the other side of the second memory cell array and one side of the third memory cell array.

(3) The first sense amplifier senses whether data read out from the memory cell onto the bit line is first-value data of the ternary data or one of second- and third-value data of the ternary data, and amplifying the data, the second sense amplifier senses whether data read out from the memory cell onto the bit line is the second- or third-value data of the ternary data, and amplifying the data, the first data latch holds data indicating whether data to be written in the memory cells is the first-value data of the ternary data or one of the second- and third-value data of the ternary data, the second data latch holds data indicating whether the data to be written in the memory cells is the second- or third value data of the ternary data, and the first and second verify means checks whether states of the memory cells after a write operation become predetermined storage states, and data latch content updating means for updating contents of the first and second data latches such that a rewrite operation is performed for a memory cell set in an insufficient write state on the basis of the states of the memory cells after the write operation. In this manner, the write control means includes a write prevention bit line potential output circuit for outputting a write prevention bit line potential to the bit lines in a write operation when information of the first and second data latches is information for controlling to keep the states of the memory cells to states set before the write operation, and first and second write bit line potential output circuits for outputting the bit line potential in the write operation in accordance with information indicated by the first and second data latches when information of the first and second data latches is not information for controlling to keep the states of the memory cells to states set before the write operation.

In the multi-value memory EEPROM, ith sense amplifier (i=1 to n−1) sets and amplifies that data read out from the memory cells onto the bit lines are first- to ith-value data of the n-value data or (i−1)th- to nth-value data, the ith data latch (i=1 to n−1) holds data indicating that the data to be written in the memory cells are the ith-value data of the n-value data or other data, and the first to (n−1)th verify means checks whether states of the memory cells which are set after a write operation are predetermined storing states, and data latch content updating means updates contents of the first to (n−1)th data latches such that a rewrite operation is performed for only a memory cell set in an insufficient write state on the basis of the states of the memory cells which are set after the write operation. In this manner, the write control means, a write prevention bit line potential output circuit for outputting a write prevention bit line potential to the bit lines in a write operation when information of the first to (n−1)th data latches is information for controlling to keep the states of the memory cells to states set before the write operation, and first to (n−1)th write bit line potential output circuits for outputting a bit line potential of the write operation in accordance with information indicated by the first to (n−1)th data latches when the information of the first to (n−1)th data latches is not information for controlling to keep the states of the memory cells to states set before the write operation.

According to the present invention having the above arrangement, a data write operation, a data verify read operation, and a data read operation, and a data erasing operation can be performed for the memory cells of a multi-value storing EEPROM. In addition, according to the present invention, when the opening/closing operations of a plurality of switches are performed, the read operation or the verify read operation can be performed by a single cycle. The data read/write operations can be performed within a short time.

In the ternary storing EEPROM described in the related art, the read operation requires two basic cycles, i.e., a first read cycle for determining "'0' or one of '1' and '2'" and a second read cycle for determining "'2' or one of '1' and '0'". The verify read operation also requires two basic cycles, i.e., a reverse cycle and a verify cycle. In contrast to this, according to the present invention, any one of these operations can be performed by a single-cycle operation. For this reason, data read/write operations can be performed within a short time.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a timing chart showing a write operation in FIG. 2;

FIG. 5 is a timing chart showing a verify read operation in FIG. 2;

FIG. 9 is a graph showing the relationship between the threshold voltage of a memory cell and a bit line output potential in a read operation;

FIG. 10 is a block diagram showing the basic arrangement of a NAND cell type EEPROM according to the first embodiment;

FIG. 23 is a timing chart showing a read operation in the third embodiment;

DETAILED DESCRIPTION OF THE PREFERRED EMBODIMENTS

Before embodiments of the present invention are described, a memory cell array of a multi-value storing NAND cell type EEPROM serving as the base of the present invention will be described below. In the following description, the memory cell arrays of ternary and quaternary storing NAND cell type EEPROMs will be described below.

Figure 6:
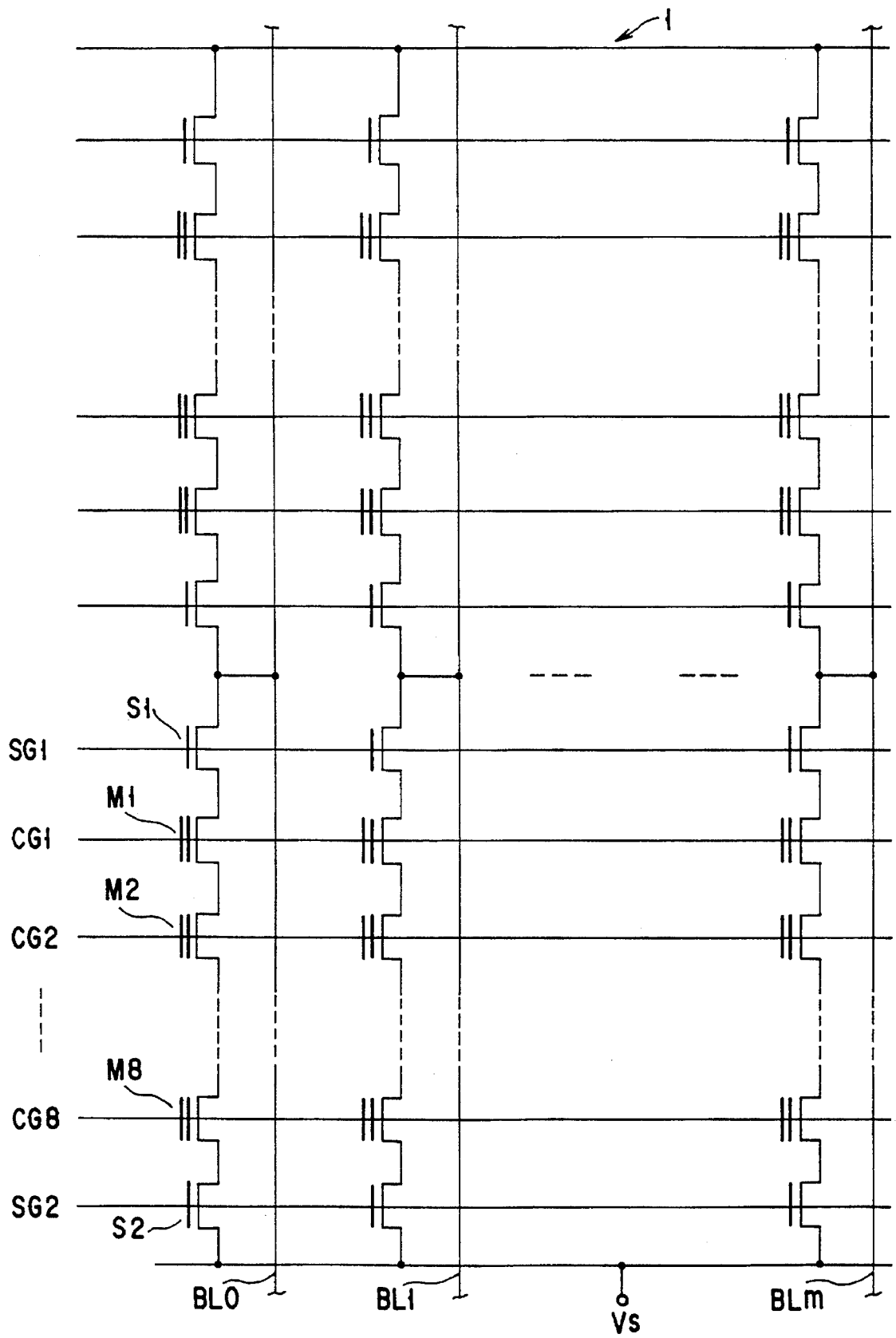
FIG. 6 is an equivalent circuit diagram showing the arrangement of a NAND cell array.

FIG. 6 shows a memory cell array 1 of a ternary storing NAND cell type EEPROM. The memory cell array 1 is formed on a p-type well or a p-type substrate (not shown). Eight memory cells M1 to M8 are coupled in series with each other between a selective transistor S1 coupled to a bit line BL and a selective transistor S2 coupled to a common source line VS to constitute one NAND cell. Selective transistors S1 and S2 have selective gates SG1 and SG2, respectively. The memory cells M1 to M8 have floating gates (charge storage layers) and control gates CG1 to CG8, respectively. Each memory cell stores information on the basis of an amount of charge stored in a corresponding one of the floating gates. The amount of stored charge can be read out as the threshold voltage of the memory cell.

Figure 7A:
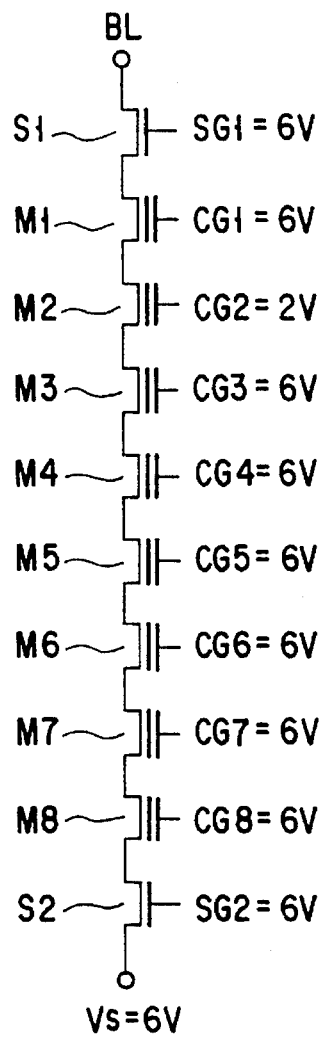
FIGS. 7A and 7B are views for explaining a read operation for a NAND cell.
Figure 7B:
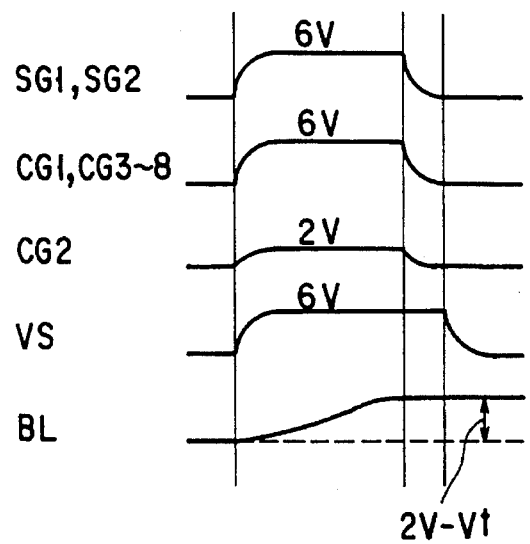

Information is read out from each of the memory cells M1 to M8, as shown in FIGS. 7A and 7B. Assuming that the memory cell M2 having the control gate CG2 is selected, a description will be made below.

The potentials shown in FIG. 7A are applied to the portions of a NAND cell. The bit line BL is set at 0 V in advance, and then is set in a floating state. The bit line BL is charged from the common source line VS through the NAND cell. The potentials of the selective gates SG1 and SG2 and the control gates CG1 to CG8 are controlled such that the potential of the charged bit line BL is determined by the threshold voltage of the selected memory cell M2. A potential obtained by subtracting the threshold voltage of the cell from the potential of the control gate CG2 appears on the bit line BL.

Figure 8:
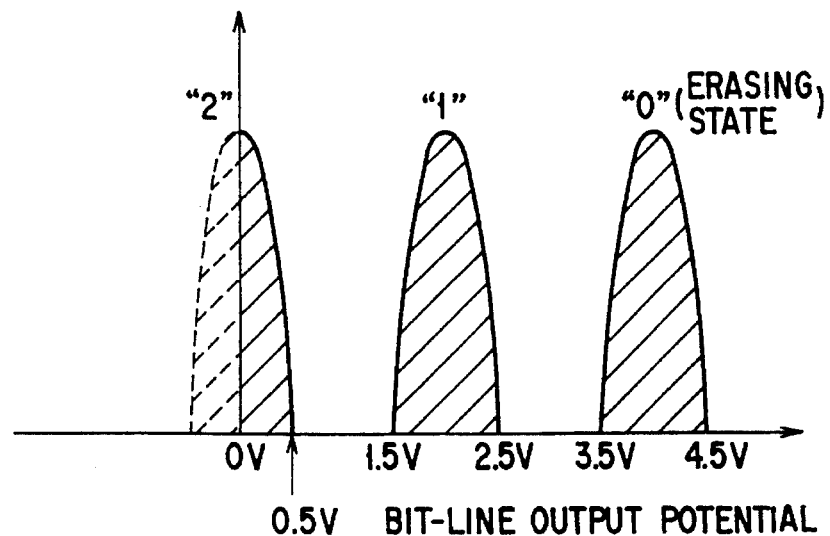
FIG. 8 is a graph showing the relationship between the threshold voltage of a memory cell and a bit line output potential in a read operation.

In the example shown in FIG. 7A, the selective gates SG1 and SG2 and the control gates CG1 and CG3 to CG8 are set at 6 V, the selected control gate CG2 is set at 2 V, and the common source line VS is set at 6 V. The potential waveforms of the portions are shown in FIG. 7B. The threshold values of the cells are set as follows. That is, a '0'-written cell is set at −2.5 V to −1.5 V, a '1'-written cell is set at −0.5 V to 0.5 V, and a '2'-written cell is set at 1.5 V to 2.5 V. When a read operation is performed under these conditions, the '0'-written cell outputs a potential of 3.5 V to 4.5 V to the bit line, the '1'-written cell outputs a potential of 1.5 V to 2.5 V to the bit line, and the '2'-written cell outputs a potential of 0 V to 0.5 V to the bit line. These states are shown in FIG. 8.

The arrangement of the memory cell array 1 of the quaternary storing NAND cell type EEPROM is the same as that of the ternary storing NAND cell type EEPROM shown in FIG. 6, and an illustration and detailed description thereof will be omitted.

Information is read out in the same manner as that in the ternary storing NAND cell type EEPROM shown in FIG. 7B. In this case, unlike in the ternary storing NAND cell type EEPROM, the selected control gate CG2 is set at, e.g., 4 V. The threshold values of the cells are set as follows. That is, a '0'-written cell is set at −2.5 V to −1.5 V, a '1'-written cell is set at −0.5 V to 0.5 V, a '2'-written cell is set at 1.5 V to 2.5 V, and a '3'-written cell is set at 3.5 V to 4.5 V. When a read operation is performed under these conditions, the '0'-written cell outputs a potential of 5.5 V to 6 V to the bit line, the '1'-written cell outputs a potential of 3.5 V to 4.5 V to the bit line, the '2'-written cell outputs a potential of 1.5 V to 2.5 V to the bit line, and the '3'-written cell outputs a potential of 0 V to 0.5 V to the bit line. These states are shown in FIG. 9.

Embodiments of the present invention will be described below.

FIG. 10 is a block diagram showing the basic arrangement of a ternary storing NAND cell type EEPROM according to the first embodiment of the present invention. Although only a structure related to one bit line is shown in FIG. 10, the same structure as shown in FIG. 10 is arranged for each bit line.

A plurality of electrically rewritable memory cells 30 each of which stores ternary data are coupled in series with each other to constitute the NAND cells shown in FIGS. 6, 7A, and 7B.

A bit line 31 is coupled to the plurality of NAND cells and transmits/receives data to/from the memory cells.

A first sense amplifier $32_1$ and a second sense amplifier $32_2$ sense and amplify the potential of the bit line 31.

A first data latch $33_1$ and a second sense amplifier $32_2$ hold data to be written in the memory cells 30.

A first verify circuit $34_1$ and a second verify circuit $34_2$ check whether data are correctly written in the memory cells 30.

A first switch $35_1$ controls the connection between the bit line 31 and the first sense amplifier $32_1$, the first data latch $33_1$, or the first verify circuit $34_1$.

A second switch $35_2$ controls the connection between the bit line 31 and the second sense amplifier $32_2$, the second data latch $33_2$, or the second verify circuit $34_2$.

A write control circuit 40 sets the potential of the bit line 31 in accordance with the contents of the first and second data latches $33_1$ and $33_2$.

In the above arrangement, the first and second switches $35_1$ and $35_2$ are turned on to read data from the memory cells 30 onto the bit line 31, and then the first and second switches $35_1$ and $35_2$ are set in an open state. The first and second sense amplifiers $32_1$ and $32_2$ are almost simultaneously operated to sense and amplify the data. The first verify circuit $34_1$ and the second verify circuit $34_2$ are almost simultaneously operated to verify the write data.

The arrangement of the device according to the first embodiment will be described in more detail below.

Figure 11:
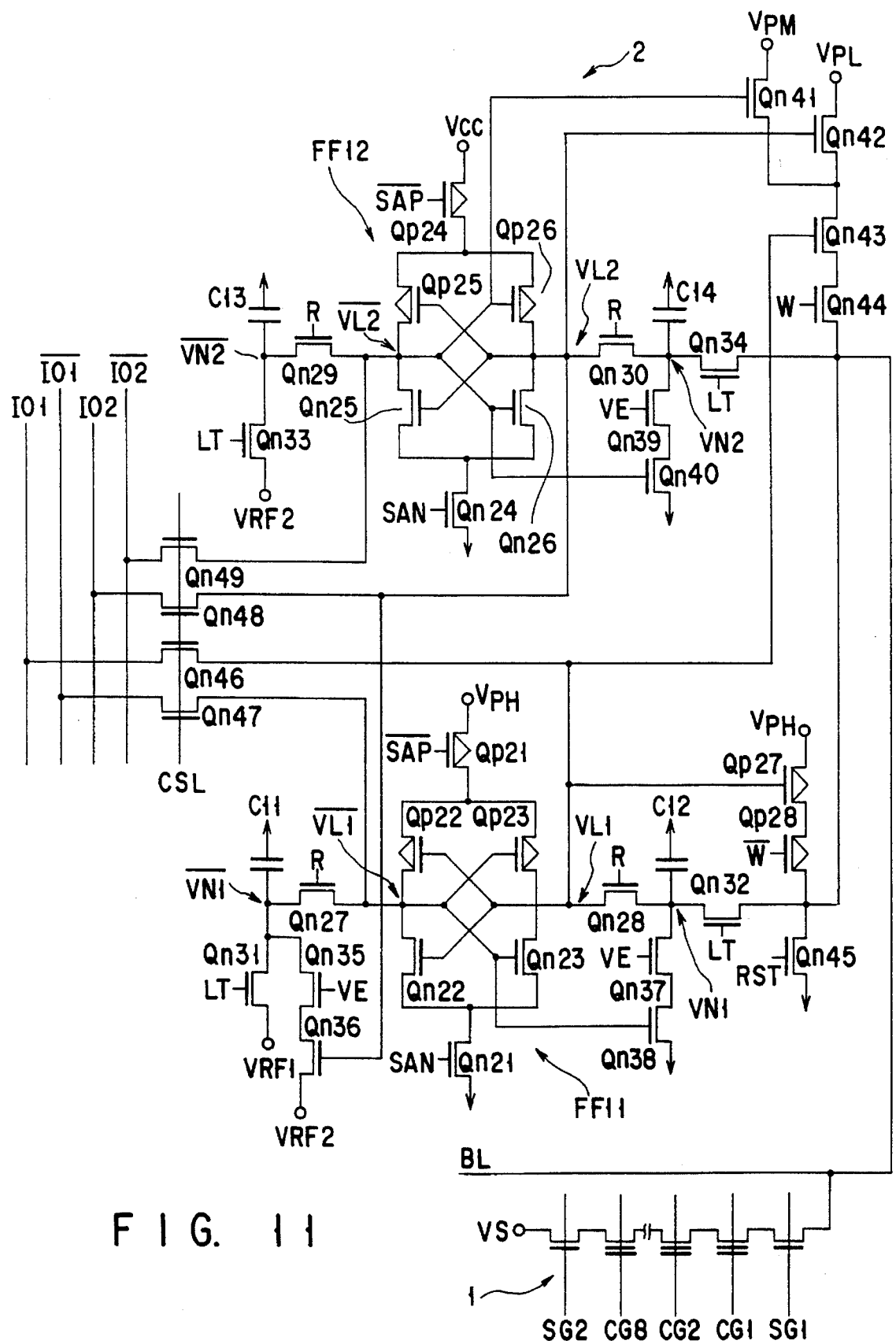
FIG. 11 is a detailed circuit diagram showing a memory cell array and a bit line control circuit in the first embodiment.

FIG. 11 is a circuit diagram showing a memory cell array 1 and a bit line control circuit 2 of a ternary storing NAND cell type EEPROM according to the first embodiment.

One terminal of a NAND cell is coupled to a bit line BL, and the other terminal is coupled to a common source line VS. Selective gates SG1 and SG2 and control gates CG1 to CG8 are shared by a plurality of NAND cells, and memory cells M which share one control gate constitute a page. As in the case shown in FIG. 8, each memory cell stores data '0', '1', and '2' on the basis of the threshold voltage of the corresponding memory cell. The memory cell array 1 is formed on a p-type well.

A flip-flop FF11 constituted by n-channel MOS transistors Qn21 to Qn23 and p-channel MOS transistors Qp21 to Qp23 and a flip-flop FF12 constituted by n-channel MOS transistors Qn24 to Qn26 and p-channel MOS transistors Qp24 to Qp26 latch write/read data. The flip-flops FF11 and FF12 also operate as sense amplifiers. The flip-flop FF11 latches write data information indicating "'0' is written or one of '1' and '2' is written'. The flip-flop FF11 latches write data information indicating that a memory cell 'holds information of '0' or holds one of information of '1' and information of '2'". The flip-flop FF12 latches write data information indicating that "'1' is written or '2' is written'. The flip-flop FF12 latches read data information indicating that a memory cell 'holds information of '2' or holds one of information of '0' and information of '1'".

When a signal R goes 'H', n-channel MOS transistors Qn27 to Qn30 couple the flip-flops FF11 and FF12 to nodes VN1 and /VN1 and nodes VN2 and VN2, respectively. N-channel MOS transistors Qn31 and Qn33 couple the nodes /VN1 and /VN2 to reference potentials VRF1 and VRF2 in response to a signal LT, respectively. N-channel MOS transistors Qn32 and Qn34 couple the nodes VN1 and VN2 to the bit line BL in response to the signal LT. N-channel MOS transistors Qn35 and Qn36 change the reference potential of the flip-flop FF11 to the reference potential VREF2 in accordance with data latched in the flip-flop FF12 in a verify read operation. N-channel MOS transistors Qn37 to Qn40 reset the nodes VN1 and VN2 in accordance with the data latched in the flip-flops FF11 and FF12 in a verify operation.

In a write operation, n-channel MOS transistors Qn41 to Qn44 and p-channel MOS transistors Qp27 and Qp28 selectively transfer potentials VPH, VPM, and VPL to the bit line BL in accordance with the data latched in the flip-flops FF11 and FF12. When a signal RST goes 'H', an n-channel MOS transistor Qn45 resets the bit line BL to 0 V. When a signal CSL goes 'H', n-channel MOS transistors Qn46 to Qn49 couple the flip-flops FF11 and FF12 to data input/output lines IO1 and /IO1 and data input/output lines IO2 and /IO2, respectively.

Figure 12:
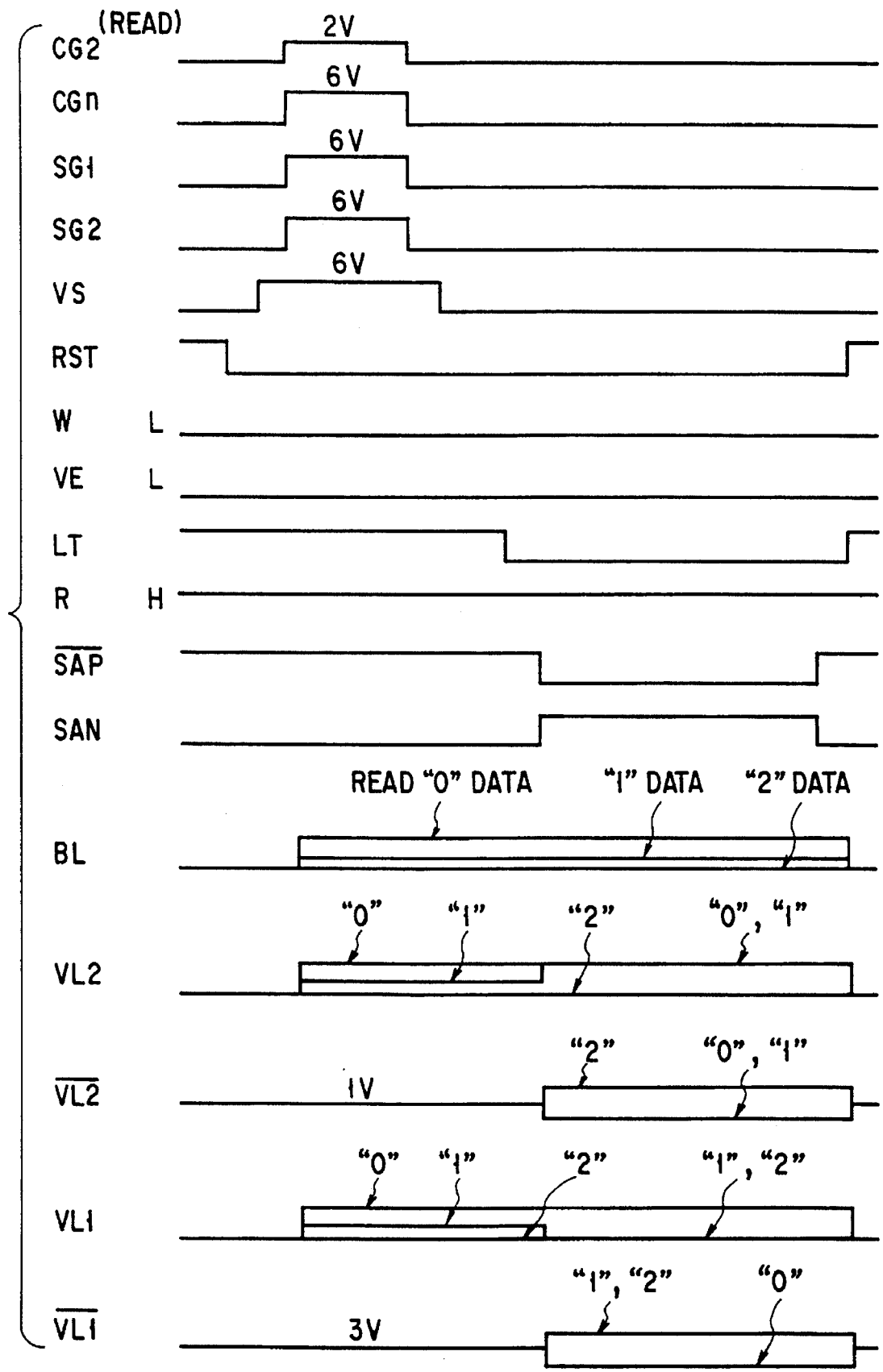
FIG. 12 is a timing chart showing a read operation in the first embodiment.
Figure 13:
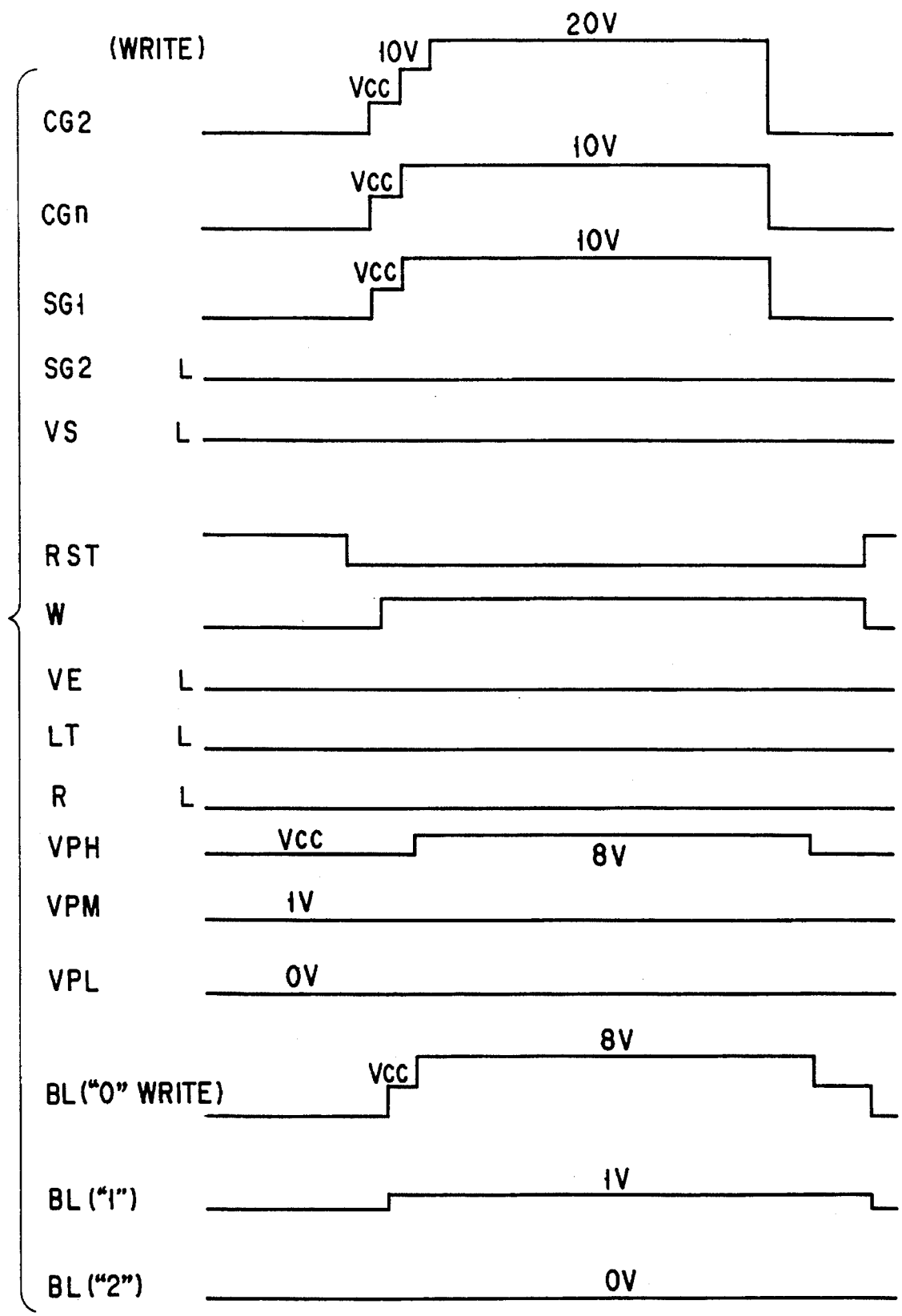
FIG. 13 is a timing chart showing a write operation in the first embodiment.
Figure 14:
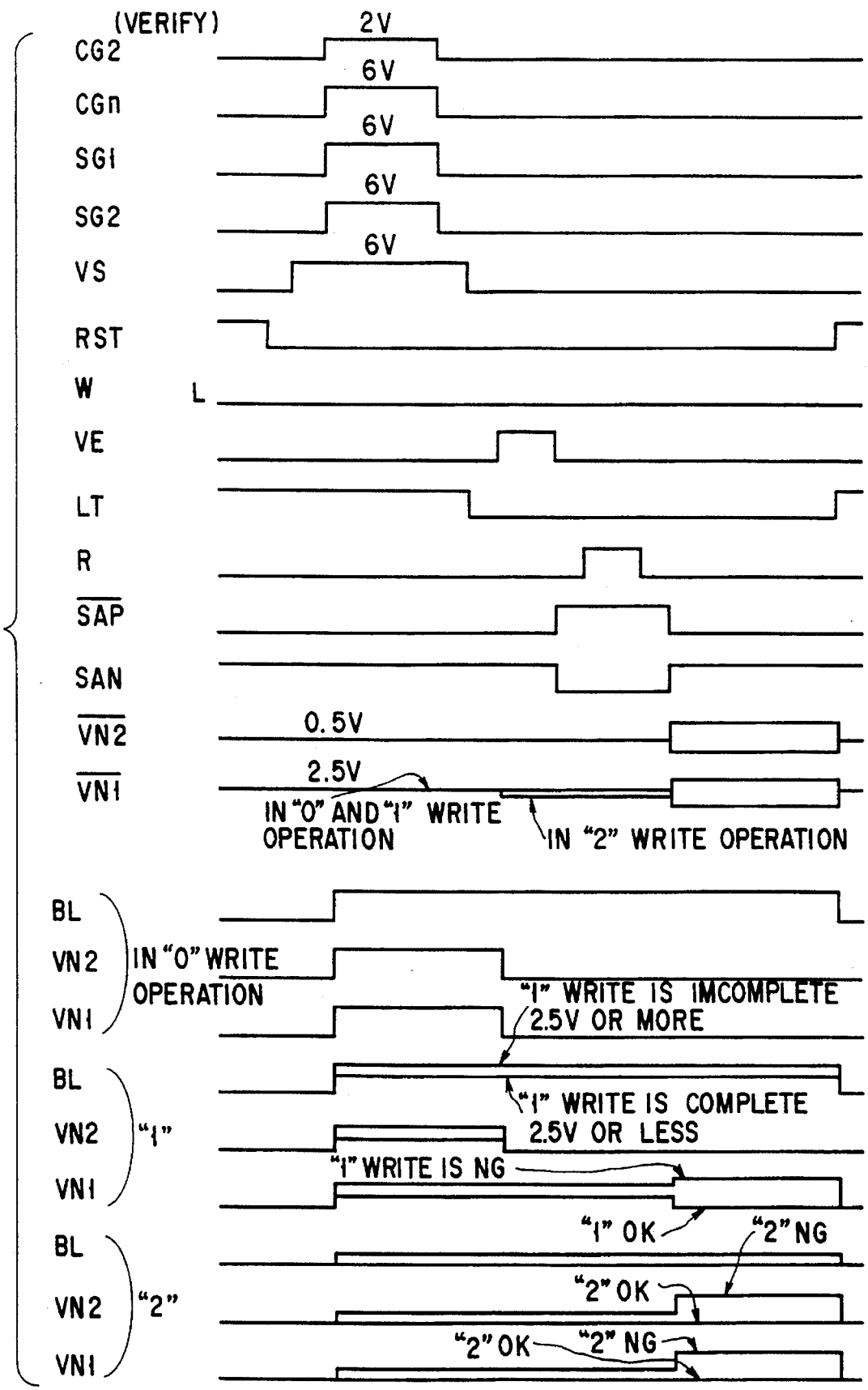
FIG. 14 is a timing chart showing a verify read operation in the first embodiment.

The operation of the EEPROM arranged as described above will be described below with reference to FIGS. 12 to 14. FIG. 12 shows read operation timings, FIG. 13 shows write operation timings, and FIG. 14 shows verify read operation timings. In the following description, a case wherein the control gate CG2 is selected is exemplified.

A write operation will be described below with reference to FIG. 12.

The entire bit line control circuit 2 is reset prior to a read operation. A signal /SAP goes 'H', and a signal SAN goes 'L', thereby inactivating the flip-flops FF11 and FF12. When the signal RST goes 'H', the bit line BL is reset to 0 V. At this time, the signals LT and R are at 'H', nodes VL1 and VL2 and the nodes VN1 and VN2 are coupled to the bit line. For this reason, these nodes are set at 0 V. On the other hand, a node /VL1 and the node /VN1 are coupled to the reference potential VRF1 (e.g., 3 V in a read operation) and charged to 3 V. Similarly, a node /VL2 and the node /VN2 are coupled to the reference potential VRF2 (e.g., 1 V in a read operation) and charged to 1 V.

The common source line VS is set at 6 V. The selective gates SG1 and SG2 and the control gates CG1 and CG3 to CG8 are set at 6 V. At the same time, the selected control gate CG2 is set at 2 V. The bit line BL is charged in accordance with the data of a selected memory cell.

Upon completion of charging the bit line BL, the common source line VS, the selective gates SG1 and SG2, and the control gates CG1 to CG8 are set at 0 V. When the signal LT goes 'L', the potential of the bit line BL corresponding to the data of the cell is received by the nodes VN1 and VN2.

Thereafter, when the flip-flop activating signals /SAN and SAN go 'L' and 'H', respectively, the flip-flops FF11 and FF12 are activated, and the potential of the bit line BL is sensed. When the data of the cell is '0', the potential of the bit line BL is 3.5 V to 4.5 V. For this reason, data which satisfy VL1='H', /VL1='L', VL2='H', and /VL2='L' are sensed and latched by the flip-flops FF11 and FF12.

When the data is '1', the potential of the bit line BL is 1.5 V to 2.5 V, and data which satisfy VL1='L', /VL1='H', VL2='H', and /VL2='L' are sensed and latched by the flip-flops FF11 and FF12. When the data is '2', a potential of 0 V to 0.5 V is output to the bit line BL, and data which satisfy VL1='L', /VL1='H', VL2='L', and /VL2='H' are sensed and latched by the flip-flops FF11 and FF12.

In this manner, the data latched by the flip-flops FF11 and FF12 are transmitted to the data input/output lines IO1, /IO1, IO2, and /IO2 by setting the signal CSL at 'H', thereby performing a read operation.

As described above, according to the present invention, ternary data written in a memory cell can be read out by a single read cycle.

A write operation will be described below with reference to FIG. 13.

Data in a memory cell is erased prior to a data write operation, and a threshold voltage Vt of the memory cell becomes −1.5 V or less. An erasing operation is performed such that the p-type well, the common source line VS, the selective gates SG1 and SG2 are set at 20 V, and the control gates CG1 to CG8 are set at 0 V, thereby discharging electrons from the charge storage layer.

Write data data11 and data12 are input from the data input/output lines IO1 and /IO1 and the data input/output lines IO2 and /IO2 and latched by the flip-flops FF11 and FF12, respectively. The data data11 is data for controlling "'0' write operation or one of a '1' write operation and a '2' write operation'. The node VL1 is at 'L' in the '0' write operation, and the node VL1 is at 'H' in one of the '1' write operation and the '2' write operation. The data data12 is data for controlling "'1' write operation or '2' write operation'. The node VL2 is at 'L' in the '1' write operation, and the node VL2 is at 'H' in the '2' write operation.

The signal RST goes 'H', the n-channel MOS transistor Qn45 is turned on, thereby resetting the bit line BL to 0 V. At this time, the signals LT and R are at 'L', and the flip-flops FF11 and FF12 are separated from the bit line BL and the reference potentials VRF1 and VRF2. A signal W goes 'H'.

In the '0' write operation, the flip-flop FF11 latches data indicating that the node VL1 is at 'L'. For this reason, the p-channel MOS transistors Qp27 and Qp28 are turned on to charge the bit line BL to Vcc with the potential VPH. In the '1' write operation, the node VL1 is at 'H' and data 'H' is latched in the node /VL2 of the flip-flop FF12. For this reason, the n-channel MOS transistors Qn41, Qn43, and Qn44 are turned on to apply 1 V to the bit line BL with the potential VPM. In the '2' write operation, since the node VL2 is set 'H', the n-channel MOS transistors Qn42, Qn43, and Qn44 are turned on to set the bit line BL to 0 V with the potential VPL. At this time, the selective gate SG1 is set at Vcc, and the control gates CG1 to CG8 are set at Vcc. The selective gate SG2 is at 0 V during the write operation.

The selective gate SG1 and the control gates CG1 to CG8 are set at 10 V, and the potential VPH becomes 8 V. At this time, in the '0' write operation, the bit line BL is charged to 8 V. Thereafter, the selected control gate CG2 is set at 20 V.

In one of the '1' write operation and the '2' write operation, electrons are injected into the charge storage layer of the memory cell due to the potential difference between the bit line BL and the control gate CG2, thereby increasing the threshold voltage of the memory cell. In the '1' write operation, an amount of charge to be injected into the charge storage layer of the memory cell must be smaller than that in the '2' write operation. The bit line BL is set at 1 V to moderate the potential difference between the bit line BL and the control gate CG2 to 19 V. In the '0' write operation, electron injection is suppressed by a bit line potential (=8 V), and the threshold voltage of the memory cell does not change.

Upon completion of the write operation, the selective gate SG1 and the control gates CG1 to CG8 are set at 0 V, and then the potential (=8 V) of the bit line BL in the '0' write operation is reset to 0 V. When this order is reversed, the state of a '2' write operation is temporarily set, and erroneous data is written in the '0' write operation.

A verify read operation is performed after the write operation. The verify read operation will be described below with reference to FIG. 14.

In the verify read operation, the write states of the memory cells are checked. If the write states of all the cells are sufficient, the write operation is ended. If a memory cell is set in an insufficient write state, data for performing an additional write operation for only the cell set in the insufficient write state is formed. While the data data11 and data12 are kept latched in the flip-flops FF11 and FF12, a read operation is performed for the memory cells. New data data11 and data12 which are data to be written next are formed on the basis of the data data11 and data12 and data on the bit line BL and latched in the flip-flops FF11 and FF12.

When the signals RST and LT go 'H' prior to the verify read operation, the bit line BL and the nodes VN1 and VN2 are reset to 0 V. The node /VN1 is coupled to the reference potential VRF1, and the node /VN2 is coupled to the reference potential VRF2. The potentials of the reference potentials VRF1 and VRF2 are set at 2.5 V and 0.5 V lower than the potentials of 3 V and 1 V in the read operation, respectively, such that a write threshold voltage margin of 0.5 V is assured. At this time, the signal R is at 'L', and the bit line BL is disconnected from the nodes VL1 and VL2. Similarly, the reference potentials VRF1 and VRF2 are disconnected from the nodes /VL1 and /VL2, and the flip-flops FF11 and FF12 are kept activated to latch the data data11 and data12.

The common source line VS is set at 6 V. The selective gates SG1 and SG2 and the control gates CG1 and CG3 to CG8 are set at 6 V. At the same time, the selected control gate CG2 is set at 2 V. In accordance with data in the selected memory cell, the bit line BL is charged to a predetermined potential.

The reference potentials VRF1 and VRF2 are set to be lower than those in the read operation by 0.5 V to assure the write threshold voltage margin of 0.5 V. However, even when the reference potentials VRF1 and VRF2 are respectively set at 3 V and 1 V as in the read operation, and the potential of the control gate CG2 is set to be high, i.e., 2.5 V, the same effect as described above can be obtained.

Upon completion of charging the bit line BL, the common source line VS, the selective gates SG1 and SG2, and the control gates CG1 to CG8 are set at 0 V, and then the signal LT goes 'L', thereby causing the nodes VN1 and VN2 to receive the potential of the bit line BL corresponding to data in the cell.

A signal VE goes 'H', and the potentials of the nodes VN1 and VN2 are modified by the data latched in the flip-flops FF11 and FF12. Thereafter, the flip-flops FF11 and FF12 are inactivated and then reset. The signal R goes 'H', and the potentials of the nodes VN1, /VN1, VN2 and /VN2 are transferred to the nodes VL1, /VL1, VL2 and /VL2, respectively. The flip-flops FF11 and FF12 are activated again, and new data are sensed and latched.

In a verify read operation after '0' has been written, the node /VL1 is at 'H', and the n-channel MOS transistor Qn38 is in an ON state. For this reason, the signal VE goes 'H' independently of the state of the memory cell, i.e., the potential of the bit line BL. When the n-channel MOS transistor Qn37 is turned on, the node VN1 is set at 0 V. Therefore, when the flip-flop FF11 is reset and then activated, the flip-flop FF11 senses data such that the node VL1 is set at 'L', and the flip-flop FF11 latches rewrite data '0' as the data data11.

In the verify read operation after '1' has been written, the node /VL1 is at 'L'. For this reason, the n-channel MOS transistor Qn38 is in an OFF state, the signal VE goes 'H', and the n-channel MOS transistor Qn37 is turned on. In this case, the potential of the node VN1 does not change. Therefore, when the memory cell does not reach a '1' write state, the node VN1 is at 2.5 V or more. When the flip-flop FF11 is reset and then activated, the flip-flop FF11 senses and latches data such that the node VL1 is set at 'H'. When the memory cell reaches the '1' write state, the node VN1 is at 2.5 V or less, and the flip-flop FF11 senses and latches data such that the node VL1 is set at 'L'.

The node /VL2 is at 'H', and the n-channel MOS transistor Qn40 is in an ON state. For this reason, the signal VE goes 'H' independently of the potential of the bit line BL. When the n-channel MOS transistor Qn39 is turned on, the node VN2 is set at 0 V. Therefore, when the flip-flop FF12 is reset and then activated, the flip-flop FF12 senses data such that the node VL2 is set at 'L'.

As described above, when the memory cell does not reach the '1' write state, rewrite data '1' is latched as the data data11 and data12. When the cell reaches the '1' write state, rewrite data '0' is latched, and the threshold voltage does not change in a rewrite operation.

In a verify read operation after '2' has been written, the node /VL1 is at 'L'. For this reason, the n-channel MOS transistor Qn38 is in an OFF state, the signal VE goes 'H', and the n-channel MOS transistor Qn37 is turned on. In this case, the potential of the node VN1 does not change. The node VL2 is at 'H', and the n-channel MOS transistor Qn36 is in an ON state. For this reason, when the signal VE goes 'H' to turn on the n-channel MOS transistor Qn35, the node /VN1 is coupled to the reference potential VRF2 and set at 0.5 V which is equal to the potential of the node /VN2. Therefore, when the memory cell does not reach a '2' write state, the node VN1 is at 0.5 V or more, and the flip-flop FF11 senses data such that the node VL1 is set at 'H'. When the memory cell reaches the '2' write state, the node VN1 is set at 0.5 V or less, and the flip-flop FF11 senses data such that the node VL1 is set at 'L'.

The node /VL2 is at 'L'. For this reason, the n-channel MOS transistor Qn40 is in an OFF state, the signal VE goes 'H', and the n-channel MOS transistor Qn39 is turned on. In this case, the potential of the node VN2 does not change. Therefore, when the memory cell does not reach the '2' write state, the node VN2 is at 0.5 V or more, and the flip-flop FF12 senses data such that the node VL2 is set at 'H'. When the memory cell reaches the '2' write state, the node VN2 is at 0.5 V or less, and the flip-flop FF12 senses data such that the node VL2 is set at 'L'.

As described above, when the memory cell does not reach the '2' write state, rewrite data '2' is latched as the data data11 and data12. When the memory cell reaches the '2' write state, rewrite data '0' is latched, and the threshold voltage does not change in the rewrite operation.

With this verify read operation, rewrite data is set on the basis of the write data and the write state of the memory cell, as described in Table 1. As is apparent from Table 1, a '1' write operation is performed again for only a memory cell which is to be set in the '1' write state but is in an insufficient '1' write state, and a '2' write operation is performed again for only a memory cell which is to be set in the '2' write state but is in an insufficient '2' write state.

When the write operation and the verify read operation are repeated as described above, a write time is optimized to perform a data write operation for each memory cell.

Figure 15A:
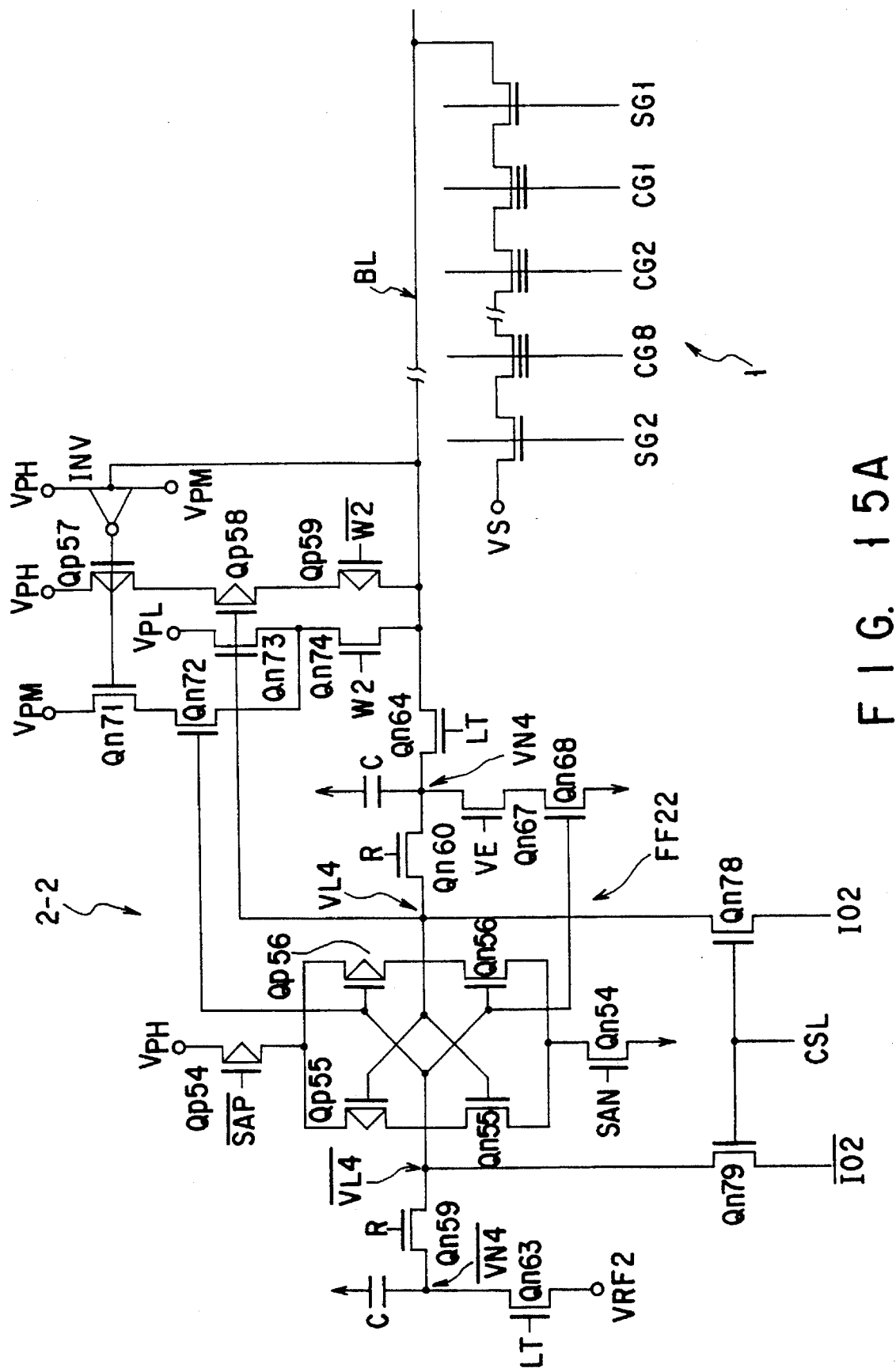
FIGS. 15A and 15B are detailed circuit diagrams showing a memory cell array and a bit line control circuit in the second embodiment.
Figure 15B:
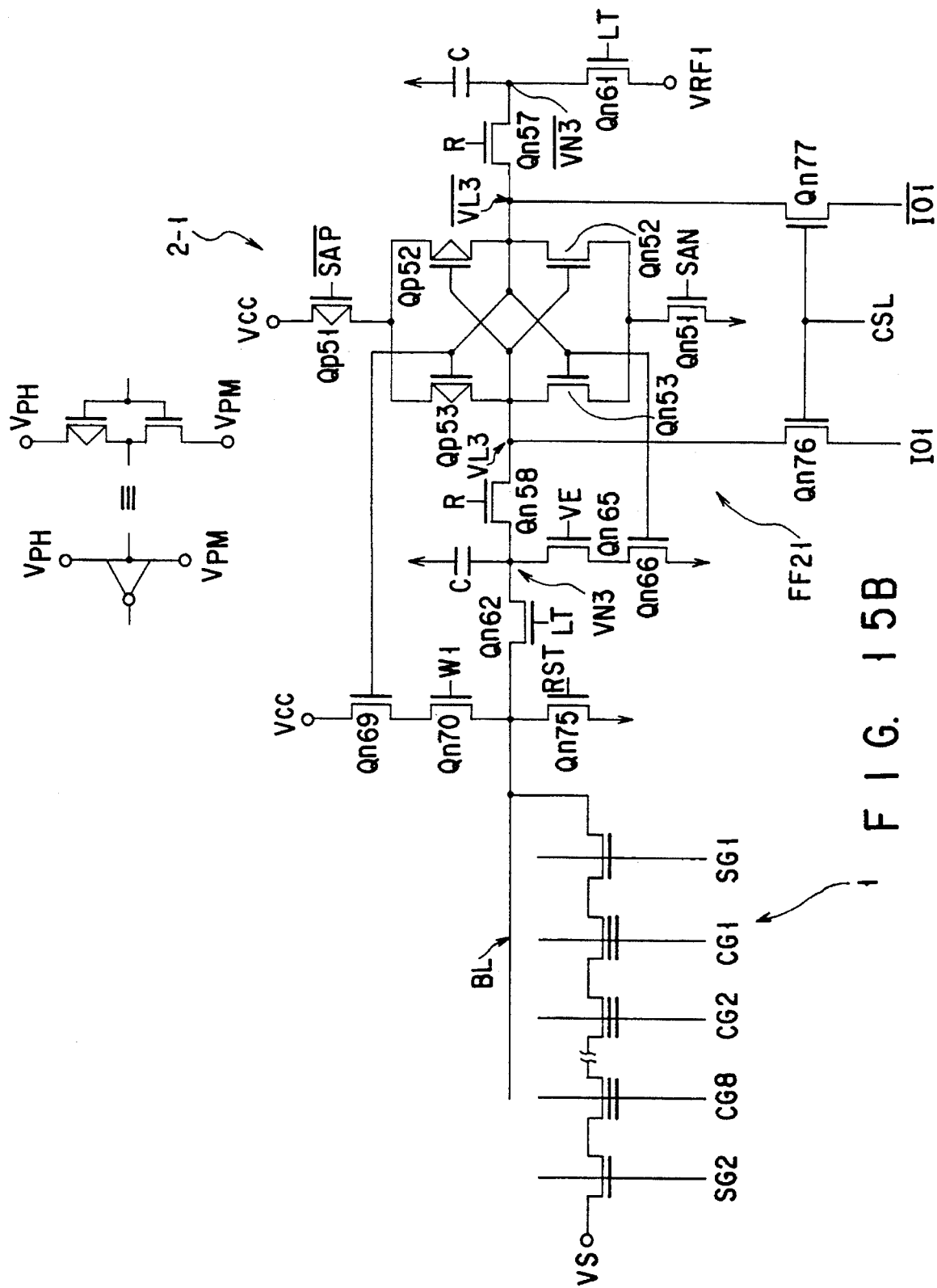

FIGS. 15A and 15B are block diagrams showing a memory cell array 1 and bit line control circuits 2-1 and 2-2 of a ternary storing NAND cell type EEPROM according to the second embodiment of the present invention.

In the first embodiment, each of a data write operation, a data verify read operation, a data read operation, and a data erasing operation performed for a memory cell of a ternary storing EEPROM can be performed by a single cycle, as described above. However, in the first embodiment, since the bit line control circuit 2 has a large size, the bit line control circuit 2 cannot be easily, efficiently laid out on an Si substrate in consideration of the pitch of bit lines. The second embodiment shown in FIGS. 15A and 15B further has the following feature. That is, a bit line control circuit 2 can be divided into two portions (bit line control circuits 2-1 and 2-2), and the bit line control circuits 2-1 and 2-2 can be separately arranged at both the ends of a bit line, thereby reducing difficulty in layout.

One terminal of a NAND cell is coupled to a bit line BL, and the other terminal is coupled to the common source line VS. Selective gates SG1 and SG2 and control gates CG1 to CG8 are shared by a plurality of NAND cells. Memory cells M which share one control gate constitute a page. Each memory cell stores data '0', '1', and '2' on the basis of a threshold voltage Vt of the corresponding memory cell as in the case shown in FIGS. 8 and 11. A memory cell array 1 is formed on a p-type well.

A flip-flop FF21 constituted by n-channel MOS transistors Qn51 to Qn53 and p-channel MOS transistors Qp51 to Qp53 and a flip-flop FF22 constituted by n-channel MOS transistors Qn54 to Qn56 and p-channel MOS transistors Qp54 to Qp56 latch write/read data. The flip-flops FF21 and FF22 also operate as sense amplifiers.

The flip-flop FF21 latches write data information indicating that "one of '0' and '2' is written or '1' is written'". The flip-flop FF21 latches read data information indicating that a memory cell "holds information of '0' or holds one of information of '1' and information of '2'". The flip-flop FF22 latches write data information indicating that "'1' is written or '2' is written'". The flip-flop FF22 latches read data information indicating that a memory cell 'holds information of '2' or holds one of information of '0' and information of '1'".

When a signal R goes 'H', n-channel MOS transistors Qn57 to Qn60 couple the flip-flops FF21 and FF22 to nodes VN3 and /VN3 and nodes VN4 and /VN4, respectively. N-channel MOS transistors Qn61 and Qn63 couple the nodes /VN3 and /VN4 to reference potentials VRF1 and VRF2 in response to a signal LT, respectively. N-channel MOS transistors Qn62 and Qn64 couple the nodes VN3 and VN4 to the bit line BL in response to the signal LT. N-channel MOS transistors Qn65 to Qn68 reset the nodes VN3 and VN4 in accordance with the data latched in the flip-flops FF21 and FF22 in a verify operation.

In a write operation, n-channel MOS transistors Qn69 to Qn74, p-channel MOS transistors Qp57 to Qp59, and an inverter INV selectively transfer potentials VPH, VPM, and VPL to the bit line BL in accordance with the data latched in the flip-flops FF21 and FF22. When a signal RST goes 'H', an n-channel MOS transistor Qn75 resets the bit line BL to 0 V. When a signal CSL goes 'H', n-channel MOS transistors Qn76 to Qn79 couple the flip-flops FF21 and FF22 to data input/output lines IO1 and /IO1 and data input/output lines IO2 and /IO2, respectively.

Figure 16:
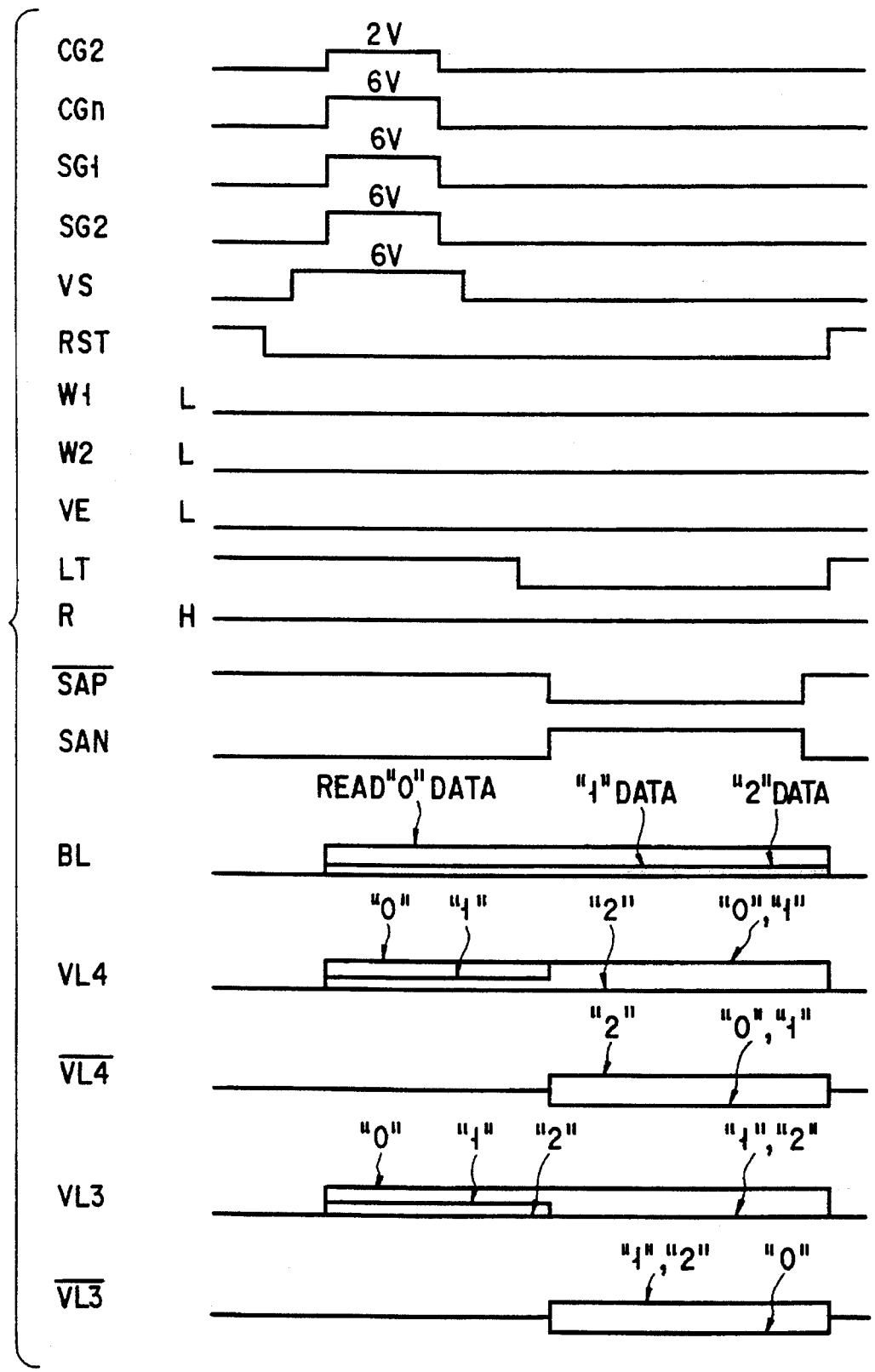
FIG. 16 is a timing chart showing a read operation in the second embodiment.
Figure 18:
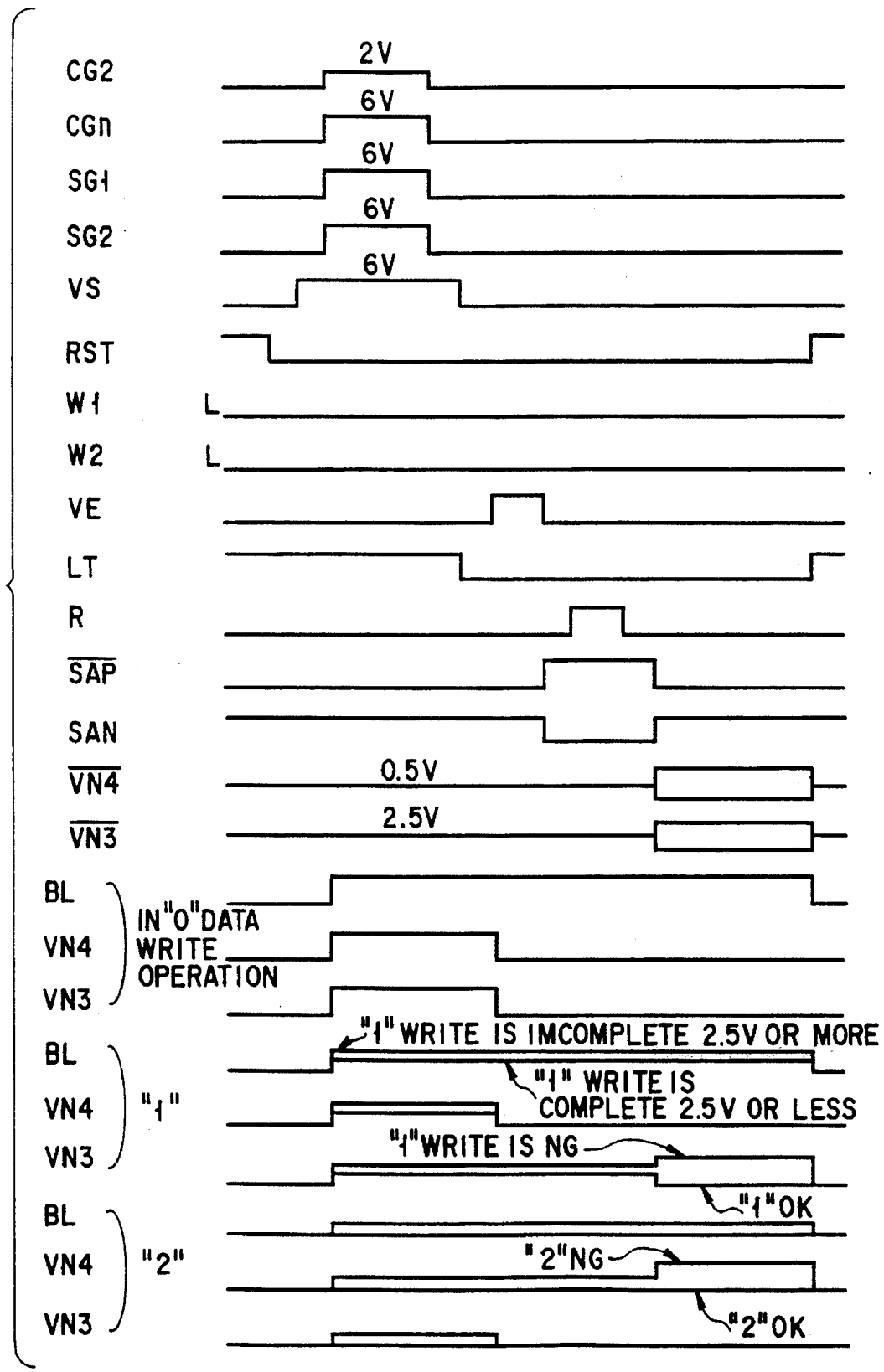
FIG. 18 is a timing chart showing a verify read operation in the second embodiment.
Figure 17:
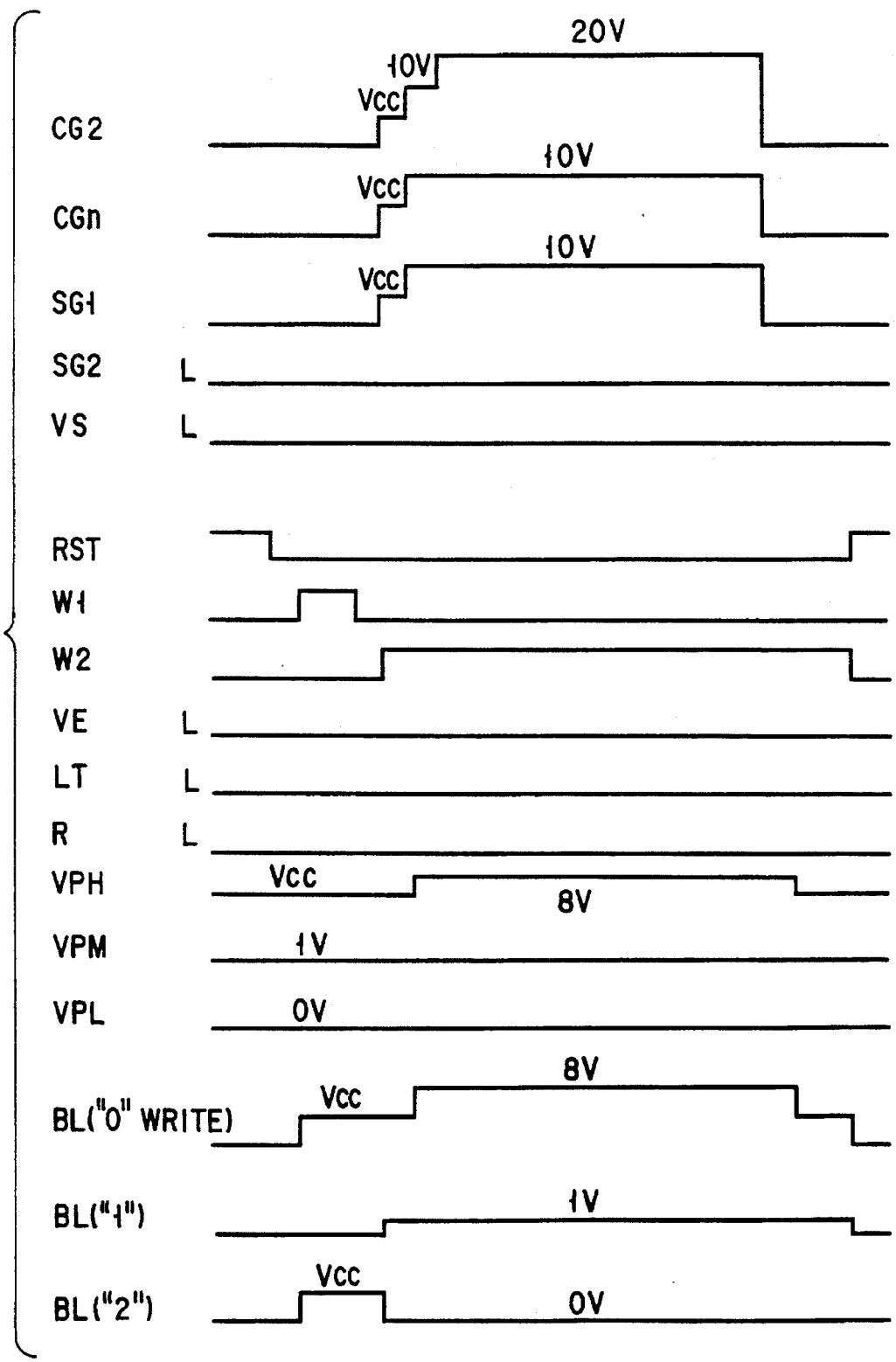
FIG. 17 is a timing chart showing a write operation in the second embodiment.

The operation of the EEPROM arranged as described above will be described below with reference to FIGS. 16 to 18. FIG. 16 shows read operation timings, FIG. 17 shows write operation timings, and FIG. 18 shows verify read operation timings. In the following description, a case wherein the control gate CG2 is selected is exemplified.

A read operation will be described below with reference to FIG. 16.

The entire bit line control circuit 2 is reset prior to a read operation. A signal/SAP goes 'H', and a signal SAN goes 'L', thereby inactivating the flip-flops FF21 and FF22. When the signal RST goes 'H', the bit line BL is reset to 0 V. At this time, the signals LT and R are at 'H' nodes VL3, VN3, VL4, and VN4 are coupled to the bit line. For this reason, these nodes are set at 0 V. On the other hand, a node /VL3 and the node /VN3 are coupled to the reference potential VRF1 (e.g., 3 V in a read operation) and charged to 3 V. Similarly, a node /VL4 and a node /VN4 are coupled to the reference potential VRF2 (e.g., 1 V in a read operation) and charged to 1 V.

The common source line VS is set at 6 V. The selective gates SG1 and SG2 and the control gates CG1 and CG3 to CG8 are set at 6 V. At the same time, the selected control gate CG2 is set at 2 V. The bit line BL is charged to a predetermined potential in accordance with the data of a selected memory cell.

Upon completion of charging the bit line BL, the common source line VS, the selective gates SG1 and SG2, and the control gates CG1 to CG8 are set at 0 V. When the signal LT goes 'L', the potential of the bit line BL corresponding to the data of the cell is received by the nodes VN3 and VN4.

Thereafter, when the flip-flop activating signals /SAP and SAN go 'L' and 'H', respectively, the flip-flops FF21 and FF22 are activated, and the potential of the bit line BL is sensed. When the data of the cell is '0' the potential of the bit line BL is 3.5 V to 4.5 V. For this reason, the flip-flops FF21 and FF22 sense and latch data which satisfy that VL3='H', /VL3='L', VL4='H', and /VL4='L'.

When the data is '1', the potential of the bit line BL is 1.5 V to 2.5 V, and data which satisfy VL3='L', /VL3='H', VL4='H', and /VL4='L' are sensed and latched When the data is '2', a potential of 0 V to 0.5 V is output to the bit line BL, and data which satisfy VL3='L', /VL3='H', VL4='L', and /VL4='H' are sensed and latched.

As described above, the data latched by the flip-flops FF21 and FF22 are transmitted to the data input/output lines IO1 and /IO1 and the data input/output lines IO2 and /IO2, respectively, by setting the signal CSL at 'H', thereby performing a read operation.

As described above, ternary data written in the memory cell can be read out by a single read cycle.

Data in a memory cell is erased prior to a data write operation, and a threshold voltage Vt of the memory cell is −1.5 V or less. An erasing operation is performed such that the p-type well, the common source line VS, the selective gates SG1 and SG2 are set at 20 V, and the control gates CG1 to CG8 are set at 0 V, thereby discharging electrons from the charge storage layer.

A write operation will be described below with reference to FIG. 17.

Write data data21 and data22 are input from the data input/output lines IO1 and /IO1 and the data input/output lines IO2 and /IO2 and latched by the flip-flops FF21 and FF22, respectively. The data data21 controls "one of '0' write operation and '2' write operation or '1' write operation". The node VL3 is at 'L' in one of the '0' write operation and the '2' write operation, and the node VL3 is at 'H' in the '1' write operation. The data data22 controls "one of '0' write operation and '1' write operation' or the '2' write operation". The node VL4 is at 'L' in one of the '0' write operation and the '1' write operation, and the node VL4 is at 'H' in the '2' write operation.

In the write operation, the signal RST goes 'H', and the n-channel MOS transistor Qn75 is turned on, thereby resetting the bit line BL to 0 V. At this time, the signals LT and R are at 'L' and the flip-flops FF21 and FF22 are separated from the bit line BL and the reference potentials VRF1 and VRF2. A signal W1 goes 'H'. In the '0' or '2' write operation, the flip-flop FF21 latches data indicating that the node /VL3 is at 'H'. For this reason, the n-channel MOS transistors Qn69 and Qn70 are turned on to charge the bit line BL to Vcc. In the '1' write operation, the bit line BL is kept at 0 V. An output from the inverter INV is set at 'L' in one of the '0' write operation and the '2' write operation in which the bit line is set at Vcc, and the output is set at 'H' in the '1' write operation in which the bit line is set at 0 V.

After the signal W1 goes 'L', a signal W2 goes 'H'. In the '0' write operation, the output from the inverter INV is at 'L', and the node VL4 is at 'L'. For this reason, the p-channel MOS transistors Qp57 to Qp59 are turned on, and the potential VPH keeps the bit line BL at Vcc. In the '1' write operation, the output from the inverter INV is at 'H' and the flip-flop FF22 latches data indicating that the node /VL4 is at 'H'. For this reason, the n-channel MOS transistors Qn71, Qn72, and Qn74 are turned on, and the potential VPM applies 1 V to the bit line BL. In the '2' write operation, the node VL4 is at 'H'. For this reason, the n-channel MOS transistors Qn73 and Qn74 are turned on to set the bit line BL to 0 V with the potential VPL. At this time, the selective gate SG1 is set at Vcc, and the control gates CG1 to CG8 are set at Vcc. The selective gate SG2 is at 0 V during the write operation.

The selective gate SG1 and the control gates CG1 to CG8 are set at 10 V, and the potential VPH becomes 8 V. At this time, in the '0' write operation, the bit line BL is charged to 8 V. Thereafter, the selected control gate CG2 is set at 20 V.

In one of the '1' write operation and the '2' write operation, electrons are injected into the charge storage layer of the memory cell due to the potential difference between the bit line BL and the control gate CG2, thereby increasing the threshold voltage of the memory cell. In the '1' write operation, an amount of charge to be injected into the charge storage layer of the memory cell must be smaller than that in the '2' write operation. The bit line BL is set at 1 V to moderate the potential difference between the bit line BL and the control gate CG2 to 19 V. In the '0' write operation, electron injection is suppressed by a bit line potential (=8 V), and the threshold voltage of the memory cell does not change.

Upon completion of the write operation, the selective gate SG1 and the control gates CG1 to CG8 are set at 0 V, and then the potential (=8 V) of the bit line BL in the '0' write operation is reset to 0 V. When this order is reversed, the state of the '2' write operation is temporarily set, and erroneous data is written in the '0' write operation.

A verify read operation is performed after the write operation. The verify read operation will be described below with reference to FIG. 18.

In the verify read operation, the write states of the memory cells are checked. If the write states of all the cells are sufficient, the write operation is ended. If a memory cell is set in an insufficient write state, data for performing an additional write operation for only the cell set in the insufficient write state is formed. While the data data21 and data22 are kept latched in the flip-flops FF21 and FF22, a read operation is performed for the memory cells. New data data21 and data22 which are data to be written next are formed on the basis of the data data21 and data22 and data on the bit line BL and latched in the flip-flops FF21 and FF22.

When the signals RST and LT go 'H' prior to the verify read operation, the bit line BL and the nodes VN3 and VN4 are reset to 0 V. The node /VN3 is coupled to the reference potential VRF1, and the node /VN4 is coupled to the reference potential VRF2. The potentials of the reference potentials VRF1 and VRF2 are set at 2.5 V and 0.5 V lower than the potentials of 3 V and 1 V in the read operation, respectively, such that a write threshold voltage margin of 0.5 V is assured. At this time, the signal R is at 'L', and the bit line BL is disconnected from the nodes VL3 and VL4. Similarly, the reference potentials VRF1 and VRF2 are disconnected from the nodes /VN3 and /VN4, and the flip-flops FF21 and FF22 are kept activate to latch the data data21 and data22.

The common source line VS is set at 6 V. The selective gates SG1 and SG2 and the control gates CG1 and CG3 to CG8 are set at 6 V. At the same time, the selected control gate CG2 is set at 2 V. In accordance with data in the selected memory cell, the bit line BL is charged.

The reference potentials VRF1 and VRF2 are set to be lower than those in the read operation by 0.5 V to assure the write threshold voltage margin of 0.5 V. However, when the reference potentials VRF1 and VRF2 are respectively set at 3 V and 1 V as in the read operation, and the potential of the control gate CG2 is set to be high, i.e., 2.5 V, the same effect as described above can be obtained.

Upon completion of charging the bit line BL, the common source line VS, the selective gates SG1 and SG2, and the control gates CG1 to CG8 are set at 0 V, and then the signal LT goes 'L', thereby causing the nodes VN3 and VN4 to receive the potential of the bit line BL corresponding to data in the cell.

A signal VE goes 'H', and the potentials of the nodes VN3 and VN4 are modified by the data latched in the flip-flops FF21 and FF22. Thereafter, the flip-flops FF21 and FF22 are inactivated and then reset. The signal R goes 'H', and the potentials of the nodes VN3, /VN3, VN4 and /VN4 are transferred to the nodes VL3, /VL3, VL4 and /VL4, respectively. The flip-flops FF21 and FF22 are activated again, and new data are sensed and latched.

In a verify read operation after '0' has been written, the node /VL3 is at 'H', and the n-channel MOS transistor Qn66 is in an ON state. For this reason, the signal VE goes 'H' independently of the state of the memory cell, i.e., the potential of the bit line BL. When the n-channel MOS transistor Qn65 is turned on, the node VN3 is set at 0 V. Therefore, when the flip-flop FF21 is reset and then activated, the flip-flop FF21 senses data such that the node VL3 is set at 'L'.

The node /VL4 is at 'H', and the n-channel MOS transistor Qn68 is in an ON state. For this reason, the signal VE goes 'H' independently of the potential of the bit line BL. When the n-channel MOS transistor Qn67 is turned on, the node VN4 is set at 0 V. Therefore, when the flip-flop FF22 is reset and then activated, the flip-flop FF22 senses data such that the node VL4 is set at 'L'. As described above, the rewrite data '0' is latched at the data data21 and data22.

In a verify read operation after '1' has been written, the node /VL3 is at 'L'. For this reason, the n-channel MOS transistor Qn66 is in an OFF state, the signal VE goes 'H', and the n-channel MOS transistor Qn65 is turned on. In this case, the potential of the node VN3 does not change. Therefore, the memory cell does not reach a '1' write state, the node VN3 is at 2.5 V or more, and the flip-flop FF21 is reset and then activated. In this case, the flip-flop FF21 senses and latches data such that the node VL3 is set at 'H'. When the memory cell reaches the '1' write state, the node VN3 is set at 2.5 V or less, and the flip-flop FF21 senses data such that the node VL3 is set at 'L'.

The node /VL4 is at 'H', and the n-channel MOS transistor Qn68 is in an ON state. For this reason, the signal VE goes 'H' independently of the potential of the bit line BL. When the n-channel MOS transistor Qn67 is turned on, the node VN4 is set at 0 V. Therefore, when the flip-flop FF22 is reset and then activated, the flip-flop FF22 senses data such that the node VL4 is set at 'L'.

As described above, when the memory cell reaches the '1' write state, rewrite data '1' is latched as the data data21 and data22. When the cell reaches the '1' write state, rewrite data '0' is latched, and the threshold voltage does not change in the rewrite operation.

In a verify read operation after '2' has been written, the node /VL3 is at 'H', and the n-channel MOS transistor Qn66 is in an ON state. For this reason, the signal VE goes 'H' independently of the potential of the bit line BL. When the n-channel MOS transistor Qn65 is turned on, the node VN3 is set at 0 V. Therefore, when the flip-flop FF21 is reset and then activated, the flip-flop FF21 senses data such that the node /VL3 is set at 'L'.

Since the node /VL4 is at 'L', the n-channel MOS transistor Qn68 is in an OFF state, and the signal VE goes 'H' to turn on the n-channel MOS transistor Qn67. In this case, the potential of the node VN4 does not change. Therefore, the memory cell does not reach the '2' write state, the node VN4 is at 0.5 V or more, and the flip-flop FF22 senses data such that the node VL4 is set at 'H'. When the memory cell reaches the '2' write state, the node VN4 is at 0.5 V or less, and the flip-flop FF22 senses data such that the node VL4 is set at 'L'.

As described above, when the memory cell does not reach the '2' write state, rewrite data '2' is latched as the data data21 and data22. When the memory cell reach the '2' write state, rewrite data '0' is latched, and the threshold voltage does not change in the rewrite operation.

With the verify read operation described above, a '1' write operation is performed again for only a memory cell which is to be set in the '1' write state but is in an insufficient '1' write state, and a '2' write operation is performed again for only a memory cell which is to be set in the '2' write state but is in an insufficient '2' write state.

When the write operation and the verify read operation are repeated as described above, a data write operation is performed for each memory cell such that a write time is optimized.

In order to perform a write operation of ternary data and a data verify read operation of ternary data in a memory cell, data latched in two flop-flops in a bit line control circuit must be generally calculated. For this purpose, signals must be transmitted/received between the flip-flops. In the embodiment in FIG. 11, the data of the flop-flop FF11 is supplied to the n-channel MOS transistor Qn43, and the data of the flip-flop FF12 is supplied to the n-channel MOS transistor Qn36.

However, as in the second embodiment shown in FIGS. 15A and 15B, when the two flip-flops are separately arranged at both the ends of the bit line, it is difficult to practically couple the flip-flops to each other. For this reason, in the embodiment shown in FIGS. 15A and 15B, the bit line is used as a wiring line for transmitting/receiving data in a write operation, thereby supplying the data of the flip-flop FF21 to the p-channel MOS transistor Qp57 and the n-channel MOS transistor Qn71 through the bit line BL. In a verify read operation, combinations of data corresponding to '0', '1', and '2' are designed so as to make it unnecessary to calculate data. For this reason, unnecessary wiring lines are not arranged between the two flip-flops, and a simple circuit arrangement can be obtained.

As described above, a data write operation, a data verify read operation, a data read operation, and a data erasing operation for the memory cell of a ternary storing EEPROM can be performed by the bit line control circuit 2 in FIGS. 15A and 15B. In the related art, a read operation requires two basic cycles, i.e., a first read cycle for determining "'0' or one of '1' and '2'" and a second read cycle for determining "'2' or one of '1' and '0'", and a verity read operation requires two basic cycles, i.e., a reverse cycle and a verify cycle. However, the second embodiment has a feature in which each of the read operation and the verify read operation can be performed by a single cycle operation, and data can be read and written for a short time. In addition, the bit line control circuit 2 is divided into two portions, and the portions are separately arranged at both the ends of the bit line, so that the bit line control circuit 2 can be efficiently arranged on an Si substrate.

Figure 19:
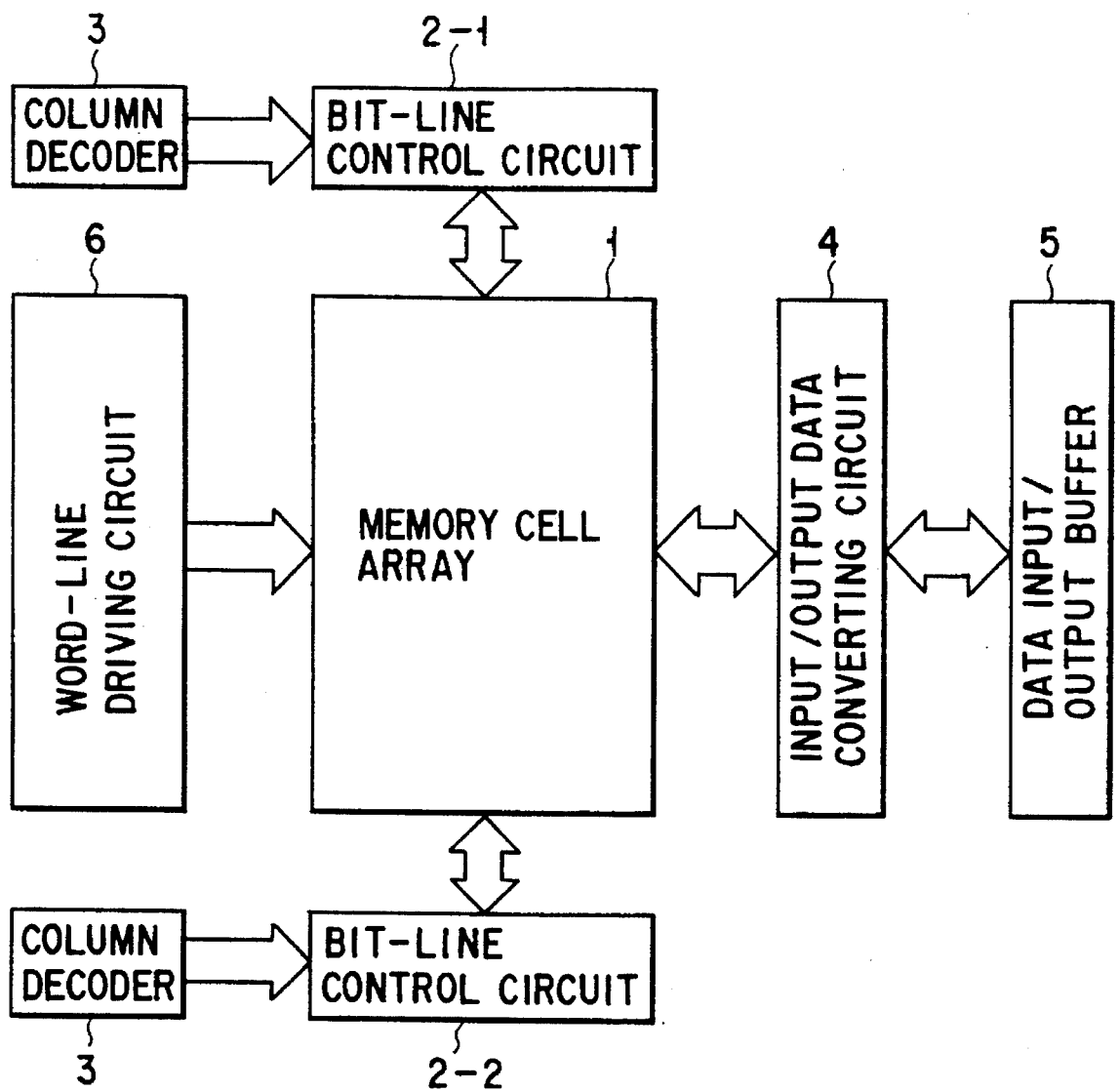
FIG. 19 is a block diagram showing an arrangement of an EEPROM using a bit line control circuit according to the second embodiment.

FIG. 19 is a block diagram showing the entire arrangement of a ternary storing EEPROM using a bit line control circuit 2 according to the second embodiment.

In this arrangement, the bit line control circuits 2-1 and 2-2, separately arranged on both the sides of the memory cell array, for controlling a bit line in a read/write operation, and a word line driving circuit 6 for controlling a word line potential. The bit line control circuits 2-1 and 2-2 are selected by a column decoder 3. The bit line control circuits 2-1 and 2-2 transmit and receive write/read data to/from an input/output data converting circuit 4 through a data input/output line (I/O line). The input/output data converting circuit 4 converts multi-value information read out from a memory cell into binary information which is to be externally output, and converts the binary information of write data which is externally input into multi-value information of the memory cell. The input/output data converting circuit 4 is coupled to a data input/output buffer 5 for controlling an input/output operation of external data.

Figure 20:
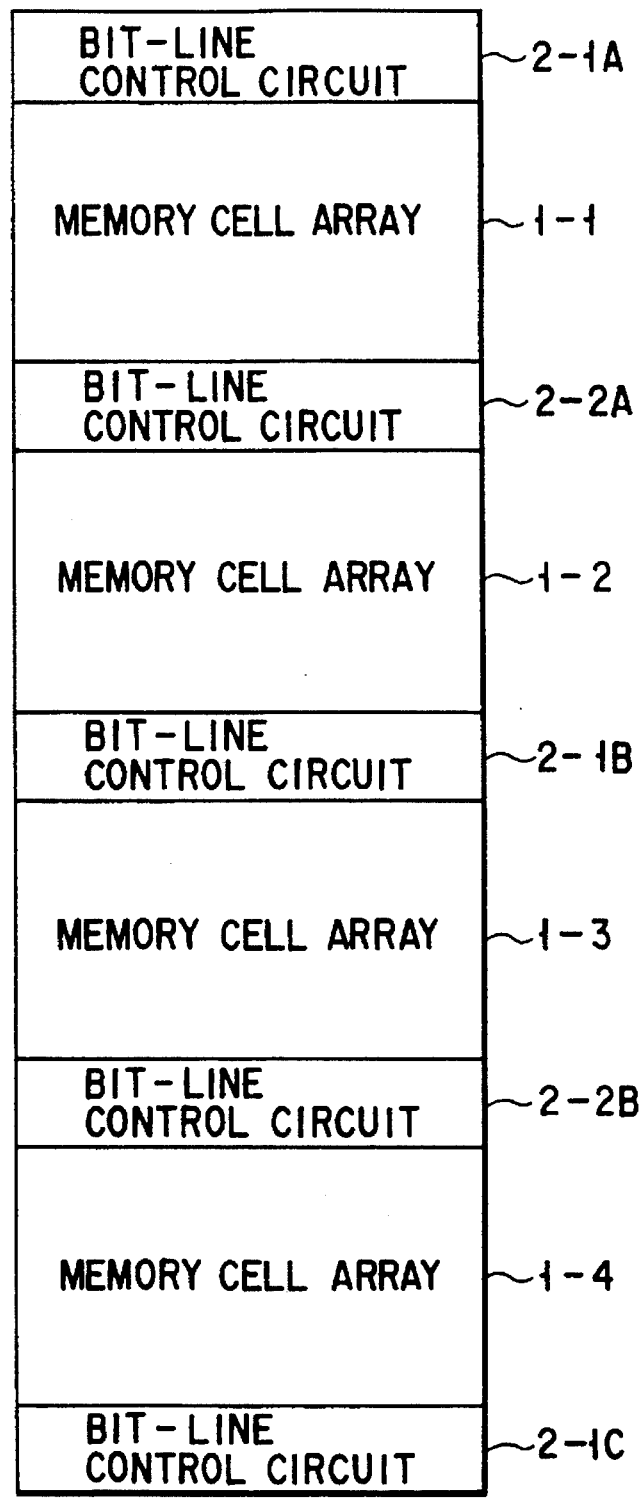
FIG. 20 is a block diagram showing another arrangement of the EEPROM using a bit line control circuit according to the second embodiment.

FIG. 20 shows memory cell arrays and bit line control circuit portions in another arrangement of the ternary storing EEPROM using the bit line control circuits 2-1 and 2-2 of the second embodiment.

When an EEPROM has a large capacity, the following array dividing operation is generally performed. That is, a memory cell array is divided into a plurality of blocks, and only some blocks of the plurality of blocks are simultaneously operated. At this time, if the bit line control circuit 2 described in the second embodiment is used, the bit line control circuits 2-1 and 2-2 can be alternately arranged between blocks as shown in FIG. 20.

With the above arrangement, when a cell array 1-2 operates, a bit line control circuit 2-1B is paired and operated together with a bit line control circuit 2-2A. When a cell array 1-3 operates, a bit line control circuit 2-1B is paired and operated together with a bit line control circuit 2-2B. The bit line control circuit 2-1B is shared by the cell arrays 1-2 and 1-3. In this manner, according to this embodiment, the bit line control circuits which are separately arranged can be shared by two cell arrays. When the bit line control circuits are integrally mounted on an Si substrate, a small chip size can be obtained.

In each of the first and second embodiments, the present invention is applied to a ternary storing NAND cell type EEPROM. The present invention can be applied to not only a ternary storing EEPROM but also a multi-value (three or more values) EEPROM. An embodiment in which the present invention is applied to a multi-value storing NAND cell type EEPROM will be described below.

Figure 21:
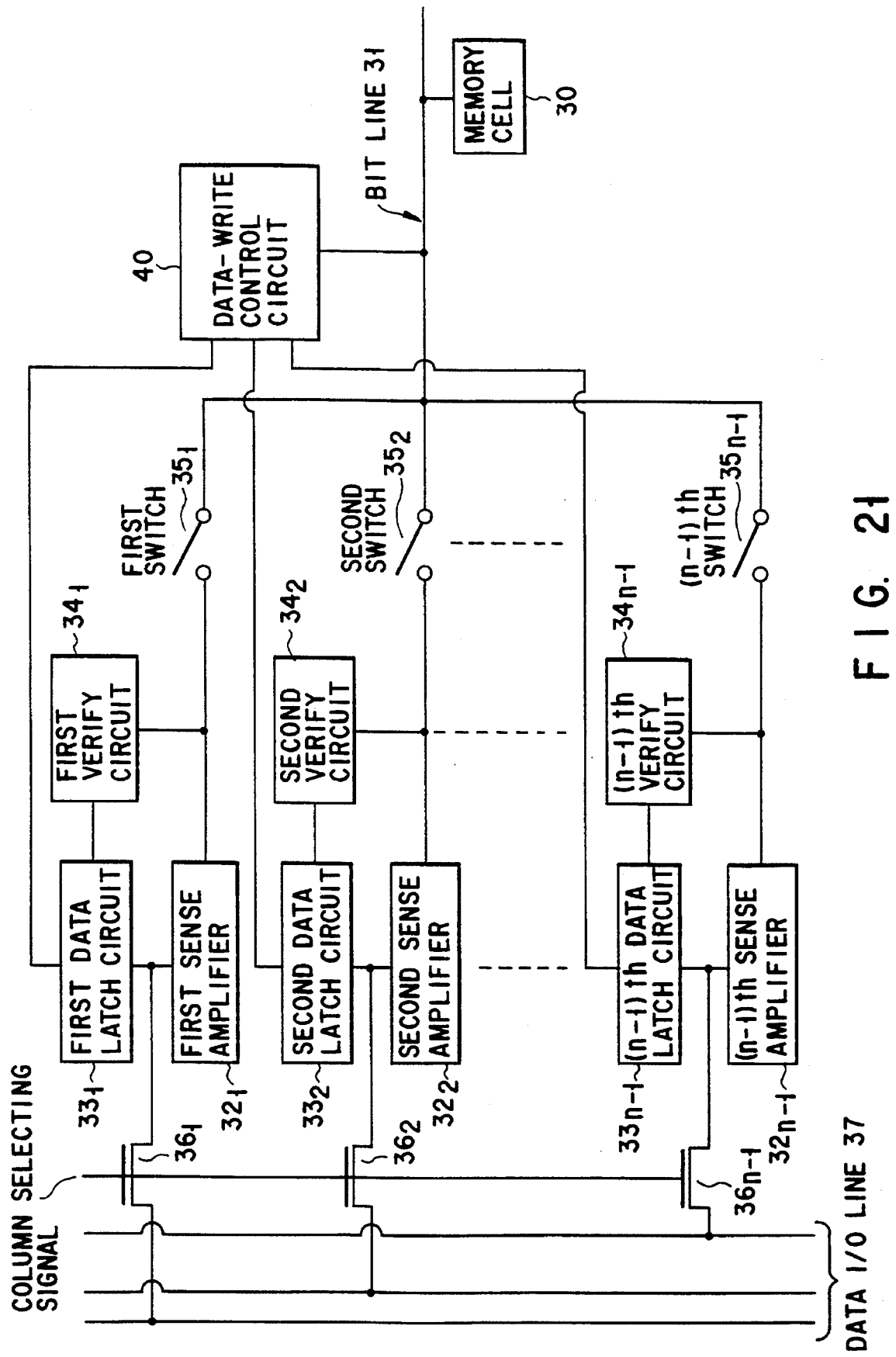
FIG. 21 is a block diagram showing the basic arrangement of a NAND cell type EEPROM according to the third embodiment.

FIG. 21 is a block diagram showing the basic arrangement of a multi-value storing NAND cell type EEPROM according to the present invention. FIG. 21 shows only an arrangement related to one bit line. However, as in the first embodiment, the same arrangement as described above is arranged for each bit line.

A plurality of n-value electrically rewritable memory cells 30 are coupled in series with each other to constitute NAND cells shown in FIGS. 6, 7A, and 7B.

A bit line 31 is coupled to a plurality of NAND cells, and transmits/receives data to/from the cells.

A first sense amplifier $32_1$, a second sense amplifier $32_2$, ..., and an (n–1)th sense amplifier $32_{n-1}$ sense/amplify the potential of the bit line 31.

A first data latch $33_1$, a second data latch $33_2$, ..., and an (n–1)th data latch $33_{n-1}$ hold data to be written in the memory cell 30.

A first verify circuit $34_1$, a second verify circuit $34_2$, ..., and an (n–1) verify circuit $34_{n-1}$ check whether data is correctly written in the memory cell 30.

A first switch $35_1$ controls to connect the first sense amplifier $32_1$, the first data latch $33_1$, and the first verify circuit $34_1$ to the bit line 31.

A second switch $35_2$ controls to connect the second sense amplifier $32_2$, the second data latch $33_2$, and the second verify circuit $34_2$ to the bit line 31.

An (n–1)th switch $35_{n-1}$ controls to connect the (n–1)th sense amplifier $32_{n-1}$, the (n–1)th data latch $33_{n-1}$, and (n–1)th verify circuit $34_{n-1}$ to the bit line 31.

The write control circuit 40 sets the potential of the bit line 31 on the basis of the contents of the first, second, ..., and (n–1)th data latches $33_1$, $33_2$, ..., and $33_{n-1}$.

In the above arrangement, the first, second, ..., (n–1)th switches $35_1$, $35_2$, ..., $35_{n-1}$ are set in an ON state to read data from the memory cell 30 to the bit line 31. Thereafter, the first, second, ..., (n–1)th switches $35_1$, $35_2$, ..., $35_{n-1}$ are set in an OFF state to almost simultaneously operate the first, second, ..., (n–1)th sense amplifiers $32_1$, $32_2$, ..., $32_{n-1}$, thereby sensing/amplifying data. The sensed and amplified data is sent to a data input/output line 37 such that first, second, ..., (n–1)th transistors $36_1$, $36_2$, ..., $36_{n-1}$ are turned on in response to a column selecting signal 115. Similarly, the first, second, . . . , (n−1)th verify circuits $34_1$, $34_2$, . . . , $34_{n-1}$ almost simultaneously operate to verify write data.

The arrangement of the third embodiment will be described in detail. In the following description, a quaternary storing NAND cell type EEPROM is exemplified as a multi-value (three values or more) NAND cell type EEPROM.

Figure 22:
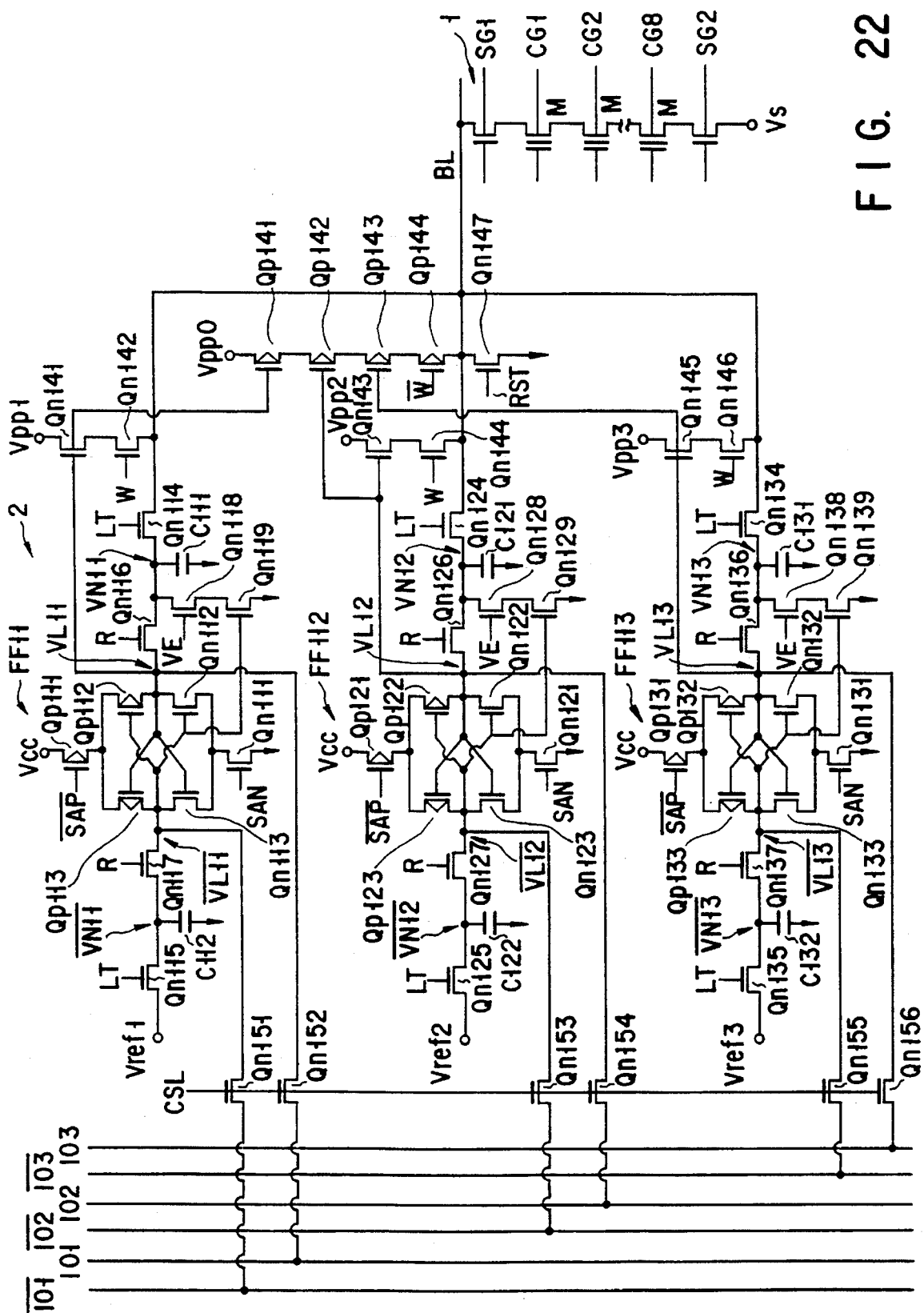
FIG. 22 is a detailed circuit diagram showing a memory cell array and a bit line control circuit in the third embodiment.

FIG. 22 shows a memory cell array 1 and a bit line control circuit 2 in a quaternary storing NAND cell type EEPROM according to the third embodiment. One terminal of each NAND cell is coupled to a bit line BL, and the other terminal is coupled to a common source line VS. Selective gates SG1 and SG2 and control gates CG1 to CG8 are shared by a plurality of NAND cells, and memory cells M which share one control gate constitute a page. Each memory cell stores data '0', '1', '2', and '3' on the basis of a threshold voltage Vt of the corresponding memory cell, as in the case shown in FIG. 9. The memory cell array 1 is formed on a p-type well (not shown).

A flip-flop FF111 constituted by n-channel MOS transistors Qn111 to Qn113 and p-channel MOS transistors Qp111 to Qp113, a flip-flop FF112 constituted by n-channel MOS transistors Qn121 to Qn123 and p-channel MOS transistors Qp121 to Qp123, and a flip-flop FF113 constituted by n-channel MOS transistors Qn131 to Qn133 and p-channel MOS transistors Qp131 to Qp133 latch write/read data. The flip-flops FF111, FF112, and FF113 also operate as sense amplifiers.

When a signal R goes 'H', n-channel MOS transistors Qn116 and Qn117, n-channel MOS transistors Qn126 and Qn127, and n-channel MOS transistors Qn136 and Qn137 couple the flip-flops FF111, FF112, and FF113 to nodes VN11 and /VN11, nodes VN12 and /VN12, and nodes VN13 and /VN13, respectively.

N-channel MOS transistors Qn115, Qn125, and Qn135 couple the nodes /VN11, /VN12 and /VN13 to reference potentials Vref1, Vref2, and Vref3, respectively, in response to a signal LT.

N-channel MOS transistors Qn114, Qn124, and Qn134 couple the nodes VN11, VN12, and VN13 to the bit line BL in response to the signal LT.

N-channel MOS transistors Qn118 and Qn119, n-channel MOS transistors Qn128 and Qn129, and n-channel MOS transistors Qn138 and Qn139 set the nodes VN11, VN12, and VN13 at a ground potential in accordance with data latched in the flip-flops FF111, FF112, and FF113, respectively.

In a write operation, n-channel MOS transistors Qn141 to Qn146 and p-channel MOS transistors Qp141 to Qp146 selectively transfer potentials Vpp0, Vpp1, Vpp2, and Vpp3 to the bit line BL in accordance with the data latched in the flip-flops FF111, FF112, and FF113. When a signal RST goes 'H', an n-channel MOS transistor Qn147 resets the bit line to 0 V. When a signal CSL goes 'H', n-channel MOS transistors Qn151 to Qn156 couple the flip-flops FF111, FF112, and FF113 to data input/output lines IO1 and /IO1, data input/output lines IO2 and /IO2, and data input/output lines IO3 and /IO3, respectively.

Figure 24:
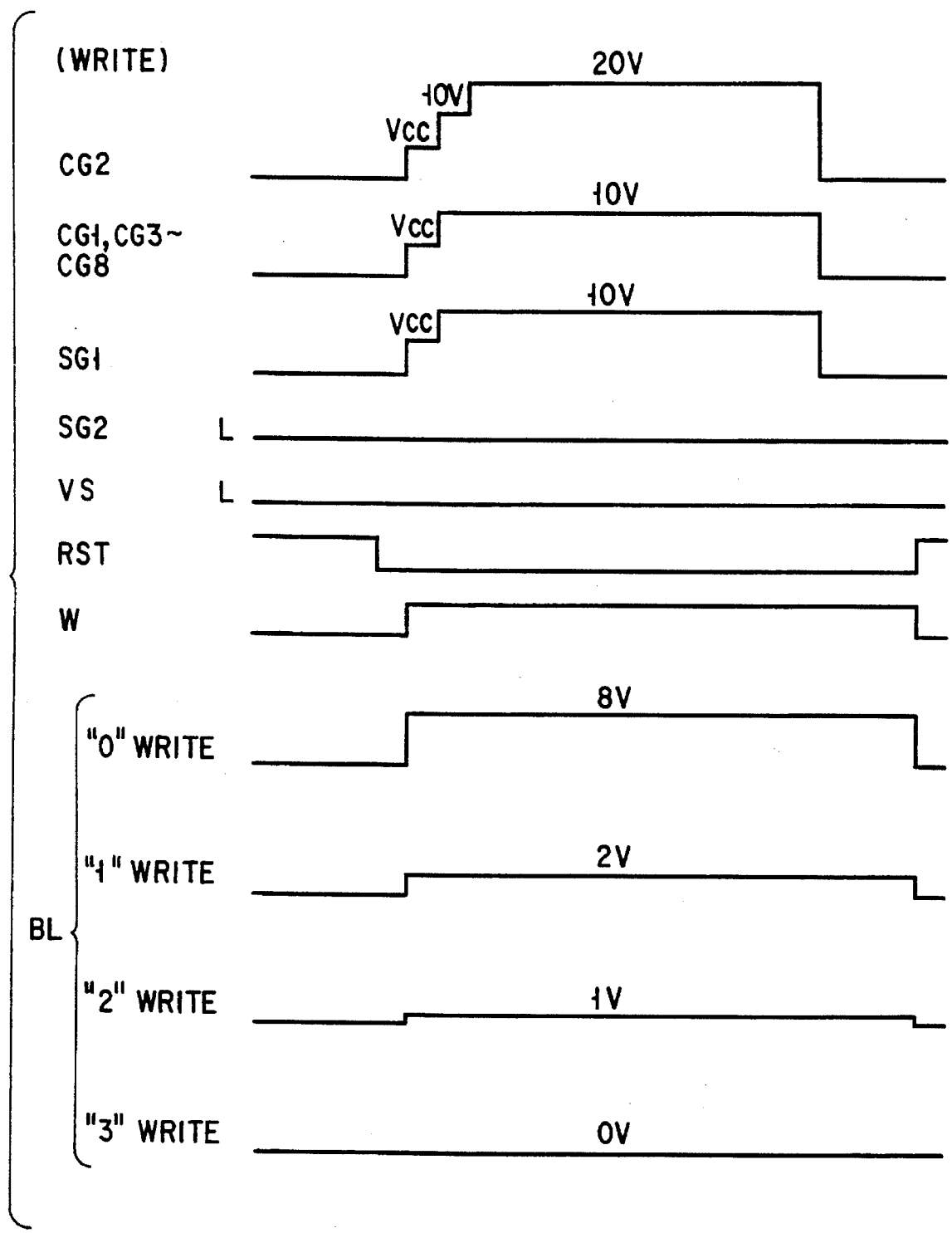
FIG. 24 is a timing chart showing a write operation in the third embodiment.
Figure 25:
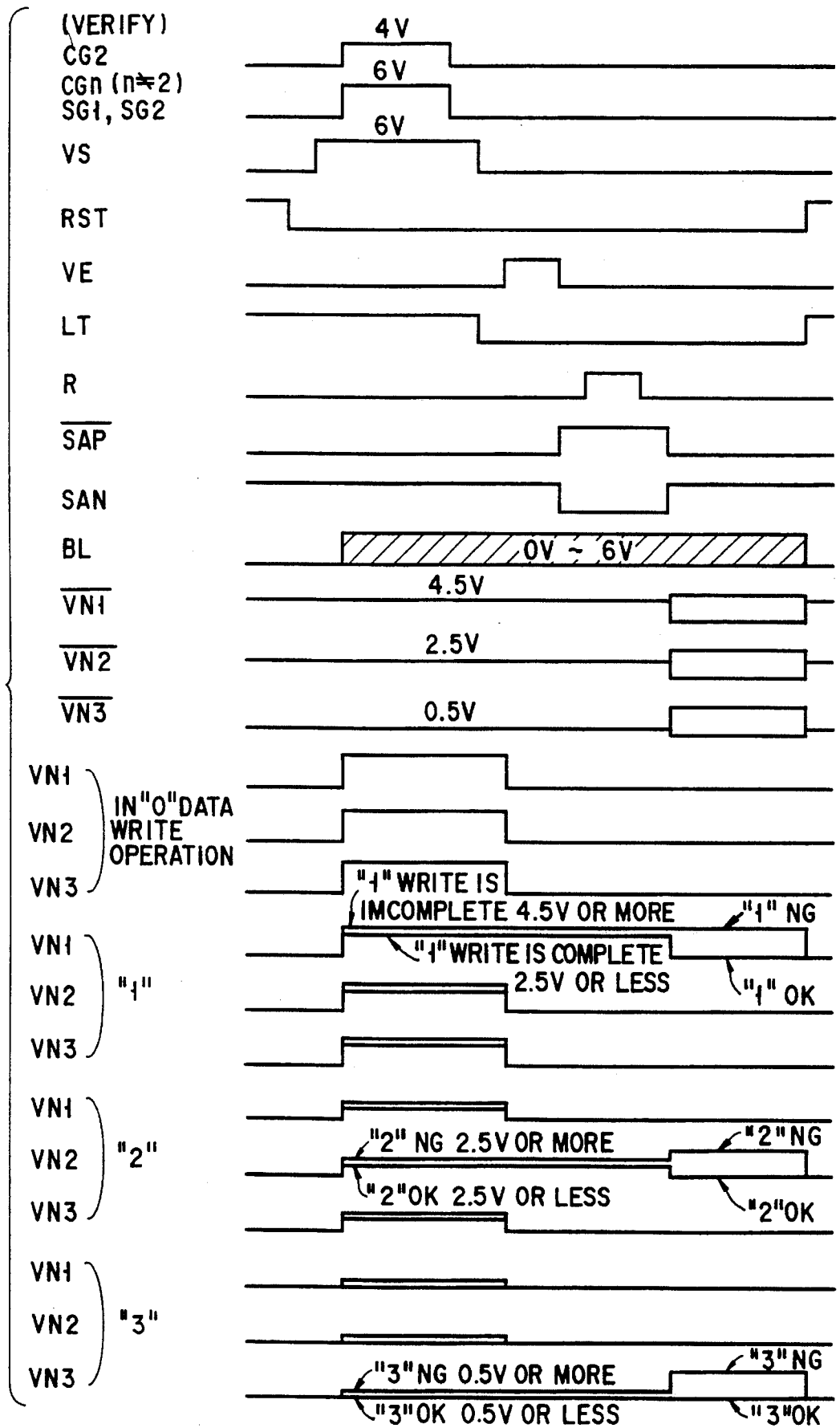
FIG. 25 is a timing chart showing a verify read operation in the third embodiment.

The operation of the EEPROM arranged as described above will be described below with reference to FIGS. 23 to 25. FIG. 23 shows read operation timings, FIG. 24 shows write operation timings, and FIG. 25 shows verify read operation timings. In the following description, a case wherein the control gate CG2 is selected is exemplified.

A read operation will be described below with reference to FIG. 23.

The entire bit line control circuit 2 is reset prior to a read operation. A signal /SAP goes 'H', and a signal SAN goes 'L', thereby inactivating the flip-flops FF111, FF112, and FF113. When the signal RST goes 'H', the bit line BL is reset to 0 V. At this time, the signals LT and R are at 'H', nodes VL11, VN11, VL12, VN12, VL13, and VN13 are coupled to the bit line. For this reason, these nodes are set at 0 V. On the other hand, the nodes /VL11 and /VN11 are coupled to the reference potential Vref1 (e.g., 5 V in a read operation) and charged to 5 V. Similarly, the nodes /VL12 and /VN12 are coupled to the reference potential Vref2 (e.g., 3 V in a read operation) and charged to 3 V, and the nodes /VL13 and /VN13 are coupled to the reference potential Vref3 (e.g., 1 V in a read operation) and charged to 1 V.

The common source line VS is set at 6 V. The selective gates SG1 and SG2 and the control gates CG1 and CG3 to CG8 are set at 6 V. At the same time, the selected control gate CG2 is set at 4 V. The bit line BL is charged in accordance with the data of a selected memory cell.

Upon completion of charging the bit line BL, the common source line VS, the selective gates SG1 and SG2, and the control gates CG1 to CG8 are set at 0 V. When the signal LT goes 'L', the potential of the bit line BL corresponding to the data of the cell is received by the nodes VN11, Vn12, and VN13.

Thereafter, when the flip-flop activating signals /SAP and SAN go 'L' and 'H' respectively, the flip-flops FF111, FF112, and FF113 are activated, and the potential of the bit line BL is sensed. When the data of the cell is '0', the potential of the bit line BL is 5.5 V to 6 V. For this reason, the flip-flops FF111, FF112, and FF113 sense and latch data which satisfy VL11='H', /VL11='L', VL12='H', /VL12= 'L', VL13='H', and /VL13='L'.

When the data is '1', the potential of the bit line BL is 3.5 V to 4.5 V, and data which satisfy VL11='L', /VL11='H', VL12='H', /VL12='L', VL13='H', and /VL13='L' are sensed and latched by the flip-flops FF111, FF112, and FF113. When the data is '2', the potential of the bit line BL is 1.5 V to 2.5 V, and data satisfy VL11='L', /VL11='H', VL12='L', /VL12='H', VL13='H', and /VL13='L' are sensed and latched by the flip-flops FF111, FF112, and FF113. When the data is '3', the potential of the bit line BL is 0 V to 0.5 V, and data satisfy VL11='L', /VL11='H', VL12='L', /VL12='H', VL13='L', and /VL13='H' are sensed and latched by the flip-flops FF111, FF112, and FF113.

In this manner, the data latched by the flip-flops FF111, FF112, and FF113 are transmitted to the data input/output lines IO1 and /IO1, the data input/output lines IO2 and /IO2, and the data input/output lines IO3 and /IO3, respectively, by setting the signal CSL at 'H', thereby performing a read operation.

As described above, quaternary data written in the memory cell can be read out by a single read cycle.

A write operation will be described below with reference to FIG. 24.

Data in a memory cell is erased prior to a data write operation, and a threshold voltage Vt of the memory cell is −1.5 V or less. An erasing operation is performed such that the p-type well, the common source line VS, the selective gates SG1 and SG2 are set at 20 V, and the control gates CG1 to CG8 are set at 0 V, thereby discharging electrons from the charge storage layer. Write data are input from the data input/output lines IO1, /IO1, IO2, /IO2, IO3 and /IO3 and are latched in the flip-flops FF111, FF112, and FF113.

In a '0' write operation, data indicating that the node VL11 is at 'L' and the node /VL11 is at 'H', data indicating that the node VL12 is at 'L' and the node /VL12 is at 'H', and data indicating that the node VL13 is at 'L' and the node /VL13 is at 'H' are latched in the flip-flops FF111, FF112 and FF113, respectively.

In a '1' write operation, data indicating that the node VL11 is at 'H' and the node /VL11 is at 'L', data indicating that the node VL12 is at 'L' and the node /VL12 is at 'H', and data indicating that the node VL13 is at 'L' and the node /VL13 is at 'H' are latched in the flip-flops FF111, FF112 and FF113, respectively. In a '2' write operation, data indicating that the node VL11 is at 'L' and the node /VL11 is at 'H', data indicating that the node VL12 is at 'H' and the node /VL12 is at 'L', and data indicating that the node VL13 is at 'L' and the node /VL13 is at 'H' are latched in the flip-flops FF111, FF112 and FF113, respectively. In a '3' write operation, data indicating that the node VL11 is at 'L' and the node /VL11 is at 'H', data indicating that the node VL12 is at 'L' and the node /VL12 is at 'H', and data indicating that the node VL13 is at 'H' and the node /VL13 is at 'L' are latched in the flip-flops FF111, FF112 and FF113, respectively.

In the write operation, the signal RST goes 'H', the n-channel MOS transistor Qn147 is turned on, thereby resetting the bit line BL to 0 V. At this time, the signals LT and R are at 'L', and the flip-flops FF111, FF112 and FF113 are separated from the bit line BL and the reference potentials Vrf1, Vrf2 and Vref3. A signal W goes 'H'.

In the '0' write operation, data at 'L' are latched in the nodes VL11, VL12, and VL13, and a signal /W is at 'L'. For this reason, the p-channel MOS transistors Qp141, Qp142, Qp143 and Qp144 are turned on, and the bit line BL is charged to a potential Vpp0H (8 V). In the '1' write operation, the node VL11 is at 'H', and the signal W is at 'H'. For this reason, the n-channel MOS transistors Qn141 and Qn142 are turned on, and a potential Vpp1 (2 V) is applied to the bit line BL. In the '2' write operation, the node VL12 is at 'H'. For this reason, the n-channel MOS transistors Qn143 and Qn144 are turned on, and a potential Vpp2 (1 V) is applied to the bit line BL. In the '3' write operation, the node VL13 is at 'H'. For this reason, the n-channel MOS transistors Qn145 and Qn146 are turned on, and a potential Vpp3 (0 V) is applied to the bit line BL. At this time, the selective gate SG1 is set at Vcc, and the control gates CG1 to CG8 are set at Vcc. The selective gate SG2 is at 0 V during the write operation.

The selective gate SG1 and the control gates CG1 to CG8 are set at 10 V, and the potential of the bit line is transferred to the drains of memory cells. Thereafter, the selected control gate CG2 is set at 20 V, and a write operation is performed for a selected memory cell.

In the '1', '2', or '3' write operation, electrons are injected into the charge storage layer of the memory cell due to the potential difference between the bit line BL and the control gate CG2, and the threshold voltage of the memory cell increases. The drain voltage of the memory cell is at 2 V, 1 V, and 0 V at the '1', '2', and '3' write operations, respectively. For this reason, the potential differences between the bit line BL and the control gate CG2 at the '1', '2', and '3' write operations increase in an order named ('1' write operation<'2' write operation<'3' write operation). Therefore, an amount of charge to be injected into the charge storage layer of the memory cell (in other words, an increase in threshold) increases in this order, and a write operation corresponding to the data is performed. In the '0' write operation, the drain voltage of the memory cell is 8 V, and the potential difference between the drain voltage and the potential of the control gate is small. For this reason, the threshold voltage of the memory cell in which electron injection is suppressed does not change.

A verify read operation is performed after the write operation. The verify read operation will be described below with reference to FIG. 25.

With the verify read operation, the write states of the memory cells are checked. If the write states of all the cells are sufficient, the write operation is ended. If a memory cell is set in an insufficient write state, data for performing an additional write operation for only the cell set in the insufficient write state is formed. While data are kept latched in the flip-flops FF111, FF112, and FF113, a read operation is performed for the memory cells. New data which are data to be written next are formed on the basis of the latched data and data read out on the bit line BL, and the new data are latched in the flip-flops FF111, FF112, and FF113.

When the signals RST and LT go 'H' prior to the verify read operation, the bit line BL and the nodes VN11, VN12 and VN13 are reset to 0 V. The nodes /VN11, /VN12 and /VN13 are coupled to the reference potentials Vref1, Vref2 and Vref3. The potentials of the reference potentials Vref1, Vref2, and Vref3 are set to be low, i.e., at 4.5 V, 2.5 V, and 0.5 V, respectively, corresponding to 5 V, 3 V, and 1 V in the read operation to assure a write threshold voltage margin of 0.5 V. At this time, the signal R is at 'L', and the bit line BL is disconnected from the nodes VL11, VL12, and VL13. Similarly, the nodes /VL11, /VL12 and /VL13 are disconnected from the reference potentials Vref1, Vref2 and Vref3, and the flip-flops FF111, FF112 and FF113 are kept active to latch the data.

The common source line VS is set at 6 V. The selective gates SG1 and SG2 and the control gates CG1 and CG3 to CG8 are set at 6 V. At the same time, the selected control gate CG2 is set at 4 V. In accordance with data in the selected memory cell, the bit line BL is charged to a predetermined potential.

The reference potentials Vref1, Vref2 and Vref3 are set to be lower than those in the read operation by 0.5 V to assure the write threshold voltage margin of 0.5 V. However, even when the reference potentials Vref1, Vref2 and Vref3 are respectively set at 5 V, 3 V, and 1 V as in the read operation, and the potential of the control gate CG2 is set to be high, i.e., 4.5 V, the same effect as described above can be obtained.

Upon completion of charging the bit line BL, the common source line VS, the selective gates SG1 and SG2, and the control gates CG1 to CG8 are set at 0 V, and then the signal LT goes 'L', thereby causing the nodes VN11, VN12 and VN13 to receive the potential of the bit line BL corresponding to data in the cell.

A signal VE goes 'H', and the potentials of the nodes VN11, VN12 and VN13 are modified by the data latched in the flip-flops FF111, FF112 and FF113. Thereafter, the flip-flops FF111, FF112 and FF113 are inactivated and then reset. The signal R goes 'H', and the potentials of the nodes VN11, /VN11, VN12, /VN12, VN13 and /VN13 are transferred to the nodes VL11, /VL11, VL12, /VL12, VL13 and /VN13, respectively. The flip-flops FF111, FF112 and FF113 are activated again, and new data are sensed and latched by the flip-flops FF111, FF112 and FF113.

In a verify read operation after '0' has been written, the nodes /VL11, /VL12 and /VL13 are at 'H', and the n-channel MOS transistors Qn119, Qn129, and Qn139 are in an ON state. For this reason, the signal VE goes 'H' independently of the state of the memory cell, (i.e., the potential of the bit line BL). When the n-channel MOS transistors Qn118, Qn128, and Qn138 are turned on, the node VN11, VN12 and VN13 are set at 0 V. Therefore, when the flip-flop FF111, FF112 and FF113 are reset and then activated, the bit line potential is sensed by the flip-flops FF111, FF112 and FF113 such that the nodes VL11, VL12 and VL13 are set at 'L', and rewrite data '0' is latched as new data in the flip-flops FF111, FF112 and FF113.

In a verify read operation after '1' has been written, the node /VL11 is at 'L'. For this reason, the n-channel MOS transistor Qn119 is in an OFF state, the signal VE goes 'H', and the n-channel transistor Qn118 is turned on. In this case, the potential of the node VN11 does not change. Therefore, when the memory cell does not reach the '1' write state, the node VN11 is at 4.5 V or more. When the flip-flop FF111 is reset and then activated, the flip-flop FF111 senses and latches data such that the node VL11 is set at 'H'. When the memory cell reaches the '1' write state, the node VN11 is at 4.5 V or less. The flip-flop FF111 senses and latches data such that the node VL11 is set at 'L'.

The nodes /VL12 and /VL13 are at 'H', and the n-channel MOS transistors Qn129 and Qn139 are in an ON state. For this reason, the signal VE goes 'H'. When the n-channel MOS transistors Qn128 and Qn138 are turned on, the nodes VN12 and VN13 are set at 0 V independently of the potential of the bit line BL. Therefore, when the flip-flops FF112 and FF113 are reset and then activated, the flip-flop FF112 and FF113 sense data such that the nodes VL12 and VL13 are set at 'L'.

As described above, when the memory cell reaches the '1' write state, rewrite data '1' is latched as data again. When the cell reaches the '1' write state, rewrite data '0' is latched as new data, and the threshold voltage does not change in the rewrite operation.

In a verify read operation after '2' has been written, the node /VL11 is at 'H', and the n-channel MOS transistor Qn119 is in an ON state. For this reason, the signal VE goes 'H' independently of the potential of the bit line BL. When the n-channel MOS transistor Qn118 is turned on, the node VN11 is set at 0 V. Therefore, when the flip-flop FF111 is reset and then activated, the flip-flop FF111 senses data such that the node VL11 is set at 'L'.

Since the node /VL12 is at 'L', the n-channel MOS transistor Qn129 is in an OFF state, and the signal VE goes 'H' to turn on the n-channel MOS transistor Qn128. In this case, the potential of the node VN12 does not change. Therefore, the memory cell does not reach the '2' write state, the node VN12 is at 2.5 V or more, and the flip-flop FF112 senses data such that the node VL12 is set at 'H'. When the memory cell reaches the '2' write state, the node VN12 is at 2.5 V or less, and the flip-flop FF112 senses data such that the node VL12 is set at 'L'.

The node /VL13 is at 'H', and the n-channel MOS transistor qn139 is in an ON state. For this reason, the signal VE goes 'H' independently of the state of the memory cell, i.e., the state of the bit line BL. When the n-channel MOS transistor Qn138 is turned on, the VN13 is set at 0 V. Therefore, when the flip-flop FF113 is reset and then activated, the flip-flop FF113 senses data such that node VL13 is set at 'L'.

As described above, when the memory cell does not reach the '2' write state, rewrite data '2' is latched as data again. When the memory cell reach the '2' write state, rewrite data '0' is latched as new data, and the threshold voltage does not change in the rewrite operation.

In a verify read operation after '3' has been written, the nodes /VL11 and /VL12 are at 'H', and the n-channel MOS transistors Qn119 and Qn129 are in an ON state. For this reason, the signal VE goes 'H' independently of the potential of the bit line BL. When the n-channel MOS transistors Qn118 and Qn128 are turned on, the nodes VN11 and VN12 are set at 0 V. Therefore, when the flip-flops FF111 and FF112 are reset and then activated, the flip-flops FF111 and FF112 sense data such that the nodes VL11 and VL12 are set at 'L'.

Since the node /VL13 is at 'L', the n-channel MOS transistor Qn139 is in an OFF state, and the signal VE goes 'H' to turn on the n-channel MOS transistor Qn138. In this case, the potential of the node VN13 does not change. Therefore, the memory cell does not reach the '3' write state, the node VN13 is at 0.5 V or more. When the flip-flop FF113 is reset and then activated, the flip-flop FF113 senses data such that the node VL13 is set at 'H'. When the memory cell reaches the '3' write state, the node VN13 is at 0.5 V or less, and the flip-flop FF113 senses data such that the node VL13 is set at 'L'.

As described above, when the memory cell does not reach the '3' write state, rewrite data '3' is latched as data again. When the memory cell reach the '3' write state, rewrite data '0' is latched as new data, and the threshold voltage does not change in the rewrite operation.

With the above verify read operation, rewrite data is set as shown in Table 3 on the basis of write data and the write state of the memory cell. As is apparent from Table 3, a '1' write operation is performed again for only a memory cell which is to be set in the '1' write state but is in an insufficient '1' write state, a '2' write operation is performed again for only a memory cell which is to be set in the '2' write state but is in an insufficient '2' write state, and a '3' write operation is performed again for only a memory cell which is to be set in the '3' write state but is in an insufficient '3' write state.

TABLE 3

| WRITE DATA | 0000112223333 |
|---|---|
| DATA OF MEMORY CELL | 0123010120123 |

When the write operation and the verify read operation are repeated as described above, a write time is optimized to perform a data write operation for each memory cell.

As described above, according to the third embodiment, a data write operation, a data verify read operation, a data read operation, and a data erasing operation for the memory cell of a quaternary storing EEPROM can be performed by the bit line control circuit 2 in FIG. 22. In the ternary storing EEPROM of the related art, a read operation requires two basic cycles, i.e., a first read cycle for determining "'0' or one of '1' and '2'" and a second read cycle for determining "'2' or one of '1' and '0'", and a verity read operation requires two basic cycles, i.e., a reverse cycle and a verify cycle. Although the third embodiment is related to a quaternary storing EEPROM in which data discrimination is complex, the third embodiment has a feature in which each of the read operation and the verify read operation can be performed by a single cycle operation, and data can be read and written for a short time.

Figure 26:
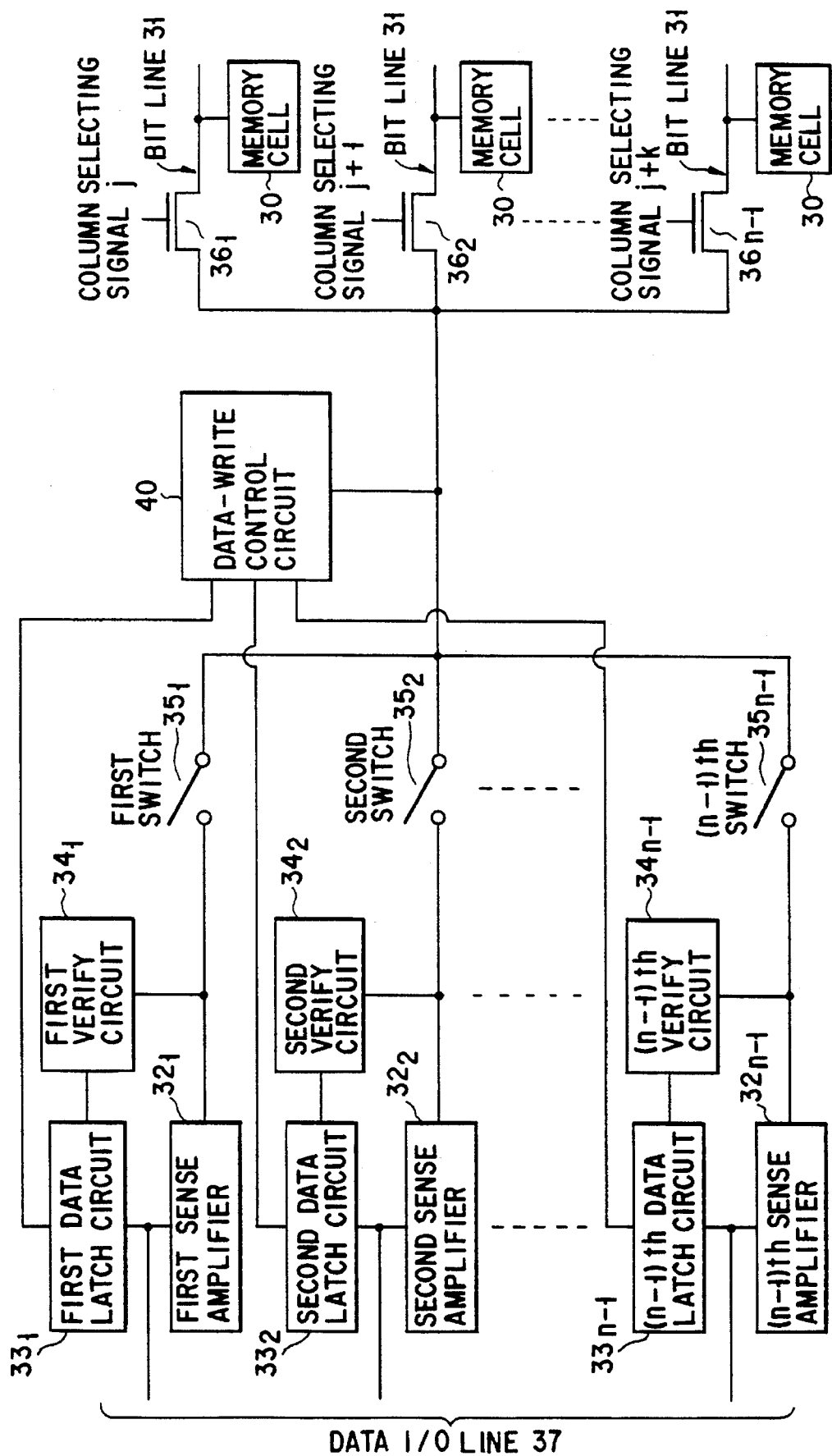
FIG. 26 is a detailed circuit diagram showing a memory cell array and a bit line control circuit in the fourth embodiment.

FIG. 26 is a block diagram showing the basic arrangement of an n-value NAND cell type EEPROM according to the fourth embodiment of the present invention.

In FIGS. 21 and 22, the bit line control circuit 2 constituted by sense amplifiers, data latches, verify circuits, switches, and write control circuits is arranged for each bit line. This makes it possible to simultaneously read/write data of a large number of cells. However, the bit line control circuit disadvantageously occupies a large area of a chip.

In FIG. 26, one bit line control circuit is arranged every K bit lines. One of the K bit lines is selectively coupled to a bit line control circuit 2 in accordance with a column selecting signal 115. In this manner, a multi-value storing EEPROM can be realized without increasing a chip area occupied by the bit line control circuit. When the same bit line control circuit as shown in FIG. 22 is used, each of a data write operation, a data verify operation, a data read operation, and a data erasing operation for a memory cell of the quaternary storing EEPROM can be performed by a single-cycle operation.

Figure 27A:
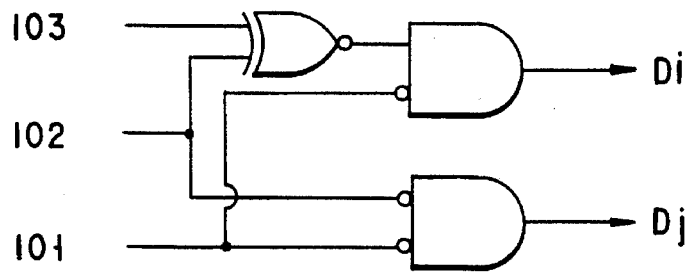
FIGS. 27A and 27B are detailed circuit diagrams showing the input/output data converting circuit of FIG. 1.
Figure 27B:
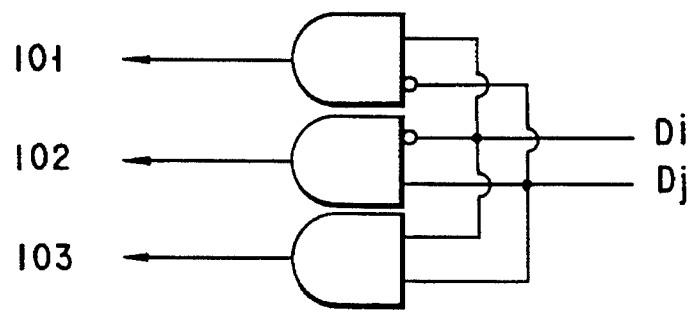

Expressions of quaternary data in the fourth embodiment are shown in Table 4.

circuit. FIG. 27A shows a circuit for converting the internal data IO1, IO2, and IO3 read out from the memory cell into the external data Di and Dj. FIG. 27B shows a circuit for converting the externally input data Di and DJ into the data IO1, IO2, and IO3 which are to be written in the memory cell.

In the above embodiment, the present invention has been described using a quaternary storing EEPROM as a multi-value storing EEPROM. However, even if the value n is increased, the present invention is still effective. Tables 5-1 and 5-2 show correspondences between cell data, external data, and internal data when n=8, i.e., when an octonary storing EEPROM is used. When the data correspond to each other in accordance with a rule in Tables 5-1 and 5-2, the present invention can be applied to an n-value storing EEPROM even if the value of n is any value.

TABLE 4

| QUATERNARY DATA | EXTERNAL DATA | | INTERNAL DATA IN READ OPERATION | | | INTERNAL DATA IN WRITE OPERATION | | |
|---|---|---|---|---|---|---|---|---|
| | Di | Dj | IO1 | IO2 | IO3 | IO1 | IO2 | IO3 |
| 0 | L | L | H | H | H | L | L | L |
| 1 | H | L | L | H | H | H | L | L |
| 2 | L | H | L | L | H | L | H | L |
| 3 | H | H | L | L | L | L | L | H |

Quaternary data '0', '1', '2', and '3' to be stored in a memory cell are expressed by binary signals Di and Dj in data transmission/reception between the chip and an external circuit, and are expressed by three binary signals IO1, IO2, and IO3. The values of the internal data IO1, IO2, and IO3 in a read operation are different from those in a write operation.

Figure 1:
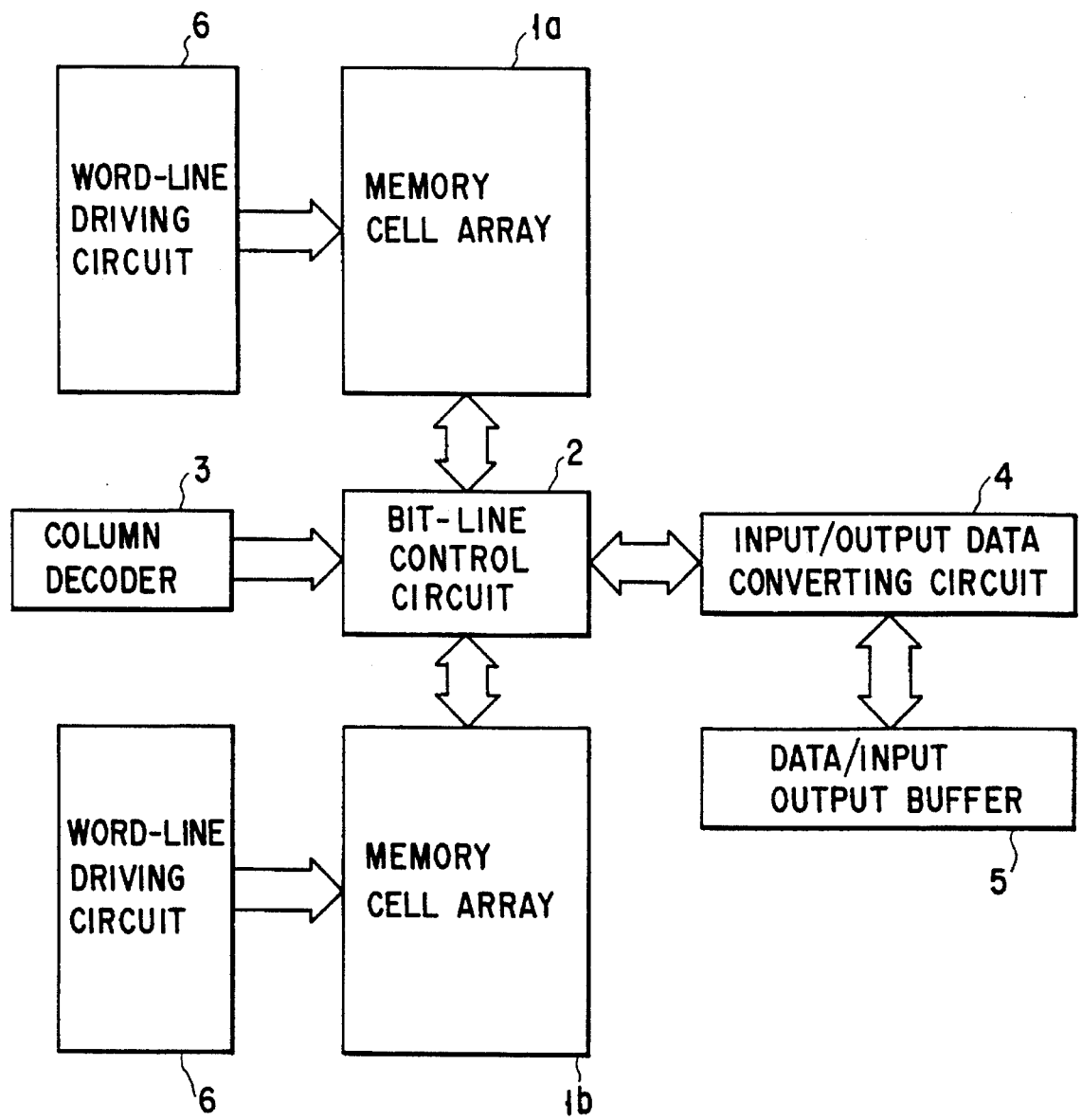
FIG. 1 is a block diagram showing an arrangement of an EEPROM.
Figure 2:
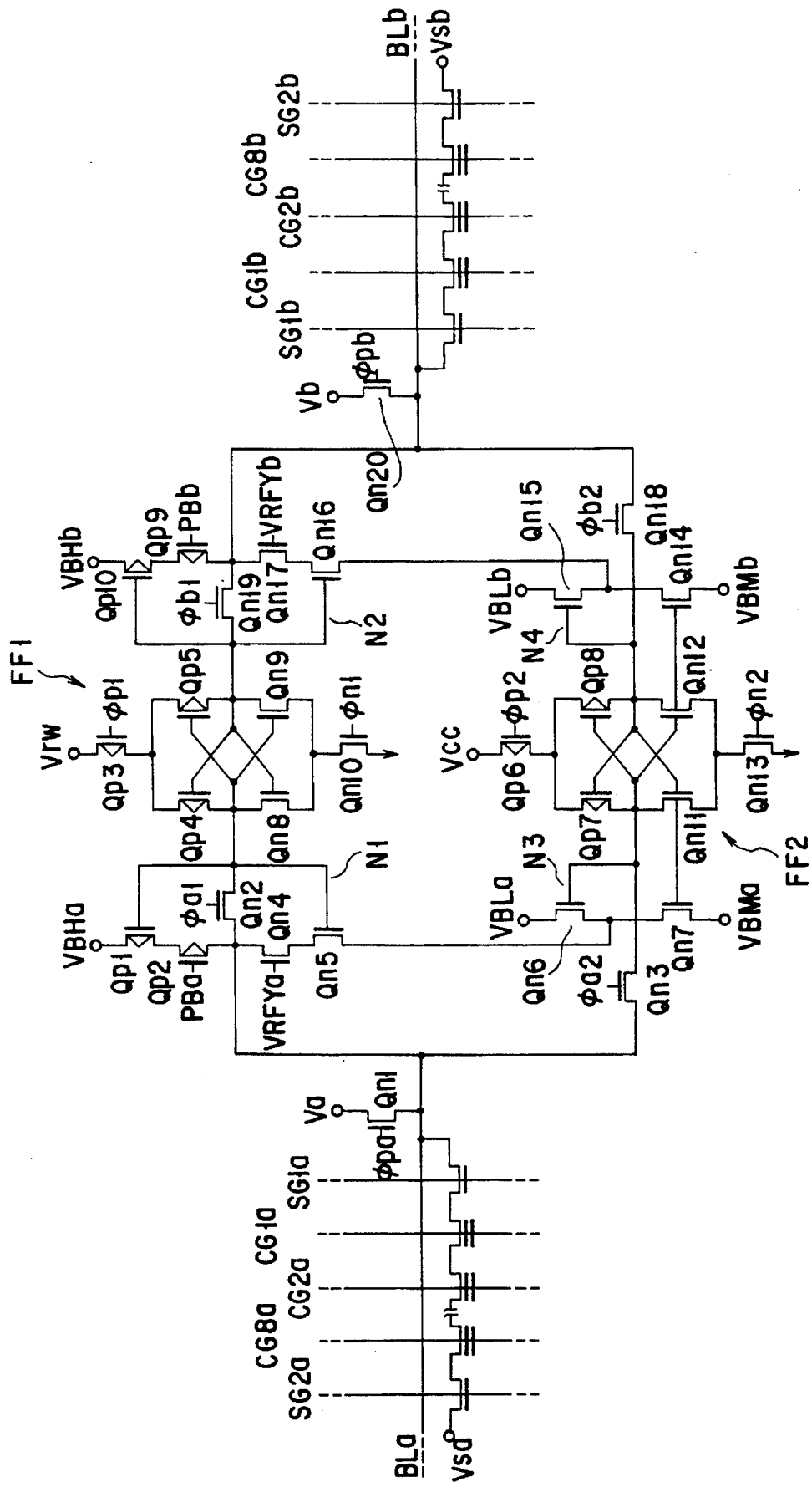
FIG. 2 is a detailed circuit diagram showing a memory cell array and a bit line control circuit in FIG. 1.
Figure 3:
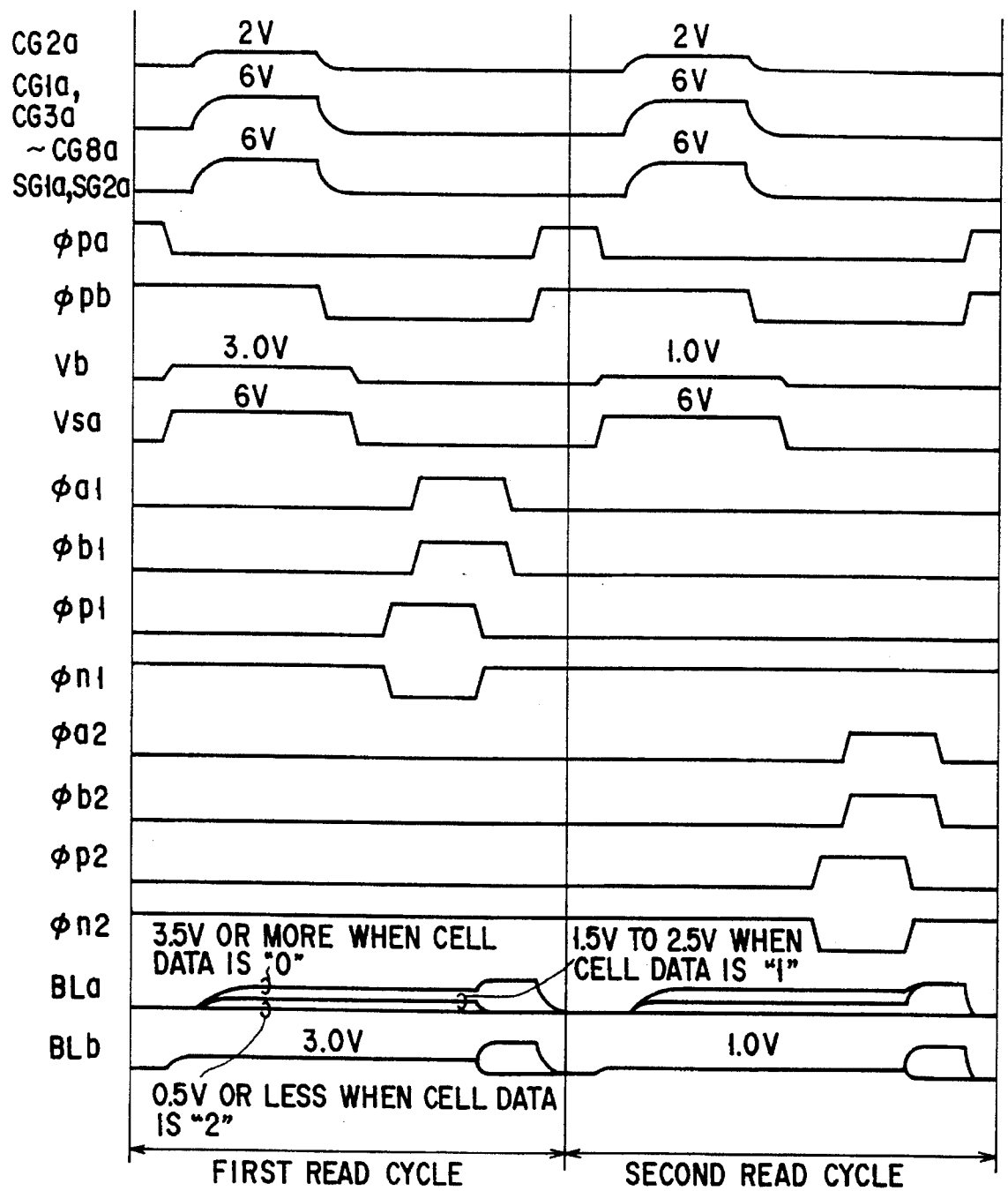
FIG. 3 is a timing chart showing a read operation in FIG. 2.

Interconversion between the external data Di and Dj and the internal data IO1, IO2, and IO3 is performed by an input/output data converting circuit 4 in FIG. 1. FIGS. 27A and 27B show examples of the input/output converting As internal data in the write operation, all signals IO1 to IO7 are 'L' when data is '0' which dose not change the threshold value in the write operation at the cell, and data 'H' is assigned to only one data which is different from each other among seven signals IO1 to IO7 when data is not '0'. That is, Hamming length of data '1' to '7' is 1 for data '0'. Therefore, if data is any one of '1' to '7' in write verify operation, it is easy to change to data '0' by changing 'H' signal to 'L' in case of reaching write state. For example, data '3' can be correctly changed to data '0' without passing data '2' or '1', thereby stable verify operation can be performed.

TABLE 5-1

| OCTONARY DATA | EXTERNAL DATA | | | INTERNAL DATA IN READ OPERATION | | | | | | |
|---|---|---|---|---|---|---|---|---|---|---|
| | Di | Dj | Dk | IO1 | IO2 | IO3 | IO4 | IO5 | IO6 | IO7 |
| 0 | L | L | L | H | H | H | H | H | H | H |
| 1 | H | L | L | L | H | H | H | H | H | H |
| 2 | L | H | L | L | L | H | H | H | H | H |
| 3 | H | H | L | L | L | L | H | H | H | H |
| 4 | L | L | H | L | L | L | L | H | H | H |
| 5 | H | L | H | L | L | L | L | L | H | H |
| 6 | L | H | H | L | L | L | L | L | L | H |
| 7 | H | H | H | L | L | L | L | L | L | H |

TABLE 5-2

| OCTONARY DATA | EXTERNAL DATA | | | INTERNAL DATA IN WRITE OPERATION | | | | | | |
|---|---|---|---|---|---|---|---|---|---|---|
| | Di | Dj | Dk | IO1 | IO2 | IO3 | IO4 | IO5 | IO6 | IO7 |
| 0 | L | L | L | L | L | L | L | L | L | L |
| 1 | H | L | L | H | L | L | L | L | L | L |
| 2 | L | H | L | L | H | L | L | L | L | L |
| 3 | H | H | L | L | L | H | L | L | L | L |
| 4 | L | L | H | L | L | L | H | L | L | L |

TABLE 5-2-continued

| OCTONARY DATA | EXTERNAL DATA | | | INTERNAL DATA IN WRITE OPERATION | | | | | | |
|---|---|---|---|---|---|---|---|---|---|---|
| | Di | Dj | Dk | IO1 | IO2 | IO3 | IO4 | IO5 | IO6 | IO7 |
| 5 | H | L | H | L | L | L | L | H | L | L |
| 6 | L | H | H | L | L | L | L | L | H | L |
| 7 | H | H | H | L | L | L | L | L | L | H |

Figure 28A:
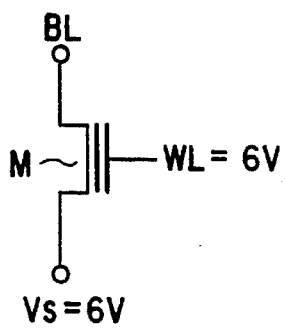
FIGS. 28A and 28B are views for explaining the basic arrangement of a NOR cell array and a read operation thereof.
Figure 28B:
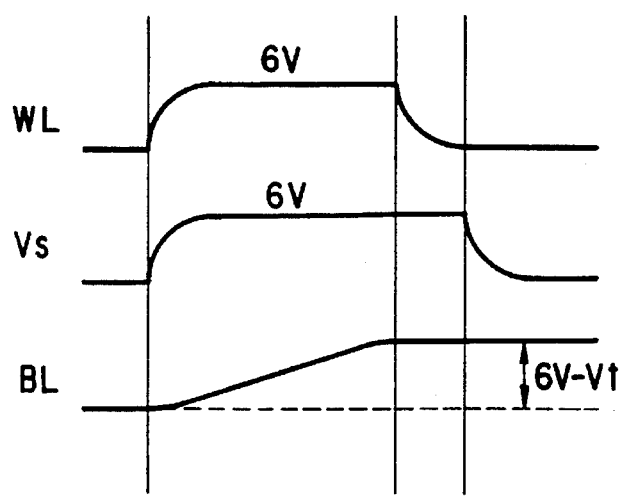

The present invention is not limited to the embodiments. Although the present invention has been described using a NAND cell type EEPROM as an example, the present invention can be effectively applied to a ternary storing NOR cell type EEPROM using a cell shown in FIGS. 28A and 28B. FIG. 28A shows the arrangement of a NOR cell, and FIG. 28B shows potential waveforms of portions of the NOR cell.

In the ternary storing NOR cell type EEPROM, as the threshold values of cells corresponding to ternary data, for example, a '0'-written cell preferably has a threshold voltage of 5.5 V to 6.5 V, a '1'-written cell preferably has a threshold voltage of 3.5 V to 4.5 V, and a '2'-written cell preferably has a threshold voltage of 1.5 V to 2.5 V. The potentials of the portions of a memory cell array in each operation are preferably set as shown in Table 6.

TABLE 6

| | ERASING OPERATION | WRITE OPERATION "0" "1" "2" | READ OPERATION | VERIFY READ OPERATION |
|---|---|---|---|---|
| BL | 0 V | 0 V  7 V  8 V | | |
| WL | 20 V | −12 V | 6 V | 6 V |
| VS | 0 V | 0 V | 6 V | 6 V |

When a read operation is performed under the above conditions, the potential of a word line is 6 V. For this reason, the '0'-written cell outputs a potential of 0 V to 0.5 V to a bit line, the '1'-written cell outputs a potential of 1.5 V to 2.5 V to the bit line, and the '2'-written cell outputs a potential of 3.5 V to 4.5 V to the bit line.

The magnitudes of the threshold values of the cells corresponding to ternary data in a NOR cell type EEPROM are reverse to those in a NAND cell type EEPROM. For this reason, reference potentials VRF1 and VRF2 in the verify read operation are preferably set to be higher than those in the read operation by 0.5 V to assure a write threshold voltage margin of 0.5 V. Even if the reference potentials VRF1 and VRF2 are set at 3 V and 1 V, respectively, as in the read operation, the potential of a selected word line WL is set to be low, i.e., 5.5 V to compensate for it. In this case, the same effect as described above can be obtained.

The present invention can also be applied to a multi-value (four or more values) storing NOR cell type EEPROM. The arrangement of a NOR cell and potential waveforms of the portions the NOR cell are almost the same as those of the ternary storing NOR cell type EEPROM shown in FIGS. 28A and 28B.

In the quaternary storing NOR cell type EEPROM, as the threshold values of cells corresponding to quaternary data, for example, a '0'-written cell preferably has a threshold voltage of 6.5 V to 7.5 V, a '1'-written cell preferably has a threshold voltage of 4.5 V to 5.5 V, a '2'-written cell preferably has a threshold voltage of 2.5 V to 3.5 V, and a '3'-written cell preferably has a threshold voltage of 0.5 V to 1.5 V. The potentials of the portions of a memory cell array in each operation are preferably set as shown in Table 7.

TABLE 7

| | ERASING OPERATION | WRITE OPERATION "0" "1" "2" "3" | READ OPERATION | VERIFY READ OPERATION |
|---|---|---|---|---|
| BL | 0 V | 0 V  6 V  7 V  8 V | | |
| WL | 20 V | −12 V | 7 V | 7 V |
| VS | 0 V | 0 V | 6 V | 6 V |

When a read operation is performed under the above conditions, the potential of a word line is 7 V. For this reason, the '0'-written cell outputs a potential of 0 V to 0.5 V to a bit line, the '1'-written cell outputs a potential of 1.5 V to 2.5 V to the bit line, the '2'-written cell outputs a potential of 3.5 V to 4.5 V to the bit line, and the '3'-written cell outputs a potential of 5.5 V to 6 V to the bit line.

As in the case wherein ternary data is used, the magnitudes of the threshold values of the cells corresponding to quaternary data in a NOR cell type EEPROM are reverse to those in a NAND cell type EEPROM. For this reason, reference potentials Vref1, Vref2, and Vref3 in the verify read operation are preferably set to be higher than those in the read operation by 0.5 V to assure a write threshold voltage margin of 0.5 V. Even if the reference potentials Vref1, Vref2, and Vref3 are set at 5 V, 3 V, and 1 V, respectively, as in the read operation, the potential of a selected word line WL is set to be low, i.e., 6.5 V to compensate for it. In this case, the same effect as described above can be obtained.

In order to increase the degree of integration, in recent years, cells obtained by improving NOR cells are developed. One of them is a DINOR cell, and another is an AND cell.

Figure 29A:
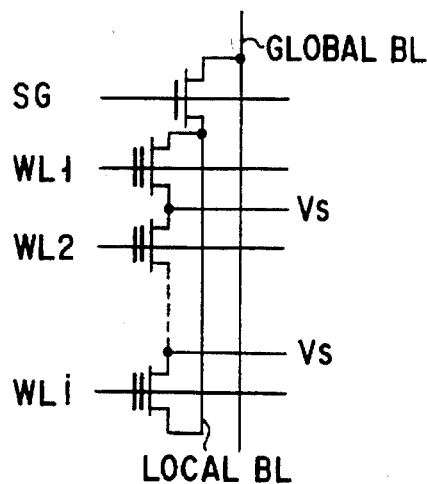
FIGS. 29A and 29B are views showing the arrangement of a DINOR cell and the potential waveforms of the portions of the DINOR cell.
Figure 29B:
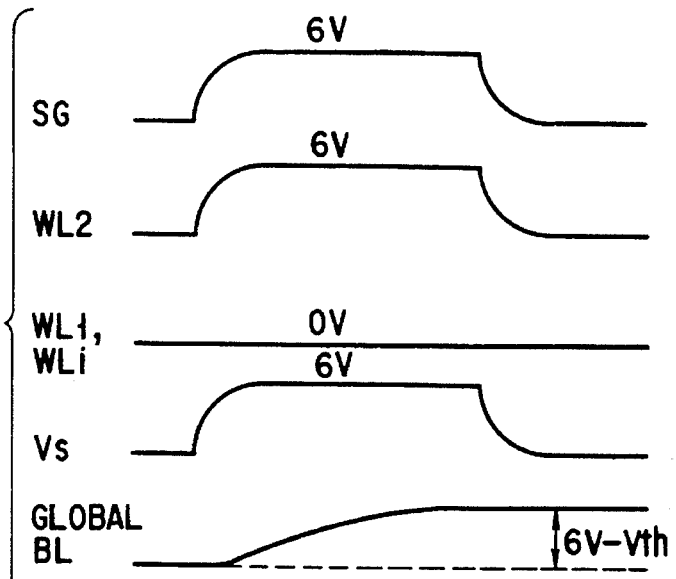
Figure 30A:
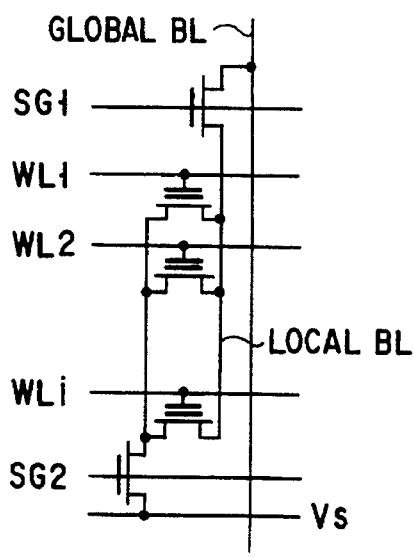
FIGS. 30A and 30B are views showing the arrangement of an AND cell and the potential waveforms of the portions of the AND cell.
Figure 30B:
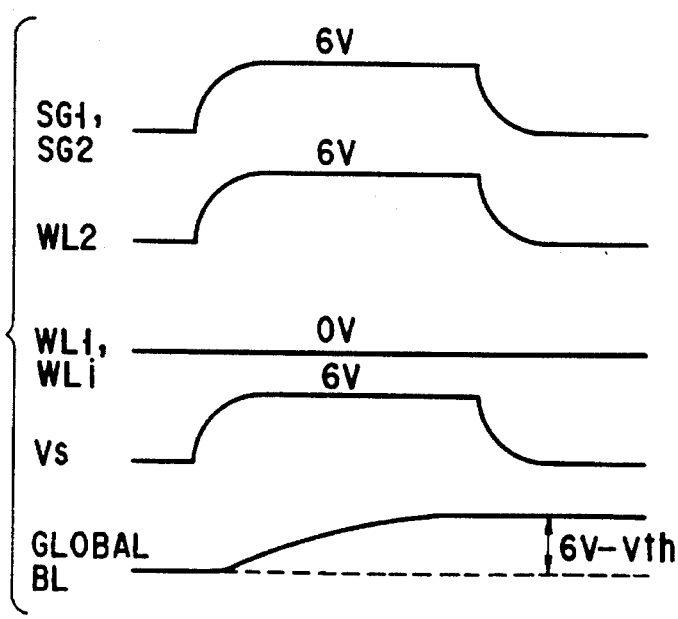

FIGS. 29A and 29B show the arrangement of a DINOR cell and the potential waveforms of the portions of the DINOR, respectively. FIGS. 30A and 30B show the arrangement of an AND cell and the potential waveforms of the portions of the AND, respectively.

In each of the DINOR cell and the AND cell, as in the NAND cell, a terminal portion of a memory cell unit in which a plurality of cells are coupled to each other is coupled to a global bit line to decrease the number of bit line contacts, thereby increasing the degree of integration. The DINOR cell and the AND cell are different from the NAND cell in the following point. That is, although the memory cells are coupled in series with the bit line in the NAND cell, the memory cells are coupled parallel to the bit line in each of the DINOR cell and the AND cell.

However, when the DINOR EEPROM or the AND EEPROM is applied to the present invention, the same effect as obtained by the NOR EEPROM can be obtained.

Various changes and modifications can be effected without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A non-volatile semiconductor memory device comprising:

a memory cell array in which a plurality of electrically rewritable memory cells for storing multi-value data representing not less than three data are arranged in a matrix;

a plurality of bit lines, respectively coupled to said plurality of memory cells, for transmitting/receiving data to/from said memory cells;

a plurality of sense amplifiers for sensing/amplifying potentials of said bit lines;

a plurality of data latches for holding data to be written in said memory cells;

a plurality of verify means for checking whether data are correctly written in said memory cells;

a plurality of switch means for controlling to connect said plurality of sense amplifiers, said plurality of data latches, and said plurality of verify means to said bit lines; and write control means for setting potentials of said bit lines in accordance with contents of said plurality of data latches, wherein said plurality of switch means are set in an open state after data are read from said memory cells onto said bit lines, and said plurality of sense amplifiers almost simultaneously operate after said plurality of switch means are set in an open state to sense/amplify the data read onto said bit lines.

2. A device according to claim 1, wherein said plurality of switch means are set in an open state after data are read from said memory cells onto said bit lines, and said plurality of verify means almost simultaneously operate to perform a verify operation for the data read onto said bit line.

3. A device according to claim 1, wherein said memory cell array includes a plurality of memory cells for storing ternary data, said sense amplifiers include first and second sense amplifiers, said plurality of data latches include first and second data latches, said plurality of verify means include first and second verify means, said plurality of switch means include first and second switch means, said first switch means controls to connect said first sense amplifier, said first data latch, and said first verify means to said bit lines, and said second switch means controls to connect said second sense amplifier, said second data latch, and said second verify means to said bit lines.

4. A device according to claim 3, wherein said bit lines are arranged in first and second directions using said memory cell array as a center, and said first switch means is coupled to said bit lines in the first direction, and said second switch means is coupled to said bit lines in the second direction.

5. A device according to claim 4, wherein said write control means includes means for inputting data of said first data latch to said second data latch through said bit lines in a data write operation, checking, on the basis of the data of said first latch and the data of said second latch, whether data to be written is specific data of the ternary data, and supplying a potential based on a determination result to said bit lines.

6. A device according to claim 3, wherein said memory cell array includes at least a plurality of memory cell arrays which are first, second, and third memory cell arrays, said first sense amplifier, said first data latch, and said first verify means constitute a plurality of first bit line control circuits, said second sense amplifier, said second data latch, and said second verify means constitute a plurality of second bit line control circuits, and said first bit line control circuits and said second bit line control circuits are alternately arranged between said plurality of memory cell arrays such that said first bit line control circuit is arranged on one side of said first memory cell array, said second bit line control circuit is arranged between the other side of said first memory cell array and one side of said second memory cell array, and said first bit line control circuit is arranged between the other side of said second memory cell array and one side of said third memory cell array.

7. A device according to claim 3, wherein said first sense amplifier includes means for sensing whether data read out from said memory cell onto said bit line is first-value data of the ternary data or one of second- and third-value data of the ternary data, and amplifying the data, said second sense amplifier includes means for sensing whether data read out from said memory cell onto said bit line is the second- or third-value data of the ternary data, and amplifying the data, said first data latch includes means for holding data indicating whether data to be written in said memory cells is the first-value data of the ternary data or one of the second- and third-value data of the ternary data, said second data latch includes means for holding data indicating whether the data to be written in said memory cells is the second- or third value data of the ternary data, and said first and second verify means includes checking means for checking whether states of said memory cells after a write operation become predetermined storage states, and data latch content updating means for updating contents of said first and second data latches such that a rewrite operation is performed for a memory cell set in an insufficient write state on the basis of the states of the memory cells after the write operation.

8. A device according to claim 7, wherein said write control means includes a write prevention bit line potential output circuit for outputting a write prevention bit line potential to said bit lines in a write operation when information of said first and second data latches is information for controlling to keep the states of said memory cells to states set before the write operation, and first and second write bit line potential output circuits for outputting the bit line potential in the write operation in accordance with information indicated by said first and second data latches when information of said first and second data latches is not information for controlling to keep the states of said memory cells to states set before the write operation.

9. A device according to claim 1, wherein said memory cell array includes a plurality of memory cells for n-value (n: integer r>=3) data;

said sense amplifiers include first to (n−1)th sense amplifiers, said plurality of data latches include first to (n−1)th data latches, said plurality of verify means include first to (n−1)th verify means, said plurality of switch means include first to (n−1)th data switch means, and said ith switch means (i=1 to n−1) controls to connect said ith sense amplifier (i=1 to n−1), said ith data latch (i=1 to n−1), and said ith verify means (i=1 to n−1) to said bit lines.

10. A device according to claim 9, wherein said ith sense amplifier (i=1 to n−1) includes means for sensing and amplifying that data read out from said memory cells onto said bit lines are first- to ith-value data of the n-value data or (i−1)th- to nth-value data, said ith data latch (i=1 to n−1) includes means for holding data indicating that the data to be written in said memory cells are the ith-value data of the n-value data or other data, and said first to (n−1)th verify means includes checking means for checking whether states of said memory cells which are set after a write operation are predetermined storing states, and data latch content updating means for updating contents of said first to (n−1)th data latches such that a rewrite operation is performed for only a memory cell set in an insufficient write state on the basis of the states of said memory cells which are set after the write operation.

11. A device according to claim 10, wherein said write control means, a write prevention bit line potential output circuit for outputting a write prevention bit line potential to said bit lines in a write operation when information of said first to (n−1)th data latches is information for controlling to keep the states of said memory cells to states set before the write operation, and first to (n−1)th write bit line potential output circuits for outputting a bit line potential of the write operation in accordance with information indicated by said first to (n−1)th data latches when the information of said first to (n−1)th data latches is not information for controlling to keep the states of said memory cells to states set before the write operation.

12. A device according to claim 1, wherein said memory cells are formed by stacking a charge storage layer and a control gate on a semiconductor layer, and said plurality of memory cells are coupled in series with each other to constitute a NAND cell.

13. A device according to claim 12, wherein said write control means includes means for setting reference input potentials of said plurality of data latches which are set in a read operation of a write verify operation to be lower than reference input potentials of a general read operation by a predetermined value.

14. A device according to claim 12, wherein said write control means includes means for setting a control gate potential of a selected memory cell of said memory cells which is set in a read operation of a write verify operation to be higher than a potential of a general read operation by a predetermined value.

15. A device according to claim 1, wherein said memory cells are formed by stacking a charge storage layer and a control gate on a semiconductor layer and constitute a NOR cell.

16. A device according to claim 1, wherein said write control means includes means for setting reference input potentials of said plurality of data latches which are set in a write/verify read operation to be higher than reference input potentials of a general read operation by a predetermined value.

17. A device according to claim 15, wherein said write control means includes means for setting a control gate potential of a selected memory cell which is set in a write/verify read operation to be lower than a potential of a general read operation by a predetermined value.

18. A device according to claim 1, wherein said memory cells are formed by stacking a charge storage layer and a control gate on a semiconductor layer, and said plurality of memory cells are coupled parallel to each other to constitute a DINOR cell.

19. A device according to claim 1, wherein said memory cells are formed by stacking a charge storage layer and a control gate on a semiconductor layer, and said plurality of memory cells are coupled parallel to each other to constitute an AND cell.

20. A non-volatile semiconductor memory device comprising:

a memory cell array in which a plurality of electrically rewritable memory cells for storing multi-value data representing not less than three data are arranged in a matrix;

a plurality of bit lines, respectively coupled to said plurality of memory cells, for transmitting/receiving data to/from said memory cells;

a plurality of sense amplifiers for sensing/amplifying potentials of said bit lines;

a plurality of data latches for holding data to be written in said memory cells; and a plurality of verify means for checking whether data are correctly written in said memory cells;

wherein said plurality of data latches latch one of a plurality of data which controls to hold a state of said memory in a state before write operation and a plurality of data which controls to not hold a state of said memory in a state before write operation, and Hamming length of each of said plurality of data which controls to not hold a state of said memory in a state before write operation is 1 for said plurality of data which controls to hold a state of said memory in a state before write operation.

* * * * *